(12) United States Patent
Muto et al.

(10) Patent No.: US 8,114,710 B2
(45) Date of Patent: Feb. 14, 2012

(54) MANUFACTURING METHOD OF RESIN-SEALED SEMICONDUCTOR DEVICE

(75) Inventors: Akira Muto, Tokyo (JP); Nobuya Koike, Tokyo (JP); Katsuo Arai, Tokyo (JP); Atsushi Fujiki, Tokyo (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 340 days.

(21) Appl. No.: 12/358,387

(22) Filed: Jan. 23, 2009

(65) Prior Publication Data

US 2009/0215230 A1    Aug. 27, 2009

(30) Foreign Application Priority Data

Feb. 22, 2008   (JP) .................................. 2008-041765

(51) Int. Cl.
*H01L 21/00* (2006.01)
(52) U.S. Cl. .......................... 438/118; 438/119; 438/127
(58) Field of Classification Search .......... 438/118–119, 438/127
See application file for complete search history.

(56) References Cited

U.S. PATENT DOCUMENTS

| | | | |
|---|---|---|---|
| 6,114,019 A * | 9/2000 | Bhatt et al. | 428/209 |
| 6,208,018 B1 * | 3/2001 | Ma et al. | 257/669 |
| 6,774,497 B1 * | 8/2004 | Qi et al. | 257/783 |
| 6,992,385 B2 | 1/2006 | Satou et al. | |
| 7,374,965 B2 | 5/2008 | Muto et al. | |
| 2003/0184987 A1 * | 10/2003 | Coomer et al. | 361/795 |
| 2006/0043618 A1 * | 3/2006 | Ashida et al. | 257/E23.127 |
| 2006/0138532 A1 * | 6/2006 | Okamoto et al. | 257/328 |

FOREIGN PATENT DOCUMENTS

| JP | 2004-266096 A | 9/2004 |
|---|---|---|
| JP | 2006-222121 A | 8/2006 |

OTHER PUBLICATIONS

"Database for Solder Properties with Emphasis on New Lead-free Solders". National Institute of Standards and Technology & Colorado School of Mines. 2002. Excerpt includes Tables 1.2 and 2.2.7.*

* cited by examiner

*Primary Examiner* — Thao Le
*Assistant Examiner* — Allen Parker
(74) *Attorney, Agent, or Firm* — Miles & Stockbridge P.C.

(57) ABSTRACT

The radiation performance of a resin sealed semiconductor package is enhanced and further the fabrication yield thereof is enhanced. A drain terminal coupled to the back surface drain electrode of a semiconductor chip is exposed at the back surface of an encapsulation resin section. Part of the following portion and terminal is exposed at the top surface of the encapsulation resin section: the first portion of a source terminal coupled to the source pad electrode of the semiconductor chip and a gate terminal coupled to the gate pad electrode of the semiconductor chip. The remaining part of the second portion of the source terminal and the gate terminal is exposed at the back surface of the encapsulation resin section. When this semiconductor device is manufactured, bonding material and a film member are placed between the drain terminal and the semiconductor chip. At the same time, paste-like bonding material and a film member are placed between the source terminal 3 and gate terminal and the semiconductor chip. The paste-like bonding material is cured and turned into bonding material. As the result of use of the film members, variation in the thickness of the bonding material is suppressed.

3 Claims, 58 Drawing Sheets

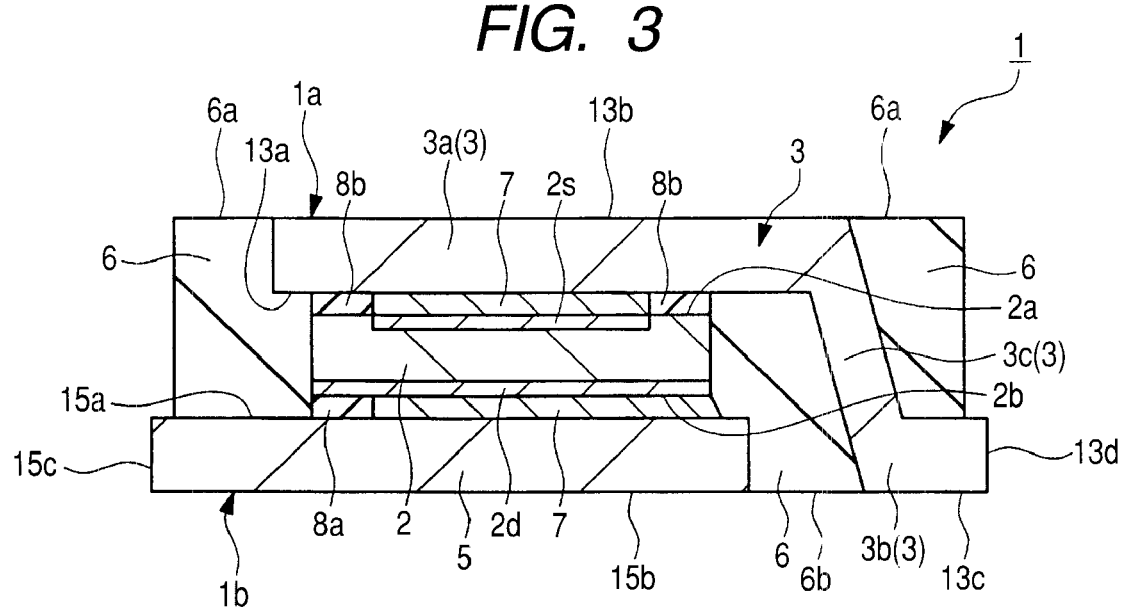
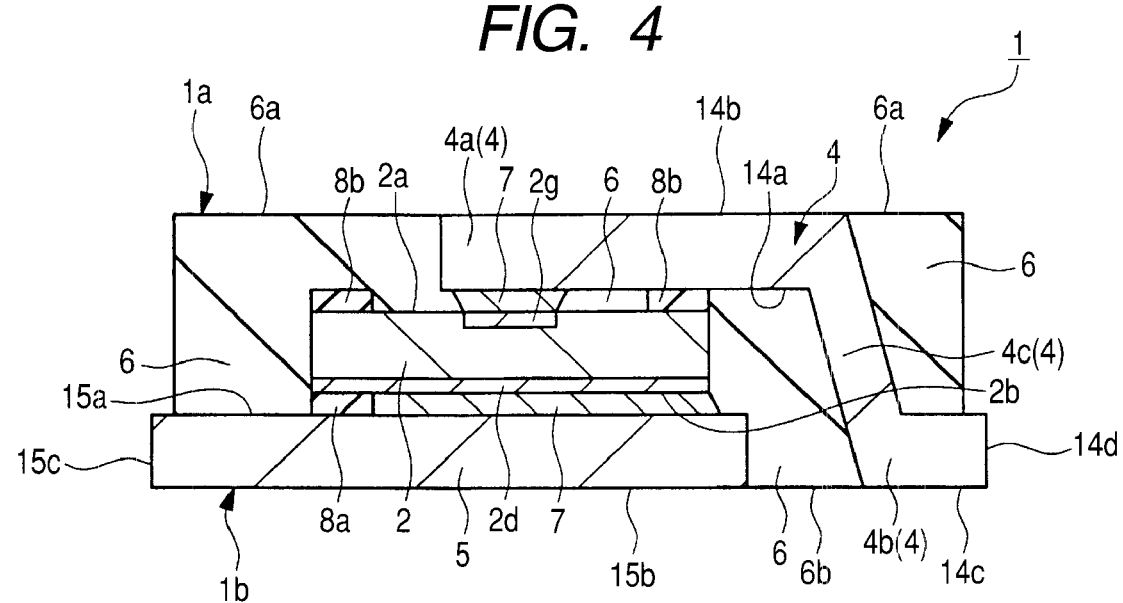

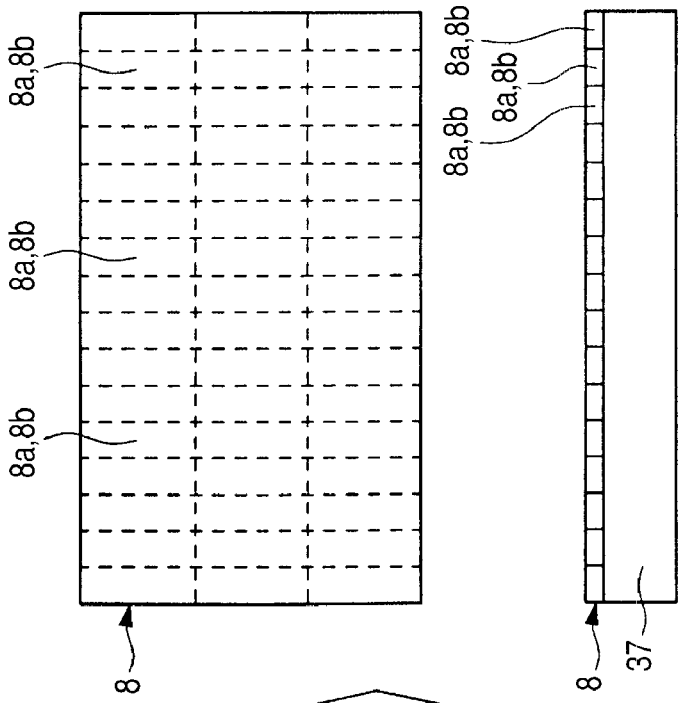
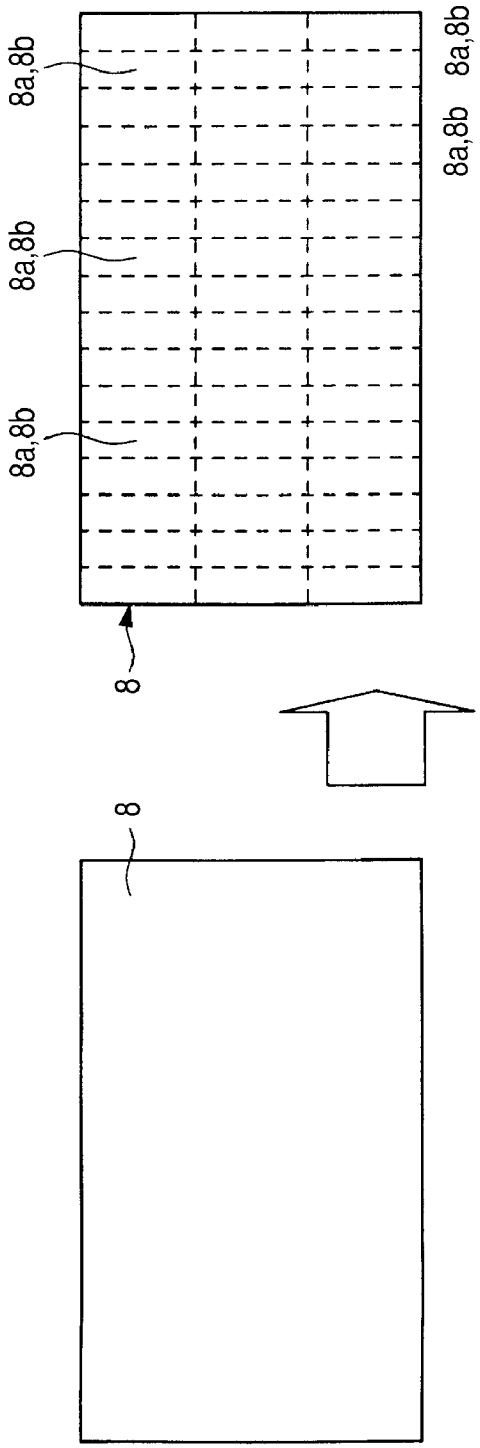
FIG. 14(a) BEFORE CUTTING
FIG. 14(b) AFTER CUTTING

US 8,114,710 B2

MANUFACTURING METHOD OF RESIN-SEALED SEMICONDUCTOR DEVICE

CROSS-REFERENCE TO RELATED APPLICATIONS

The disclosure of Japanese Patent Application No. 2008-41765 filed on Feb. 22, 2008 including the specification, drawings and abstract is incorporated herein by reference in its entirety.

BACKGROUND OF THE INVENTION

The present invention relates to manufacturing methods of semiconductor devices and in particular to a technique effectively applicable to manufacturing techniques for semiconductor devices of a resin sealed semiconductor package type.

Among various semiconductor packages in use, there are resin sealed semiconductor packages obtained by sealing a semiconductor chip with an encapsulation resin section. In the resin sealed semiconductor package, a semiconductor chip is sealed in an encapsulation resin section; therefore, the reliability of the semiconductor chip can be enhanced. When terminals are exposed at the back surface of the encapsulation resin section, the resin sealed semiconductor package can be surface mounted.

Japanese Unexamined Patent Publication No. 2004-266096 (Patent Document 1) discloses a technique related to a semiconductor device. This semiconductor device includes: a resin sealing body that seals a semiconductor chip; a first conductive member coupled with a first electrode over a first principal surface of the semiconductor chip; and a second conductive member coupled with a second electrode over a second principal surface of the semiconductor chip on the opposite side to the first principal surface. The first conductive member is exposed from the first principal surface of the resin sealing body. The second conductive member is exposed from the second principal surface of the resin sealing body on the opposite side to the first principal surface and a side surface.

Japanese Unexamined Patent Publication No. 2006-222121 (Patent Document 2) discloses a technique for exposing a terminal from an encapsulation resin section after the encapsulation resin section is formed. The terminal is exposed by polishing the encapsulation resin section by liquid honing.

[Patent Document 1]
Japanese Unexamined Patent Publication No. 2004-266096
[Patent Document 2]
Japanese Unexamined Patent Publication No. 2006-222121

SUMMARY OF THE INVENTION

A study by the present inventors has revealed the following:

When in a resin sealed semiconductor package, terminals are exposed at the under surface (back surface) of the encapsulation resin section thereof, the resin sealed semiconductor package can be surface mounted. Further, when terminals are exposed not at the under surface of the encapsulation resin section but at the top and under surfaces of the encapsulation resin section, the radiation performance of the resin sealed semiconductor package can be enhanced. The encapsulation resin section can be formed by injecting encapsulation resin material into the cavity in an upper die and a lower die and curing the material at a molding step.

To manufacture a resin sealed semiconductor package with terminals exposed at the top and under surfaces of the encapsulation resin section thereof, the following procedure is followed. Multiple terminals are disposed above and below a semiconductor chip and they are bonded together with bonding material such as solder or silver paste, and the obtained assembly is disposed in the cavity in the mold. The mold is so fixed (clamped) that the upper terminals of the semiconductor chip are brought into contact with the upper die and the lower terminals of the semiconductor chip are brought into contact with the lower die. In this state, encapsulation resin material is injected into the cavity in the mold and cured. As a result, the encapsulation resin section can be so formed that the terminals are exposed at the top and under surfaces of the encapsulation resin section.

However, when the mold is so clamped that the upper terminals of a semiconductor chip are brought into contact with the upper die and the lower terminals of the semiconductor chip are brought into contact with the lower die, a problem arises. If the height of the assembly immediately before a molding step or the parallelism between the upper terminals and lower terminals of semiconductor chips varies, the following takes place: there is a possibility that strong pressure is applied from the upper die and the lower die to the semiconductor chip. This pressure is applied from above and below through the upper terminals of the semiconductor chip and the lower terminals of the semiconductor chip. When pressure is applied to the semiconductor chip from above and below, there is a possibility that cracking or the like occurs in the semiconductor chip. This degrades the fabrication yield of semiconductor devices of a resin sealed semiconductor package type.

If there is variation in the height of resin sealed semiconductor packages, for example, the following problem can arise when multiple semiconductor packages are mounted over a mounting board and then a heat sink is mounted over all the semiconductor packages: the state of coupling between the heat sink and each semiconductor package varies and there is a possibility that the state of radiation varies from semiconductor package to semiconductor package. For this reason, to enhance the heat radiation characteristic of resin sealed semiconductor packages, it is desired to reduce variation in height from semiconductor package to semiconductor package.

An object of the invention is to provide a technique that makes it possible to enhance the fabrication yield of semiconductor devices.

Another object of the invention is to provide a technique that makes it possible to enhance the heat radiation characteristic of a semiconductor device.

The above and other objects and novel features of the invention will be apparent from the description in this specification and the accompanying drawings.

The following is a brief description of the gist of the representative elements of the invention laid open in this application.

A manufacturing method of semiconductor devices in a representative embodiment is for a resin sealed semiconductor device having exposed conductors (first conductor section and second conductor section) at the top and under surfaces of an encapsulation resin section thereof. At this time, the following procedure is followed. A semiconductor chip is mounted over the first conductor section with a first film member and a first bonding material in-between. The second conductor section is mounted over the semiconductor chip with a second film member and a second bonding material in-between. The first bonding material and the second bonding material are cured to respectively bond the first conductor section and the second conductor section to both the surfaces of the semiconductor chip. Thereafter, the encapsulation resin section is formed to seal the semiconductor chip, first conductor section, and second conductor section.

A manufacturing method of semiconductor devices in another representative embodiment is for a resin sealed semiconductor device having exposed conductors (first conductor section and second conductor section) at the top and under surfaces of an encapsulation resin section thereof. At this time, the following procedure is followed. A semiconductor chip is mounted over the first conductor section with a first silver paste in-between. The second conductor section is mounted over the semiconductor chip with a second silver paste in-between. The first silver paste and the second silver paste are cured to respectively bond the first conductor section and the second conductor section to both the surfaces of the semiconductor chip. Thereafter, the encapsulation resin section is formed to seal the semiconductor chip, first conductor section, and second conductor section. The first silver paste and the second silver paste contain Ag filler, thermosetting resin as base resin, and spacer particles.

A manufacturing method of semiconductor devices in another representative embodiment follows the following procedure. A first conductor section and a second conductor section are bonded to both the surfaces of a semiconductor chip. An insulating sheet is stuck to the surface of the second conductor section on the opposite side to the side on which it is opposed to the semiconductor chip. Thereafter, an encapsulation resin section is formed to seal the semiconductor chip, first conductor section, second conductor section, and insulating sheet. At this time, the surface of the insulating sheet is exposed from a first surface of the encapsulation resin section; and the surface of the first conductor section is exposed from a second surface of the encapsulation resin section on the opposite side to the first surface.

In a manufacturing method of semiconductor devices in another representative embodiment, the following measure is taken. A first resin sealed semiconductor device and a second resin sealed semiconductor device each having exposed conductors at the top and under surfaces of an encapsulation resin section thereof are stacked and bonded together. At this time, the following procedure is followed. The second semiconductor device is mounted over a first surface of a first encapsulation resin section of the first semiconductor device with a first film member and conductive first bonding material in-between. Thereafter, the first bonding material is cured to bond the second semiconductor device to over the first surface of the first encapsulation resin section of the first semiconductor device.

In a manufacturing method of semiconductor devices in another representative embodiment, the following measure is taken. A first resin sealed semiconductor device and a second resin sealed semiconductor device each having exposed conductors at the top and under surfaces of an encapsulation resin section thereof. At this time, the following procedure is followed. The second semiconductor device is mounted over a first surface of a first encapsulation resin section of the first semiconductor device with silver paste in-between. Thereafter, the silver paste is cured to bond the second semiconductor device to over the first surface of the first encapsulation resin section of the first semiconductor device. This silver paste contains Ag filler, thermosetting resin as base resin, and spacer particles. The silver paste is cured by conducting heat treatment while pressure is applied to between the first semiconductor device and the second semiconductor device with the silver paste sandwiched in-between.

A manufacturing method of semiconductor devices in another representative embodiment is for a resin sealed semiconductor device. This semiconductor device has exposed conductors (first conductor section and third conductor section) at the top and under surfaces of an encapsulation resin section thereof where multiple semiconductor chips are sealed. At the time, the following procedure is followed. A first semiconductor chip is mounted over the first conductor section with a first silver paste in-between and the second conductor section is mounted over the first semiconductor chip with a second silver paste in-between. A second semiconductor chip is mounted over a second conductor section with a third silver paste in-between and the third conductor section is mounted over the second semiconductor chip with a fourth silver paste in-between. The first to fourth silver pastes are cured and then an encapsulation resin section is formed to seal the first and second semiconductor chips and the first to third conductor sections. The first to fourth silver pastes contain Ag filler, thermosetting resin as base resin, and spacer particles. When the first to fourth silver pastes are cured, heat treatment for curing is conducted while pressure is applied to between the first conductor section and the third conductor section sandwiching the first semiconductor chip, second conductor section, and second semiconductor chip therebetween.

The following is a brief description of the gist of effects obtained by the representative elements of the invention laid open in this application.

According to the above representative embodiments, the fabrication yield of a semiconductor device can be enhanced.

In addition, the heat radiation characteristic of a semiconductor device can be enhanced.

BRIEF DESCRIPTION OF THE DRAWINGS

FIG. 3 is a sectional view of the semiconductor device in FIG. 1;

FIG. 4 is another sectional view of the semiconductor device in FIG. 1;

FIG. 14 is an explanatory drawing of a preparation step for a film member;

DETAILED DESCRIPTION OF THE PREFERRED EMBODIMENTS

Figure 1:
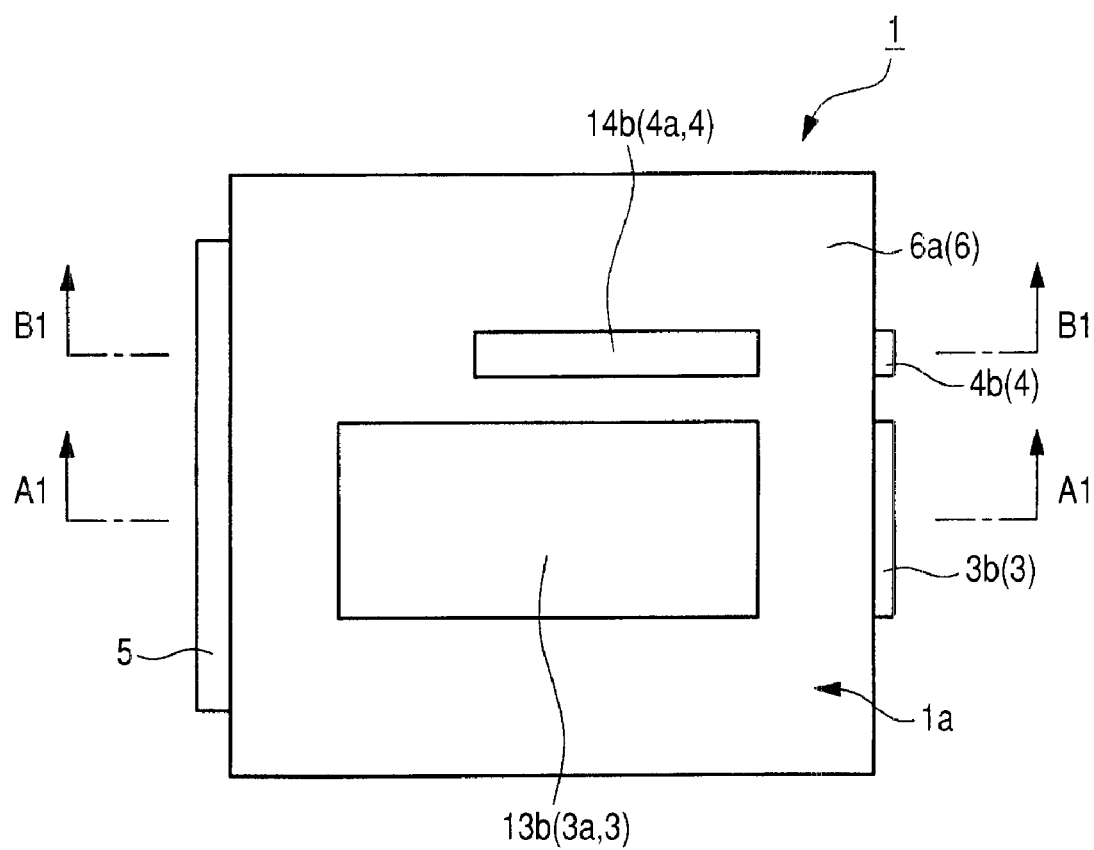
FIG. 1 is a top view of a semiconductor device in a first embodiment of the invention.

In the following description, each embodiment will be divided into multiple sections if necessary for the sake of convenience. Unless explicitly stated otherwise, they are not unrelated to one another, and they are in such a relation that one is a modification, details, supplementary explanation, or the like of part or all of the other. When mention is made of any number of elements (including a number of pieces, a numeric value, a quantity, a range, and the like) in the following description of embodiments, the number is not limited to that specific number. Unless explicitly stated otherwise or the number is obviously limited to a specific number in principle, the foregoing applies and the number may be above or below that specific number. In the following description of embodiments, needless to add, their constituent elements (including elemental steps and the like) are not always indispensable unless explicitly stated otherwise or they are obviously indispensable in principle. Similarly, when mention is made of the shape, positional relation, or the like of a constituent element or the like in the following description of embodiments, it includes those substantially approximate or analogous to that shape or the like. This applies unless explicitly stated otherwise or it is apparent in principle that some shape or the like does not include those substantially approximate or analogous to that shape or the like. This is the same with the above-mentioned numeric values and ranges.

Hereafter, detailed description will be given to embodiments of the invention based on the drawings. In every drawing for explaining embodiments of the invention, members having the same function will be marked with the same numerals or codes and the repetitive description thereof will be omitted. In the following description of embodiments, identical or similar contents will not be repetitively described as a rule unless repetitive description is especially required.

In the drawings referred to in relation to embodiments, hatching may be omitted to make them more understandable even though they are sectional views. Further, the drawings may be hatched to make them more understandable even though they are plan views.

First Embodiment

Description will be given to a semiconductor device in this embodiment with reference to drawings.

Figure 2:
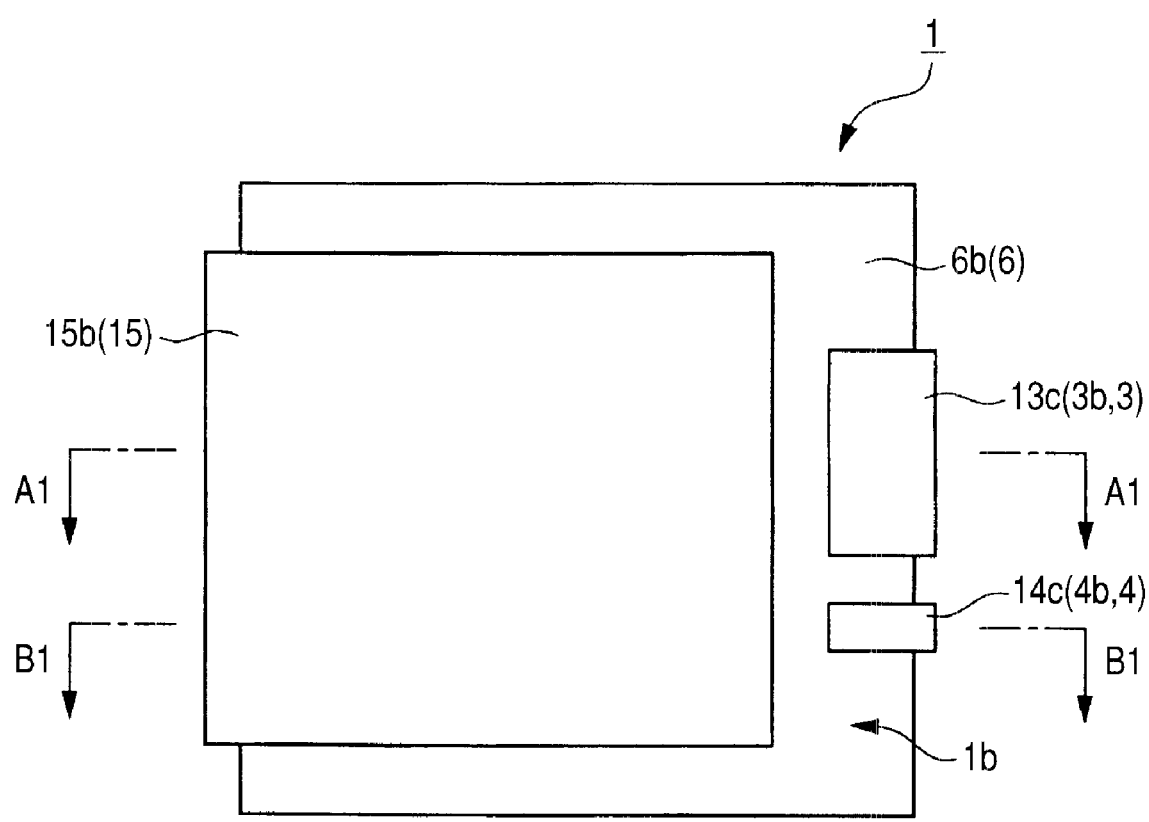
FIG. 2 is a bottom view of the semiconductor device in FIG. 1.

FIG. 1 is a top view (plan view) of the semiconductor device 1 as an embodiment of the invention; FIG. 2 is a bottom view (base view, back side view, plan view) thereof; and FIG. 3 and FIG. 4 are sectional views (side surface sectional views) thereof. A section taken along line A1-A1 of FIG. 1 (that is, a section taken along line A1-A1 of FIG. 2) substantially corresponds to FIG. 3; and a section taken along line B1-B1 of FIG. 1 (that is, a section taken along line B1-B1 of FIG. 2) substantially corresponds to FIG. 4.

The semiconductor device (semiconductor package) 1 in this embodiment is a resin sealed and surface mounted semiconductor package. That is, the semiconductor device 1 is a semiconductor device of a resin sealed semiconductor package type.

The semiconductor device 1 in this embodiment, illustrated in FIG. 1 to FIG. 4, includes: a semiconductor chip 2; a source terminal (terminal for source, conductor section for coupling a source, conductor section, second conductor section) 3, a gate terminal (terminal for gate, conductor section for coupling a gate, conductor section, second conductor section) 4, and a drain terminal (terminal for drain, conductor section for coupling a drain, conductor section, first conductor section) 5, each formed of a conductor; and an encapsulation resin section (sealing section, encapsulation resin) 6 sealing all of them.

The encapsulation resin section 6 is formed of resin material, such as thermosetting resin, and may contain filler or the like. For example, epoxy resin or the like containing filler can be used to form the encapsulation resin section 6. The semiconductor chip 2, source terminal 3, gate terminal 4, and drain terminal 5 are sealed and protected by the encapsulation resin section 6. The encapsulation resin section 6 has a top surface (front surface, second surface) 6a and a back surface (bottom surface, under surface, first surface) 6b, which are two principal surfaces positioned on the opposite side to each other. The back surface 6b of the encapsulation resin section 6, that is, the back surface (bottom surface, under surface) 1b of the semiconductor device 1 is the mounting surface of the semiconductor device 1.

The semiconductor chip 2 is obtained by: forming various semiconductor elements or semiconductor integrated circuits in a semiconductor substrate (semiconductor wafer) comprised of, for example, single crystal silicon or the like; grinding the back surface of the semiconductor substrate as required; and then dividing the semiconductor substrate into individual semiconductor chips 2 by dicing or the like. The semiconductor chip 2 is sealed in the encapsulation resin section 6 and is not exposed from the encapsulation resin section 6.

In this embodiment, for example, a semiconductor chip with a vertical power MISFET (Metal Insulator Semiconductor Field Effect Transistor) of trench gate structure formed therein can be used for the semiconductor chip 2. The semiconductor chip 2 has a front surface 2a and a back surface 2b, which are two principal surfaces positioned on the opposite side to each other. (The front surface 2a is a principal surface on the side where the semiconductor elements are formed and is also designated as second principal surface.) (The back surface 2b is a principal surface on the opposite side to the front surface 2a and is also designated as first principal surface.) The semiconductor chip 2 includes: a source pad electrode (front surface electrode) 2s and a gate pad electrode (front surface electrode) 2g formed in the front surface 2a of the semiconductor chip 2; and a back surface drain electrode (back surface electrode) 2d formed in the entire back surface 2b of the semiconductor chip 2. The source pad electrode 2s is electrically coupled to the source of MISFET formed in the semiconductor chip 2; the gate pad electrode 2g is electrically coupled to the gate electrode of the MISFET formed in the semiconductor chip 2; and the back surface drain electrode 2d is electrically coupled to the drain of the MISFET formed in the semiconductor chip 2.

Figure 5:
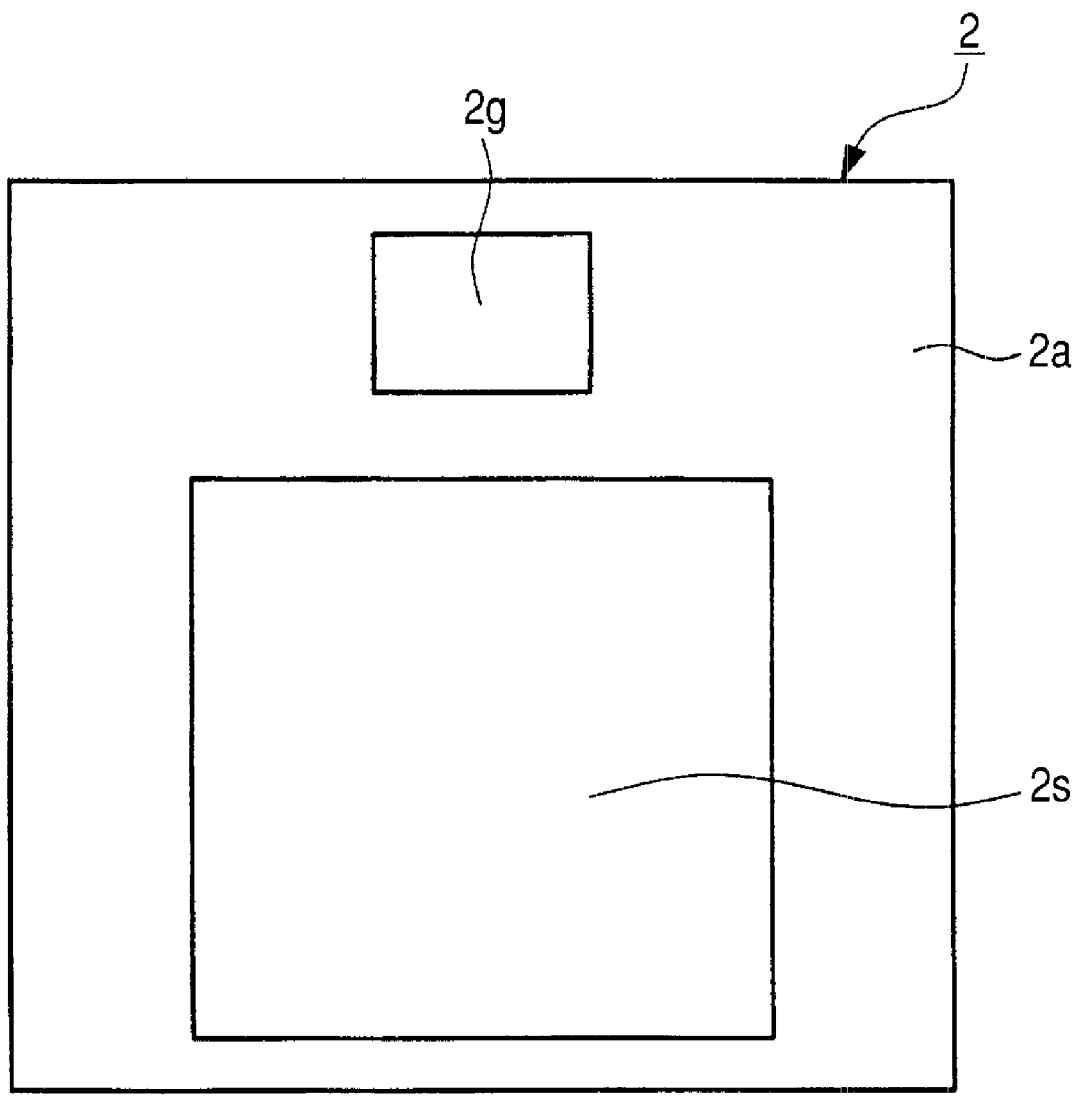
FIG. 5 is a plan view illustrating an example of the chip layout of a semiconductor chip used in the semiconductor device in FIG. 1.

FIG. 5 is a plan view (top view) illustrating an example of the chip layout of the semiconductor chip 2. In the semiconductor chip 2 in this embodiment, as illustrated in FIG. 5, the source pad electrode 2s and the gate pad electrode 2g are formed in the front surface 2a of the semiconductor chip 2. However, the disposition of each electrode may be modified as required.

The source terminal 3, gate terminal 4, and drain terminal 5 are formed of conductive material, for example, metal material, such as copper (Cu) or copper alloy. The semiconductor chip 2 is so disposed that the following is implemented: the semiconductor chip 2 is positioned between the drain terminal 5 positioned under the semiconductor chip 2 and the source terminal 3 and the gate terminal 4 positioned above the semiconductor chip 2; and the front surface 2a of the semiconductor chip 2 surfaces upward.

The following is implemented through conductive bonding material (adhesive) 7: the source terminal 3 is joined (bonded, coupled) with the source pad electrode 2s in the front surface 2a of the semiconductor chip 2; the gate terminal 4 is joined (bonded, coupled) with the gate pad electrode 2g in the front surface 2a of the semiconductor chip 2; and the drain terminal 5 is joined (bonded, coupled) with the back surface drain electrode 2d in the back surface 2b of the semiconductor chip 2. For this reason, the source terminal 3 is electrically coupled to the source pad electrode 2s of the semiconductor chip 2 through the bonding material 7; the gate terminal 4 is electrically coupled to the gate pad electrode 2g of the semiconductor chip 2 through the bonding material 7; and the drain terminal 5 is electrically coupled to the back surface drain electrode 2d of the semiconductor chip 2 through the bonding material 7. The conductive bonding material 7 is preferably obtained by curing solder or silver (Ag) paste.

The under surface 15b of the drain terminal 5 is exposed at the back surface 6b of the encapsulation resin section 6. A side surface (end surface, end) 15c of the drain terminal 5 is exposed at a side surface of the encapsulation resin section 6 and the other side surfaces (end surfaces, ends) of the drain terminal 5 are covered and sealed with the encapsulation resin section 6. The exposed side surface 15c of the drain terminal 5 is a side surface (end surface) produced as the result of a cutting step (corresponding to Step S11, describe later) during the manufacture of the semiconductor device 1. Part of the top surface 15a of the drain terminal 5 is joined with the back surface drain electrode 2d of the semiconductor chip 2 through the conductive bonding material 7; and the other part of the top surface 15a of the drain terminal 5 is covered and sealed with the encapsulation resin section 6.

The source terminal 3 includes: a first portion (chip coupling portion, conductor section) 3a; a second portion (external terminal composing portion, conductor section) 3b; and a stepped portion (bent portion, coupling portion, conductor section) 3c that couples the first portion 3a and the second portion 3b together. The first portion 3a, second portion 3b, and stepped portion 3c are integrally formed of the same conductive material and the stepped portion 3c couples together the first portion 3a and the second portion 3b different in height from each other.

Part of the under surface 13a of the first portion 3a of the source terminal 3 is joined to the source pad electrode 2s of the semiconductor chip 2 through the conductive bonding material 7; and the other part of the under surface 13a of the first portion 3a of the source terminal 3 is covered and sealed with the encapsulation resin section 6. The top surface 13b of the first portion 3a of the source terminal 3 is exposed at the top surface 6a of the encapsulation resin section 6. The stepped portion 3c of the source terminal 3 is covered with the encapsulation resin section 6 and sealed in the encapsulation resin section 6. The under surface 13c of the second portion 3b of the source terminal 3 is exposed at the back surface 6b of the encapsulation resin section 6. A side surface (end surface, end) 13d of the second portion 3b of the source terminal 3 is exposed at a side surface of the encapsulation resin section 6. (The side surface 13d is an end side surface 13d on the opposite side to the side where the second portion 3b is coupled to the stepped portion 3c.) The other side surfaces (end surfaces, ends) of the second portion 3b of the source terminal 3 are covered and sealed with the encapsulation resin section 6. The exposed side surface 13d of the source terminal 3 is a side surface (end surface) produced as the result of a cutting step (corresponding to Step S11, described later) during the manufacture of the semiconductor device 1.

The gate terminal 4 includes: a first portion (chip coupling portion, conductor section) 4a; a second portion (external terminal composing portion, conductor section) 4b; and a stepped portion (bent portion, coupling portion, conductor section) 4c that couples the first portion 4a and the second portion 4b together. The first portion 4a, second portion 4b, and stepped portion 4c are integrally formed of the same conductive material and the stepped portion 4c couples together the first portion 4a and the second portion 4b different in height from each other.

Part of the under surface 14a of the first portion 4a of the gate terminal 4 is joined to the gate pad electrode 2g of the semiconductor chip 2 through the conductive bonding material 7; and the other part of the under surface 14a of the first portion 4a of the gate terminal 4 is covered and sealed with the encapsulation resin section 6. The top surface 14b of the first portion 4a of the gate terminal 4 is exposed at the top surface 6a of the encapsulation resin section 6. The stepped portion 4c of the gate terminal 4 is covered with the encapsulation resin section 6 and sealed in the encapsulation resin section 6. The under surface 14c of the second portion 4b of the gate terminal 4 is exposed at the back surface 6b of the encapsulation resin section 6. A side surface (end surface, end) 14d of the second portion 4b of the gate terminal 4 is exposed at a side surface of the encapsulation resin section 6. (The side surface 14d is an end side surface 14d on the opposite side to the side where the second portion 4b is coupled to the stepped portion 4c.) The other side surfaces (end surfaces, ends) of the second portion 4b of the gate terminal 4 are covered and sealed with the encapsulation resin section 6. The exposed side surface 14d of the gate terminal 4 is a side surface (end surface)

produced as the result of a cutting step (corresponding to Step S11, described later) during the manufacture of the semiconductor device 1.

In this embodiment, not only the bonding material (adhesive) 7 exists between the back surface 2b (back surface drain electrode 2d) of the semiconductor chip 2 and the top surface 15a of the drain terminal 5. A film member (film for bonding) 8a also exists there. Between the back surface 2b of the semiconductor chip 2 and the top surface 15a of the drain terminal 5, the bonding material 7 and the film member 8a do not overlap each other on a plane. (That is, they do not overlap each other as viewed from a plane parallel with the front surface 2a of the semiconductor chip 2.) The bonding material 7 is placed in an area of the back surface 2b (back surface drain electrode 2d) of the semiconductor chip 2 where the film member 8a is not placed.

Not only the bonding material (adhesive) 7 exists between the front surface 2a of the semiconductor chip 2 and the following under surfaces: the under surface 13a of the first portion 3a of the source terminal 3 and the under surface 14a of the first portion 4a of the gate terminal 4. A film member (film for bonding) 8b also exists there. Between the front surface 2a of the semiconductor chip 2 and the under surfaces 13a, 14a of the source terminal 3 and gate terminal 4, the bonding material 7 and the film member 8b do not overlap each other on a plane. (That is, they do not overlap each other as viewed from a plane parallel with the front surface 2a of the semiconductor chip 2.) The film member 8b is preferably placed in a position on the front surface 2a of the semiconductor chip 2 where it does not overlap the source pad electrode 2s or the gate pad electrode 2g. The bonding material 7 is placed on the front surface 2a of the semiconductor chip 2 over the source pad electrode 2s and the gate pad electrode 2g.

The film member 8a and the film member 8b are preferably formed of films of substantially the same sort except that they are different in planar shape.

It is more desirable that the following under surfaces exposed at the back surface 6b of the encapsulation resin section 6 should be formed substantially flush with one another: the under surface 13c of the second portion 3b of the source terminal 3; the under surface 14c of the second portion 4b of the gate terminal 4; and the under surface 15b of the drain terminal 5.

As mentioned above, the following under surfaces are exposed at the back surface (bottom surface) 1b of the semiconductor device 1 corresponding to the back surface 6b of the encapsulation resin section 6: the under surface 13c of the second portion 3b of the source terminal 3; the under surface 14c of the second portion 4b of the gate terminal 4; and the under surface 15b of the drain terminal 5. These exposed portions function as external terminals (terminals, external coupling terminals, terminals for external coupling) of the semiconductor device 1. (The above exposed portions include the under surface 13c of the second portion 3b of the source terminal 3, the under surface 14c of the second portion 4b of the gate terminal 4, and the under surface 15b of the drain terminal 5.) Since as external terminals, the source terminal 3, gate terminal 4, and drain terminal 5 are exposed at the back surface 1b of the semiconductor device 1 (the back surface 6b of the encapsulation resin section 6), the semiconductor device 1 can be surface mounted. The back surface 1b of the semiconductor device 1 (the back surface 6b of the encapsulation resin section 6) functions as the mounting surface of the semiconductor device 1.

In the semiconductor device 1 in this embodiment, the following top surfaces are exposed at the top surface 1a of the semiconductor device 1: the top surface 13b of the first portion 3a of the source terminal 3 and the top surface 14b of the first portion 4a of the gate terminal 4. (The top surface 1a is, in other words, the principal surface of the semiconductor device 1 on the opposite side to the back surface 1b.) That is, the top surface 13b and the top surface 14b are exposed at the front surface 6a of the encapsulation resin section 6.

As mentioned above, the semiconductor device 1 in this embodiment is a semiconductor device of a resin sealed semiconductor package type having exposed conductors on the top and under surfaces. The first portion 3a of the source terminal 3 and the first portion 4a of the gate terminal 4 are exposed conductors on the top surface 1a (top surface 6a) side. The second portion 3b of the source terminal 3, the second portion 4b of the gate terminal 4, and the drain terminal 5 are exposed conductors on the back surface 1b (back surface 6b) side. The conductor sections coupled (joined) to the semiconductor chip 2 are exposed not only at the back surface 1b of the semiconductor device 1 (the back surface 6b of the encapsulation resin section 6). The conductor sections are also exposed at the top surface 1a of the semiconductor device 1 (the top surface 6a of the encapsulation resin section 6). (The conductor sections include the first portion 3a of the source terminal 3 and the first portion 4a of the gate terminal 4.) As a result, it is possible to enhance the heat radiation characteristic of the semiconductor device 1 and thus the performance of the semiconductor device 1.

Figure 6:
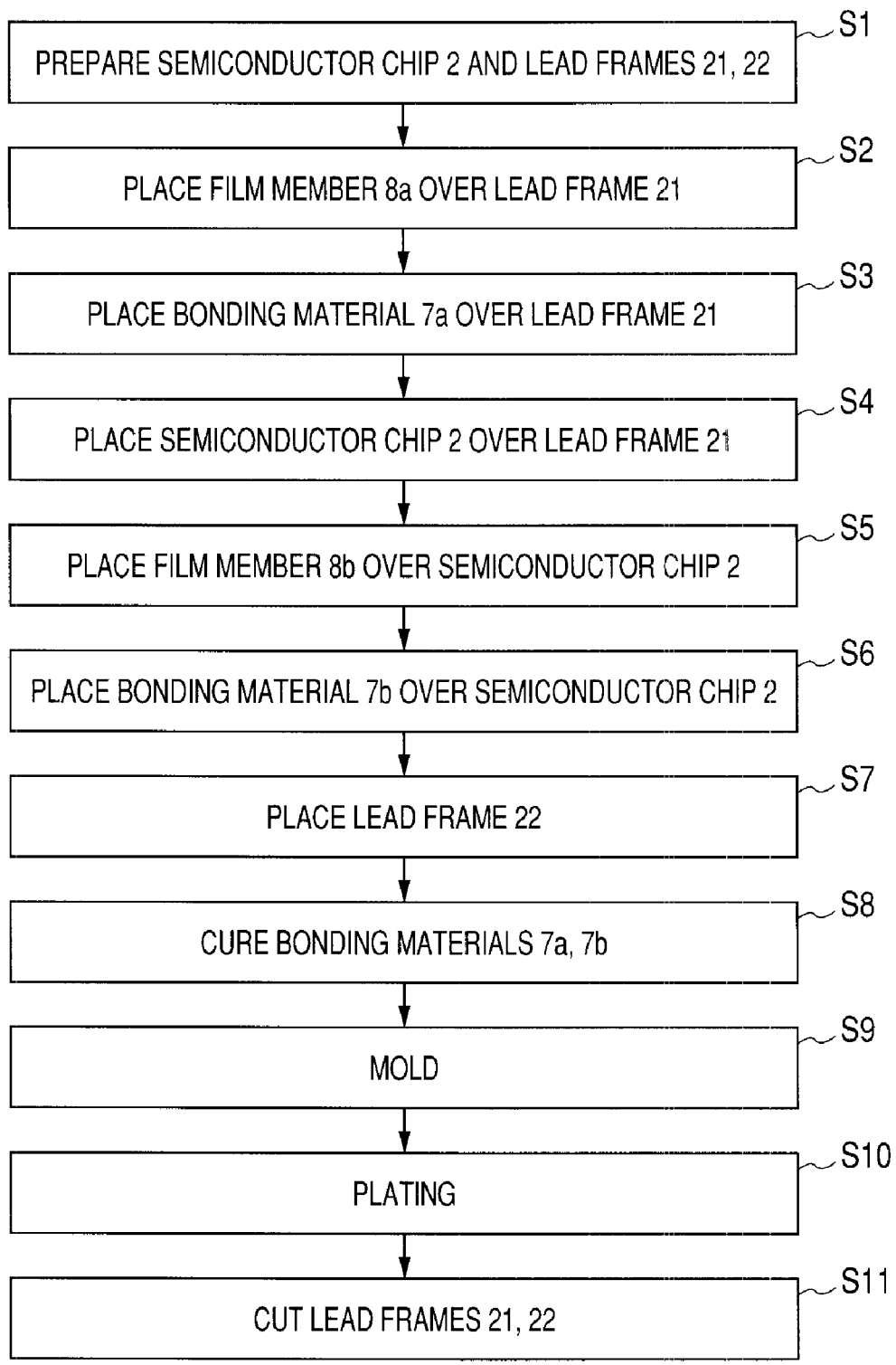
FIG. 6 is a process flowchart illustrating a manufacturing process for the semiconductor device in the first embodiment of the invention.
Figure 7:
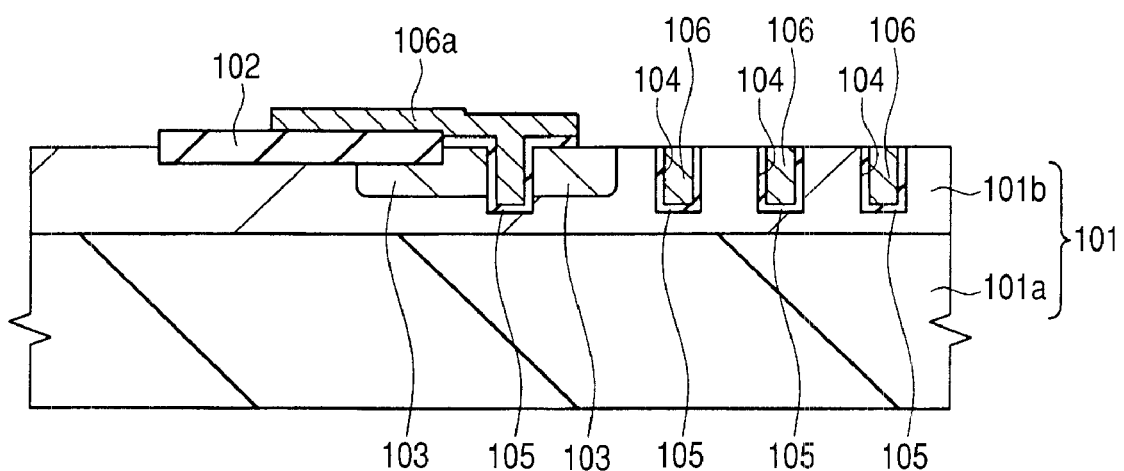
FIG. 7 is a sectional view of a substantial part of a semiconductor chip in the manufacturing process.
Figure 8:
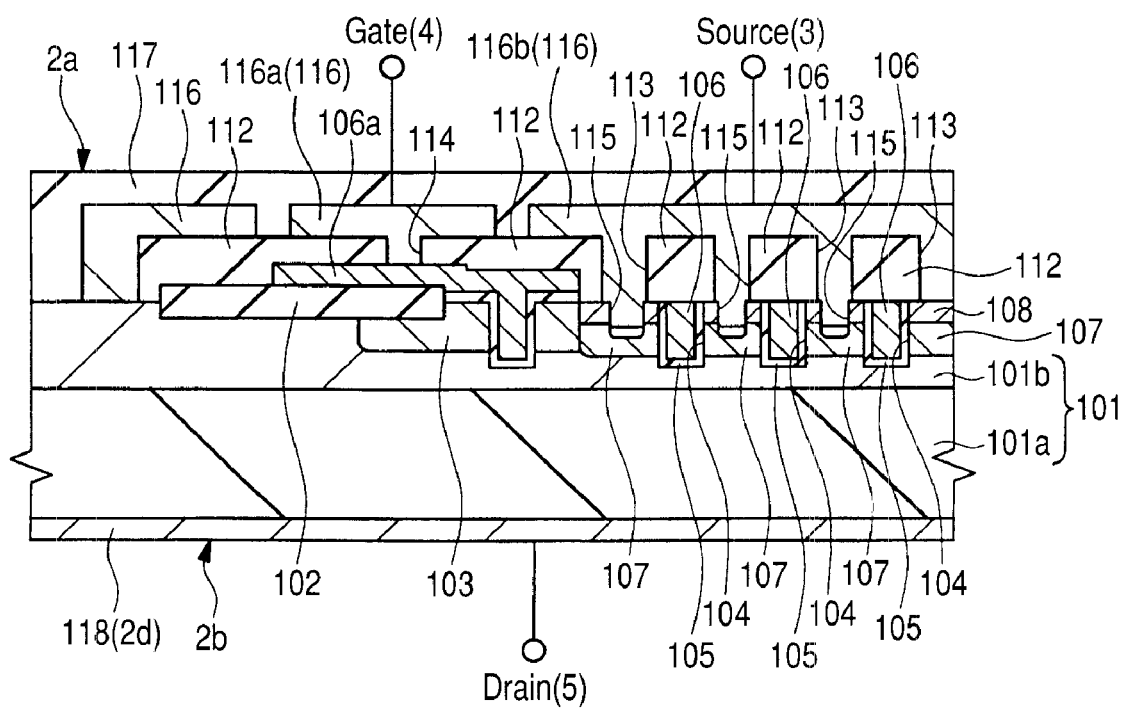
FIG. 8 is a sectional view of the substantial part of the semiconductor chip in the manufacturing process, following FIG. 7.
Figure 9:
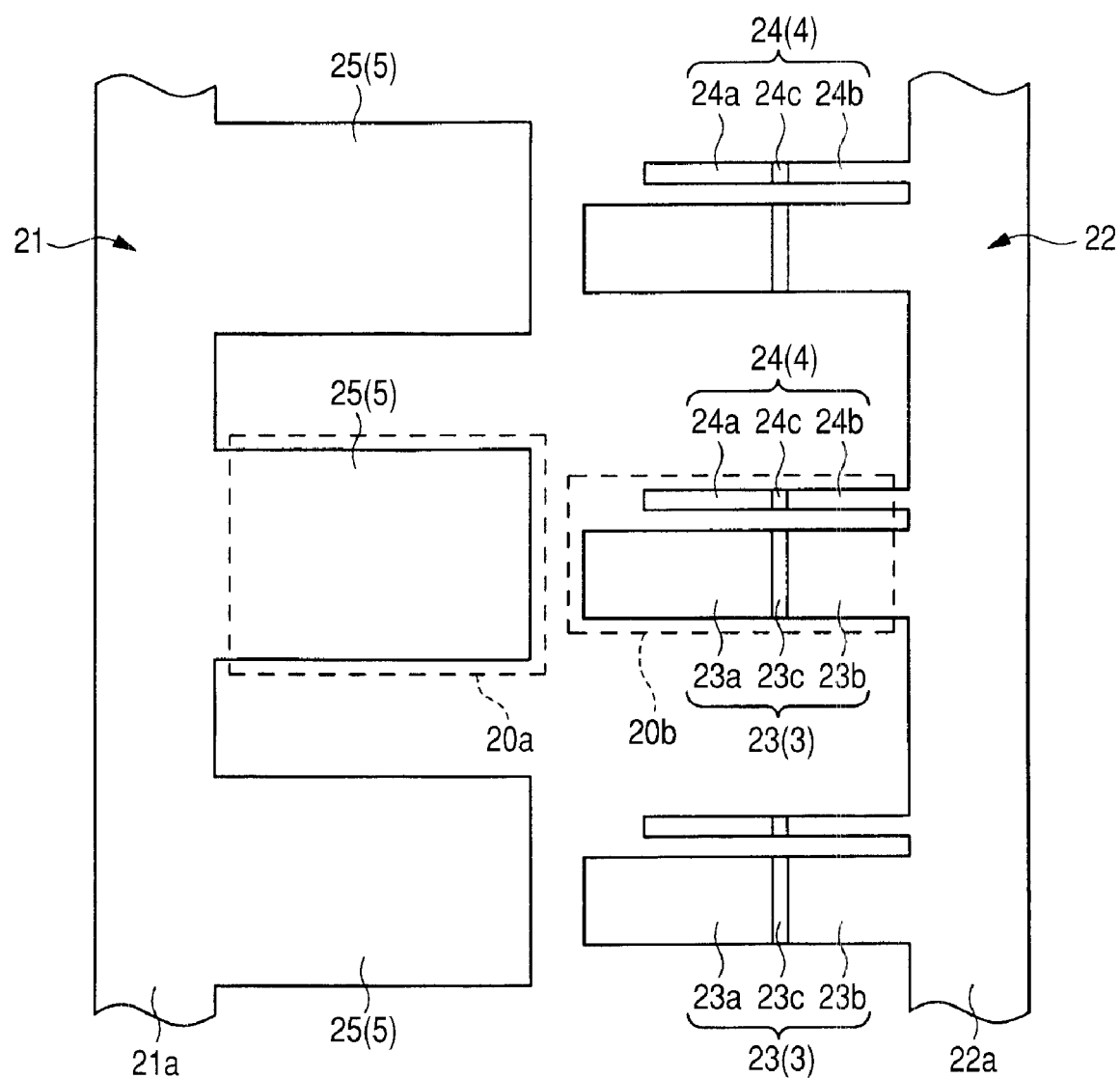
FIG. 9 is a plan view illustrating a lead frame.
Figure 10:
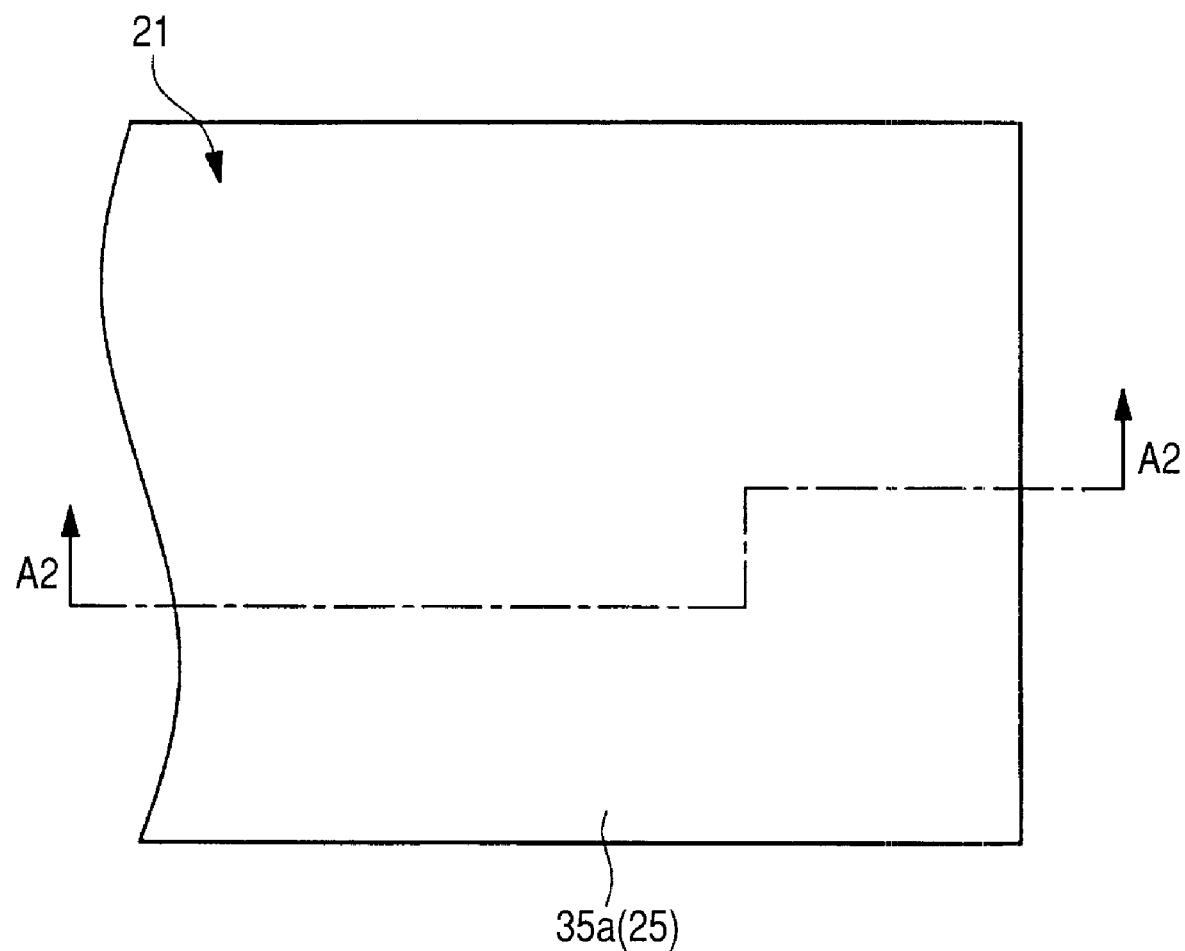
FIG. 10 is a plan view of a semiconductor device in the first embodiment of the invention in the manufacturing process.
Figure 11:
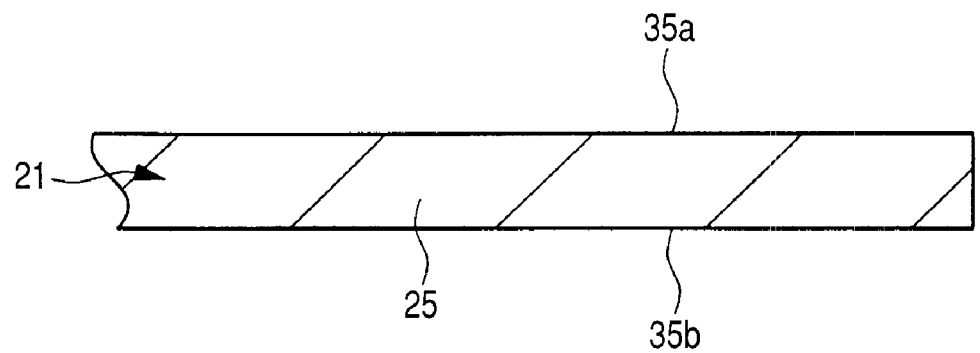
FIG. 11 is a sectional view of the same semiconductor device as in FIG. 10 in the manufacturing process.
Figure 12:
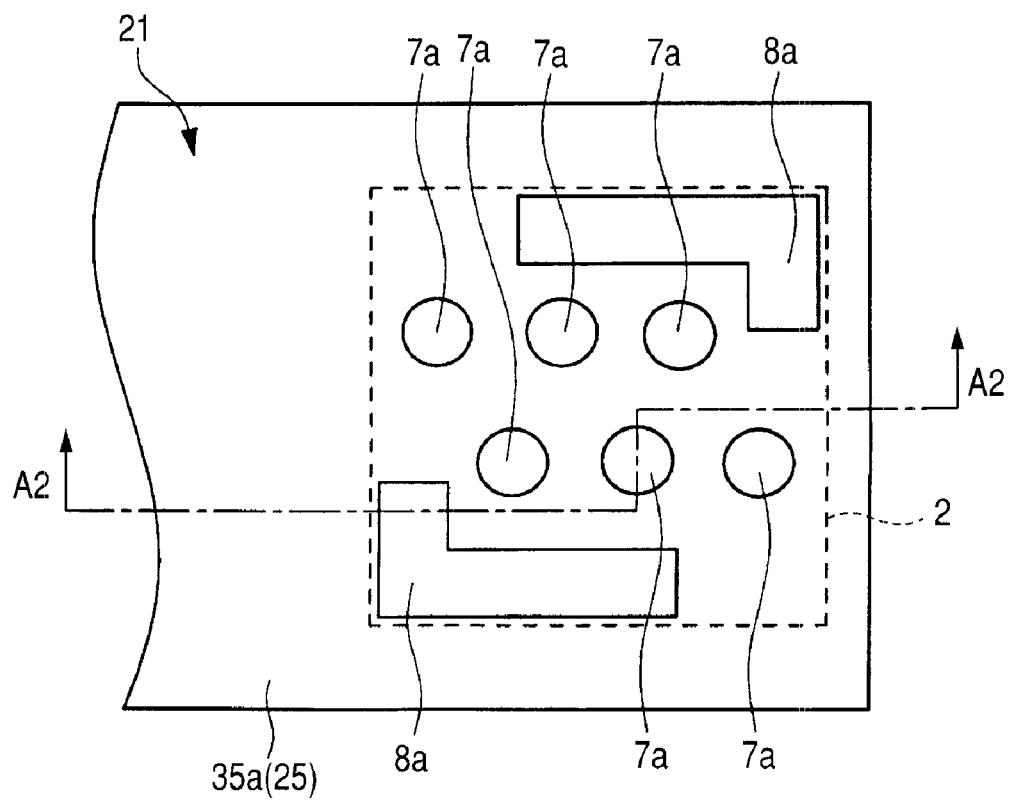
FIG. 12 is a plan view of the semiconductor device in the manufacturing process, following FIG. 10.
Figure 13:
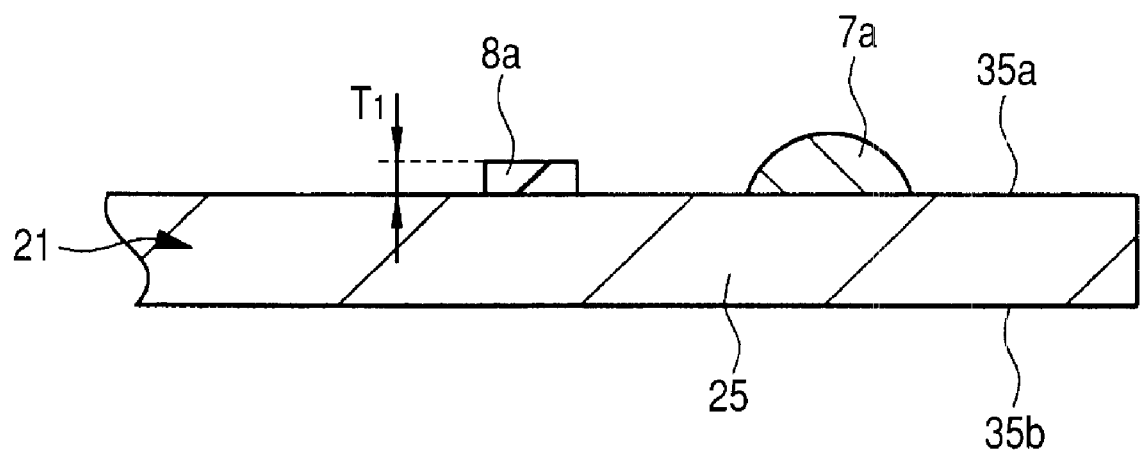
FIG. 13 is a sectional view of the same semiconductor device as in FIG. 12 in the manufacturing process.
Figure 15:
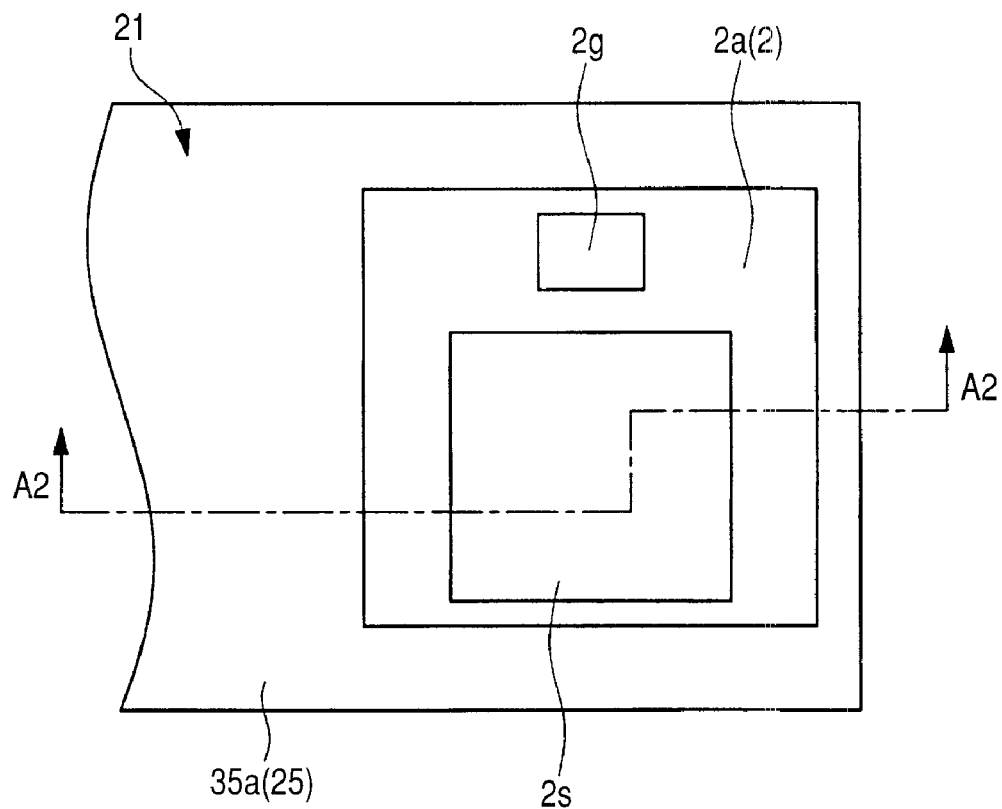
FIG. 15 is a plan view of the semiconductor device in the manufacturing process, following FIG. 12.
Figure 16:
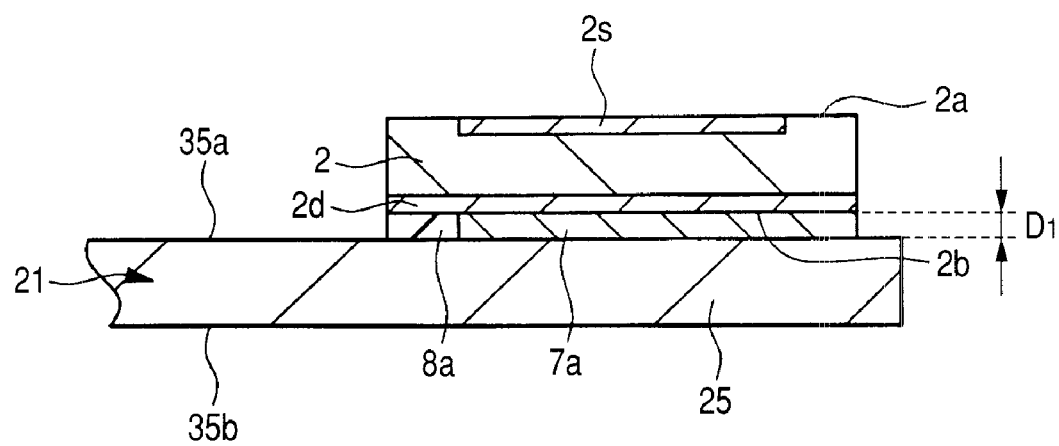
FIG. 16 is a sectional view of the same semiconductor device as in FIG. 15 in the manufacturing process.
Figure 17:
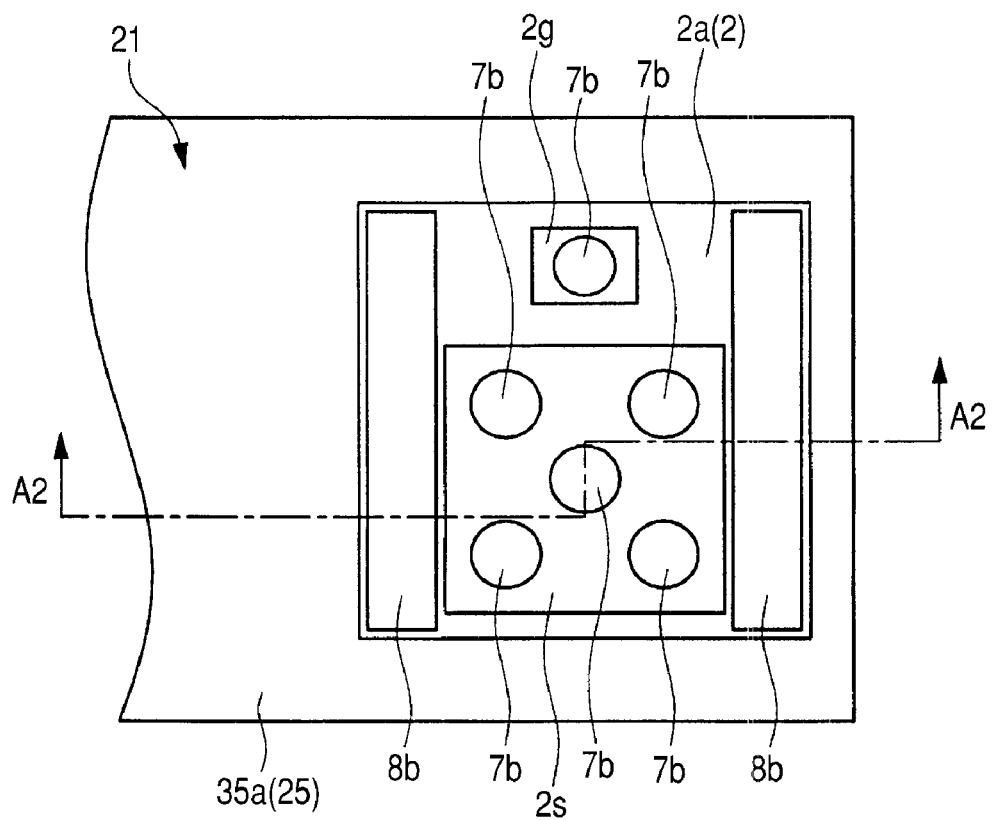
FIG. 17 is a plan view of the semiconductor device in the manufacturing process, following FIG. 15.
Figure 18:
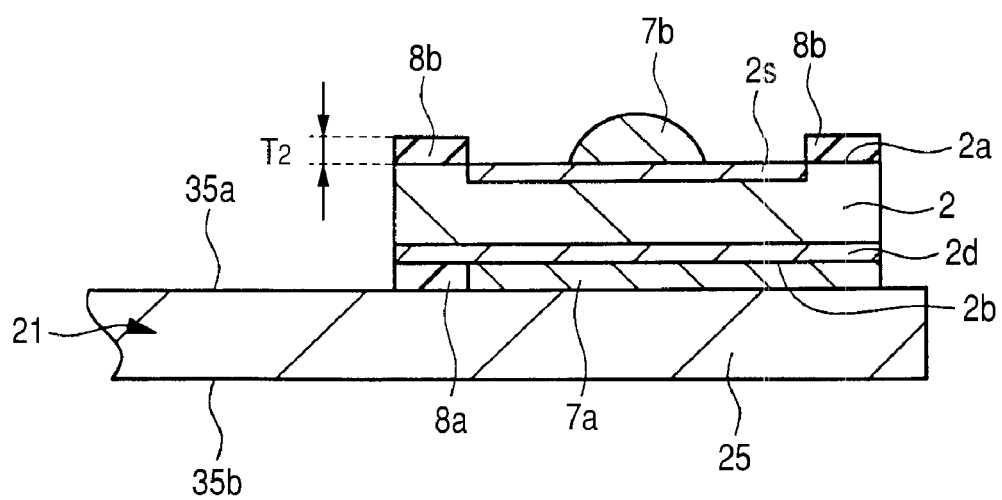
FIG. 18 is a sectional view of the same semiconductor device as in FIG. 17 in the manufacturing process.

Description will be given to a manufacturing process for the semiconductor device in this embodiment. FIG. 6 is a process flowchart illustrating the manufacturing process for the semiconductor device 1 in this embodiment. FIG. 7 and FIG. 8 are sectional views of substantial parts of the semiconductor chip 2 in the manufacturing process. FIG. 9 is a plan view illustrating lead frames 21, 22. The drawings from FIG. 10 to FIG. 27 are substantial part plan views, substantial part sectional views, or explanatory drawings illustrating the manufacturing process for the semiconductor device 1 in this embodiment. Of FIG. 10 to FIG. 27, FIG. 10, FIG. 12, FIG. 15, FIG. 17, and FIG. 19 are plan views (substantial part plan views); and FIG. 11, FIG. 13, FIG. 16, FIG. 18, and FIG. 20 to FIG. 27 are sectional views (substantial part sectional views). FIG. 10 and FIG. 11 correspond to an identical process step; FIG. 12 and FIG. 13 correspond to an identical process step; FIG. 15 and FIG. 16 correspond to an identical process step; FIG. 17 and FIG. 18 correspond to an identical process step; and FIG. 19, FIG. 20, and FIG. 21 correspond to an identical process step. FIG. 20 and FIG. 21 correspond to different sectional views at the identical process step; and FIG. 22 and FIG. 23 correspond to different sectional views at the identical process step. The sectional views in FIG. 11, FIG. 13, FIG. 16, FIG. 18, FIG. 20, FIG. 22, and FIG. 24 to FIG. 27 are sectional views that substantially correspond to sections taken along line A2-A2 illustrated in FIG. 10, FIG. 12, FIG. 15, FIG. 17, and FIG. 19 and are substantially equivalent to FIG. 3. The sectional views in FIG. 21 and FIG. 23 are sectional views that substantially correspond to a section taken along line B2-B2 illustrated in FIG. 19 and are substantially equivalent to FIG. 4. FIG. 14 is an explanatory drawing of a preparation step for the film members 8a, 8b.

To manufacture the semiconductor device 1, first, the semiconductor chip 2 and the lead frames (conductive material members) 21, 22 are prepared (Step S1).

Description will be given to an example of the manufacturing process for the semiconductor chip 2 with reference to FIG. 7 and FIG. 8.

To manufacture the semiconductor chip 2, first, an epitaxial layer 101b is grown over a principal surface of a semiconductor substrate (semiconductor wafer) 101a to form a semiconductor substrate (semiconductor wafer, so-called epitaxial wafer) 101 as illustrated in FIG. 7. The semiconductor substrate 101a is comprised of n+-type single crystal silicon or the like implanted with, for example, arsenic (As). The epitaxial layer 101b is comprised of n−-type single crystal silicon. Thereafter, an insulating film (silicon oxide film) is formed in the principal surface of the semiconductor substrate 101 and then this insulating film is patterned to form an insulating film 102 (SiO$_2$ plate).

A p-type impurity (for example, boron (B)) is ion-implanted in the principal surface of the semiconductor substrate 101 or other like processing is carried out to form a p-type well 103.

Using a photoresist pattern (not shown) as an etching mask, the semiconductor substrate 101 is dry-etched to form grooves for trench gate formation, that is, trenches 104 for gate. The trenches 104 for gate have such dimensions that the depth thereof is larger than that of the p-type well 103 and shallower than the bottom of the epitaxial layer 101b.

Using, for example, a thermal oxidation method or the like, a relatively thin gate insulating film (silicon oxide film) 105 is formed over the inner wall surfaces (side surfaces and bottom surfaces) of the trenches 4 for gate and the like.

A conductor film (gate electrode material film) comprised of, for example, a low-resistance polycrystalline silicon film or the like is formed over the principal surface of the semiconductor substrate 101. A photoresist pattern (not shown) that covers a gate wiring formation region and does not cover the other regions is formed over the above-mentioned conductor film. Using this photoresist pattern as an etching mask, the above-mentioned conductor film is etched back to from the following sections: a gate section 106 comprised of low-resistance polycrystalline silicon or the like filled in the trenches 104 for gate and a gate wiring section 106a formed integrally with the gate section 106.

As illustrated in FIG. 8, a p-type impurity (for example, boron (B)) is ion-implanted in the principal surface of the semiconductor substrate 101 or by other like processing to form a channel region 107. Thereafter, an n-type impurity (for example, arsenic (As)) is ion-implanted in the principal surface of the semiconductor wafer 1 or other like processing is carried out to form a source region 108.

An insulating film 112 is formed over the principal surface of the semiconductor substrate 101 and is patterned by photolithography and etching. At this time, the following holes are formed in the insulating film 112: a contact hole 113 for exposing the principal surface of the semiconductor substrate 101 and a through hole 114 for exposing part of the gate wiring section 106a.

The semiconductor substrate 101 exposed in the contact holes 113 is etched to form holes 115. Thereafter, the semiconductor substrate 101 exposed in the contact holes 113 and the holes 115 is ion-implanted with, for example, a p-type impurity (for example, boron (B)) to form a p+-type semiconductor region.

For example, a titanium tungsten film (not shown) is formed over the principal surface of the semiconductor substrate 101 and then an aluminum film (or an aluminum alloy film) 116 is formed thereover by sputtering or the like. Subsequently, the laminated film of the titanium tungsten film and the aluminum film 116 is patterned by photolithography and etching. As a result, front surface electrodes, such as a gate electrode 116a and a source wiring 116b, are formed.

An insulating film (protective film) 117 for front surface protection comprised of, for example, polyimide resin or the like is formed over the principal surface of the semiconductor substrate 101. Subsequently, using photolithography and etching, the insulating film 117 is patterned to form openings (not shown) exposing part of the gate electrode 116a and the source wiring 116b, and thus bonding pads are formed. The gate electrode 116a exposed in an opening in the insulating film 117 becomes the above-mentioned gate pad electrode 2g of the semiconductor chip 2; and the source wiring 116b exposed in an opening in the insulating film 117 becomes the above-mentioned source pad electrode 2s.

The back surface of the semiconductor substrate 101 is ground or polished to reduce the thickness thereof. Thereafter, for example, nickel, titanium, or nickel and gold is deposited on the back surface of the semiconductor substrate 101 by a vapor deposition method or the like to form a drain electrode 118. This drain electrode 118 becomes the above-mentioned back surface drain electrode 2d of the semiconductor chip 2.

Thus, such a semiconductor element as a vertical power MISFET of trench gate structure is formed in the semiconductor substrate 101.

Thereafter, the semiconductor substrate 101 is cut or diced using a dicing saw or the like and thereby separated into segmented semiconductor chips 2. Thus, the semiconductor chip 2 with the vertical power MISFET of trench gate structure formed therein is manufactured. The vertical MISFET corresponds to MISFET in which a source-drain current flows in the direction of the thickness of a semiconductor substrate (direction substantially perpendicular to the principal surface of the semiconductor substrate).

Lead frames 21, 22 used in the manufacture of the semiconductor device 1 are conductive material members comprised of conductive material and are formed of metal material, such as copper (Cu) or copper alloy.

As illustrated in FIG. 9, the lead frame 21 has a drain terminal portion 25 that becomes the drain terminal 5 later and is so structured that multiple drain terminal portions 25 are integrally tied with a frame rim 21a.

The lead frame 22 has a source terminal portion 23 that becomes the source terminal 3 later and a gate terminal portion 24 that becomes the gate terminal 4 later. The lead frame 22 is so structured that a source terminal portion 23 and a gate terminal portion 24 are paired with each other and multiple pairs are integrally tied with a frame rim 22a.

Each source terminal portion 23 of the lead frame 22 includes: a first portion 23a of the source terminal portion 23 that becomes the first portion 3a of the source terminal 3 later; a second portion 23b of the source terminal portion 23 that becomes the second portion 3b of the source terminal 3 later; and a stepped portion (bent portion) 23c of the source terminal portion 23 that becomes the stepped portion (bent portion) 3c of the source terminal 3 later. These portions are integrally formed. Each gate terminal portion 24 of the lead frame 22 includes: a first portion 24a of the gate terminal portion 24 that becomes the first portion 4a of the gate terminal 4 later; a second portion 24b of the gate terminal portion 24 that becomes the second portion 4b of the gate terminal 4 later; and a stepped portion (bent portion) 24c of the gate terminal portion 24 that becomes the stepped portion (bent portion) 4c of the gate terminal 4 later. These portions are integrally formed. In the lead frame 22, each source terminal portion 23 and each gate terminal portion 24 are tied with the frame rim 20b at the respective ends (ends of the second portions 23b, 24b) and are integrally formed.

The lead frames 21, 22 are multiple lead frames and the lead frames 21, 22 can be used to manufacture multiple semiconductor devices 1 at once. At this time, one semiconductor device 1 is manufactured from one drain terminal portion 25 and one pair of a source terminal portion 23 and a gate terminal portion 24. The lead frames 21, 22 illustrated in FIG.

10 to FIG. 13 and FIG. 15 to FIG. 21, referred to later, correspond to areas 20a, 20b illustrated in FIG. 9.

The lead frames 21, 22 may be provided with perforations (not shown) along a line along which the lead frames are to be cut to facilitate cutting of the lead frames 21, 22 described later. The lead frames 21, 22 can be manufactured by processing a metal plate (copper plate or the like) into a desired shape by, for example, molding (pressing), etching, or the like or by other like methods.

FIG. 10 and FIG. 11 illustrate a drain terminal portion 25 of a lead frame 21 that underwent Step S1 before Step S2, described later, is carried out.

After the semiconductor chip 2 and the lead frames 21, 22 are prepared, a film member (film for bonding) 8a is placed (mounted, stuck to) over the lead frame 21 as illustrated in FIG. 12 and FIG. 13 (Step S2). Specifically, at Step S2, the film member 8a is placed (mounted) over the first principal surface (top surface) 35a of a drain terminal portion 25 of the lead frame 21. The film member 8a has a thickness of $T_1$. Each drain terminal portion 25 of the lead frame 21 has a first principal surface (top surface) 35a and a second principal surface (under surface) 35b on the opposite side to each other. The first principal surface 35a becomes the top surface 15a of the drain terminal 5 later and the second principal surface 35b becomes the under surface 15b of the drain terminal 5 later. (The under surface 15b is a surface exposed from the back surface 6b of the encapsulation resin section 6.) The film member 8a is placed (mounted) in part of an area where the semiconductor chip 2 is to be mounted. In FIG. 12, the area where the semiconductor chip 2 is disposed later (area to be mounted with the semiconductor chip 2) is indicated by a broken line to facilitate understanding. For the film member 8a and the film member 8b used later, for example, a die bonding film (die attach film) or the like can be used.

FIG. 14 is an explanatory drawing illustrating an example of a preparation step for the film member 8a and the film member 8b described later. The sketch (a) in FIG. 14 illustrates the film members before cutting. The upper illustration in the sketch (a) in FIG. 14 is a schematic plan view (top view) and the lower illustration is a schematic sectional view though not hatched. The sketch (b) in FIG. 14 illustrates the film members after cutting. The upper illustration in the sketch (b) in FIG. 14 is a schematic plan view (top view) and the lower illustration is a schematic sectional view though not hatched.

As illustrated in the sketch (a) in FIG. 14, a sheet-like film (film member) 8 before cutting, placed over a base material layer (base film) 37, is prepared. As illustrated in the sketch (b) in FIG. 14, subsequently, the film 8 is cut into a desired shape. At this time, the base material layer 37 is not cut. The cut film 8 becomes the film members 8a (or the film members 8b described later). A film member 8a is picked up (stripped) from the base material layer 37 and placed over the lead frame 21 at Step S2. At Step S5, described later, a film member 8b is picked up from the base material layer 37 and placed over the semiconductor chip 2.

After film members 8a are placed over the lead frame 21, as mentioned above, at Step S2, the conductive bonding material 7a is placed over the lead frame 21 as illustrated in FIG. 12 and FIG. 13 (Step S3). At Step S3, specifically, the bonding material 7a is placed over (applied to) the first principal surface 35a of each drain terminal portion 25 of the lead frame 21. The bonding material 7a is a paste-like bonding material and is preferably solder paste or silver paste. At Step S3, the bonding material 7a is placed in or applied to the following area of the first principal surface 35a of each drain terminal portion 25 of the lead frame 21: an area where the semiconductor chip 2 is to be mounted and the film member 8a is not placed. FIG. 12 and FIG. 13 illustrate a state in which the steps up to Step S3, or the bonding material 7a placement step, have been carried out.

As illustrated in FIG. 15 and FIG. 16, subsequently, the semiconductor chip 2 is placed (mounted) over the lead frame 21 (Step S4). At Step S4, specifically, the semiconductor chip 2 is placed (mounted) over the first principal surface 35a of each drain terminal portion 25 of the lead frame 21 so that the following is implemented: the front surface 2a of the semiconductor chip 2 surfaces upward; and the back surface 2b (back surface drain electrode 2d side) of the semiconductor chip 2 is opposed to the first principal surface 35a of each drain terminal portion 25 of the lead frame 21. As a result, the semiconductor chip 2 is placed (mounted) over the first principal surface 35a of each drain terminal portion 25 of the lead frame 21 with the bonding material 7a and the film member 8a in-between. The semiconductor chip 2 is temporarily fixed by the adhesion (adherence) of either or both of the bonding material 7a and the film member 8a.

As illustrated in FIG. 17 and FIG. 18, film members (films for bonding) 8b are placed over (mounted over, stuck to) the front surface 2a of the semiconductor chip 2 (Step S5). The film member 8b has a thickness of $t_2$. The film member 8b is placed (mounted) over the front surface 2a of the semiconductor chip 2 in positions where they do not overlap the gate pad electrode 2g or the source pad electrode 2s.

Conductive bonding material 7b is placed over the front surface 2a of the semiconductor chip 2 (Step S6). The bonding material 7b is a paste-like bonding material and is preferably solder paste or silver paste. The bonding material 7b is a bonding material of the same sort as the bonding material 7a. Therefore, when the bonding material 7a is silver paste, the bonding material 7b is also comprised of silver paste; and when the bonding material 7a is solder paste, the bonding material 7b is also comprised of solder paste. At Step S6, the bonding material 7b is placed or applied in an area of the front surface 2a of the semiconductor chip 2 where the film member 8b is not placed. However, the bonding material 7b must be placed over (applied to) the gate pad electrode 2g and the source pad electrode 2s. FIG. 17 and FIG. 18 illustrate a state in which the steps up to Step S6, or the bonding material 7b placement step, have been carried out.

Figure 19:
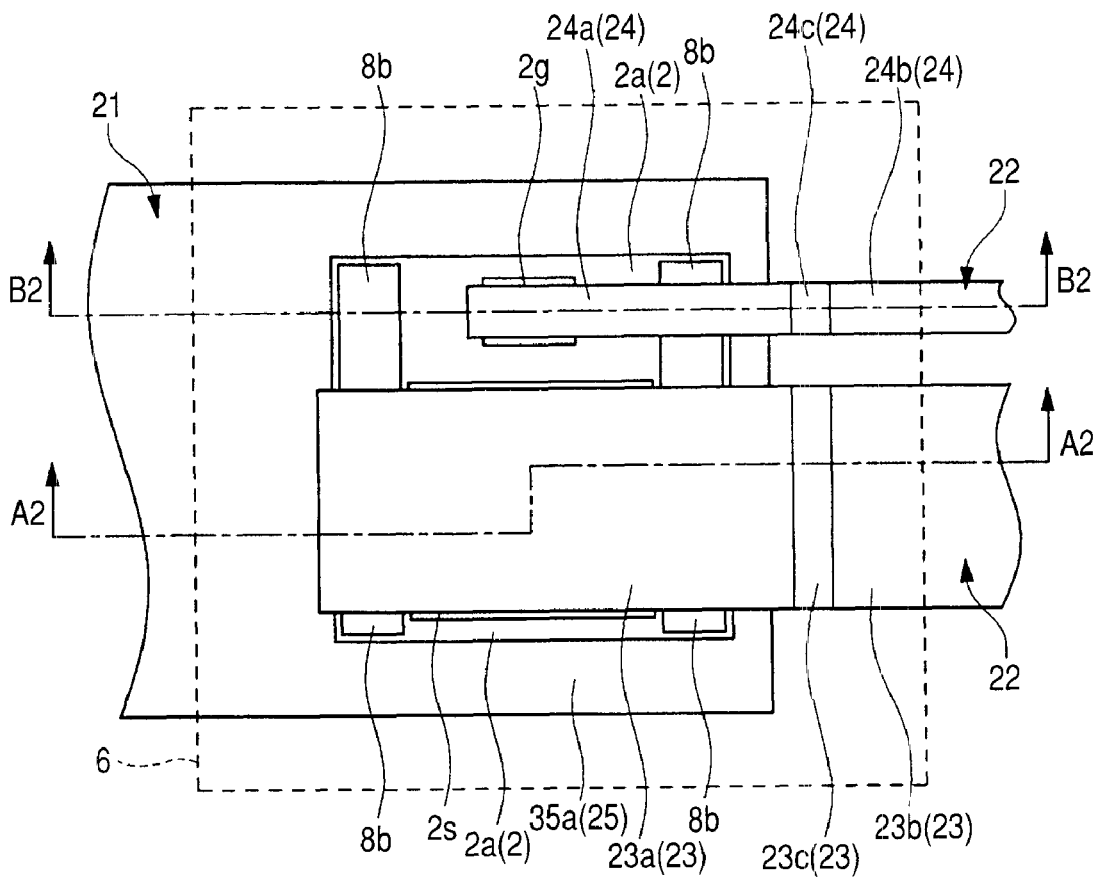
FIG. 19 is a plan view of the semiconductor device in the manufacturing process, following FIG. 17.
Figure 20:
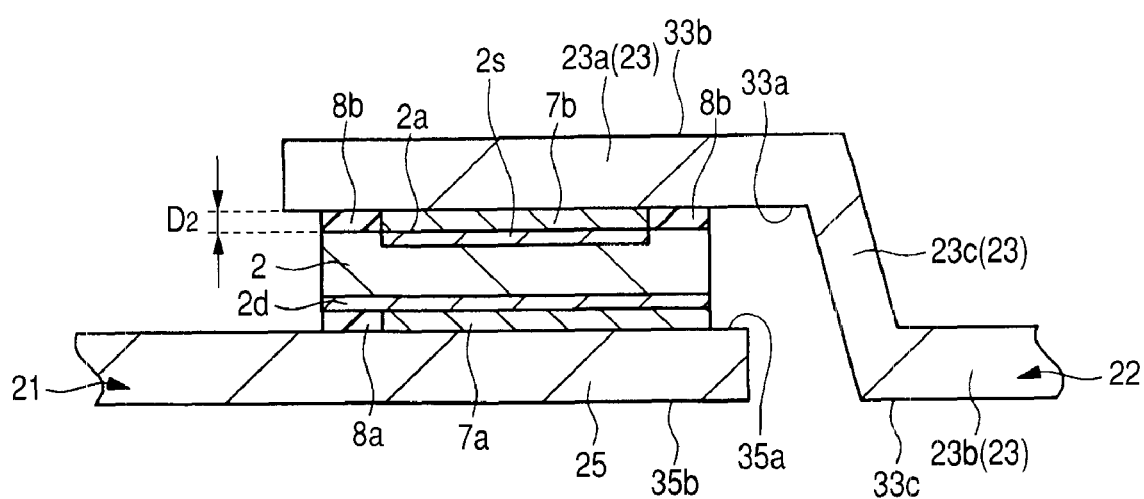
FIG. 20 is a sectional view of the same semiconductor device as in FIG. 19 in the manufacturing process.
Figure 21:
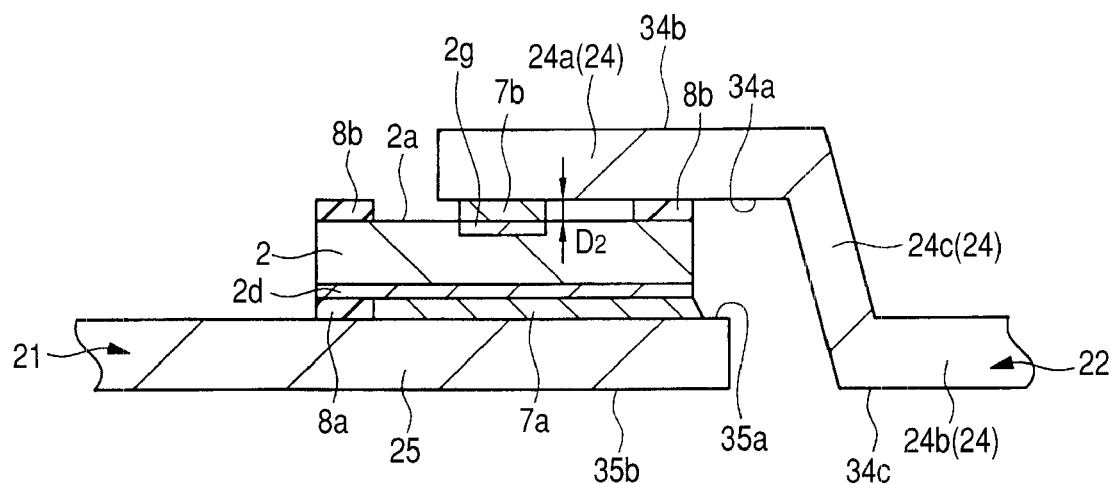
FIG. 21 is another sectional view of the same semiconductor device as in FIG. 19 in the manufacturing process.

As illustrated in FIG. 19 to FIG. 21, the lead frame 22 is placed over the front surface 2a of the semiconductor chip 2 (Step S7). At Step S7, specifically, the lead frame 22 is placed over the lead frame 21 and the semiconductor chip 2 so that the following is implemented: the first portion 23a of each source terminal portion 23 of the lead frame 22 is placed over the source pad electrode 2s of each semiconductor chip 2; and at the same time, the first portion 24a of each gate terminal portion 24 of the lead frame 22 is placed over the gate pad electrode 2g of each semiconductor chip 2. As a result, the following are placed (mounted) over the front surface 2a of the semiconductor chip 2 with the bonding material 7b and the film member 8b in-between: the first portion 23a of a source terminal portion 23 of the lead frame 22 (the first principal surface 33a thereof); and the first portion 24a of a gate terminal portion 24 (the first principal surface 34a thereof). These portions are temporarily fixed by the adhesion (adherence) of either or both of the bonding material 7b and the film member 8a.

The first portion 23a of each source terminal portion 23 of the lead frame 22 has a first principal surface (under surface) 33a and a second principal surface (top surface) 33b on the opposite side to each other. The first principal surface 33a becomes the under surface 13a of the first portion 3a of the source terminal 3 later. The second principal surface 33b becomes the top surface 13b of the first portion 3a of the source terminal 3 later. (The top surface 13b is a surface exposed from the top surface 6a of the encapsulation resin section 6.) The first portion 24a of each gate terminal portion 24 of the lead frame 22 has a first principal surface (under surface) 34a and a second principal surface (top surface) 34b on the opposite side to each other. The first principal surface 34a becomes the under surface 14a of the first portion 4a of the gate terminal 4 later. The second principal surface 34b becomes the top surface 14b of the first portion 4a of the gate terminal 4. (The top surface 14b is a surface exposed from the top surface 6a of the encapsulation resin section 6.) In FIG. 21, the area covered with the encapsulation resin section 6 later (area where the encapsulation resin 6 is to be formed) is indicated by a broken line to facilitate understanding.

Subsequently, the bonding materials 7a, 7b are cured (Step S8).

When the bonding materials 7a, 7b are solder paste, solder reflow is carried out at Step S8 to melt and solidify (re-solidify) the bonding materials 7a, 7b. When the bonding material 7a, 7b are silver paste, heat treatment for curing the silver paste is carried out at Step S8 to cure the bonding materials 7a, 7b.

Figure 22:
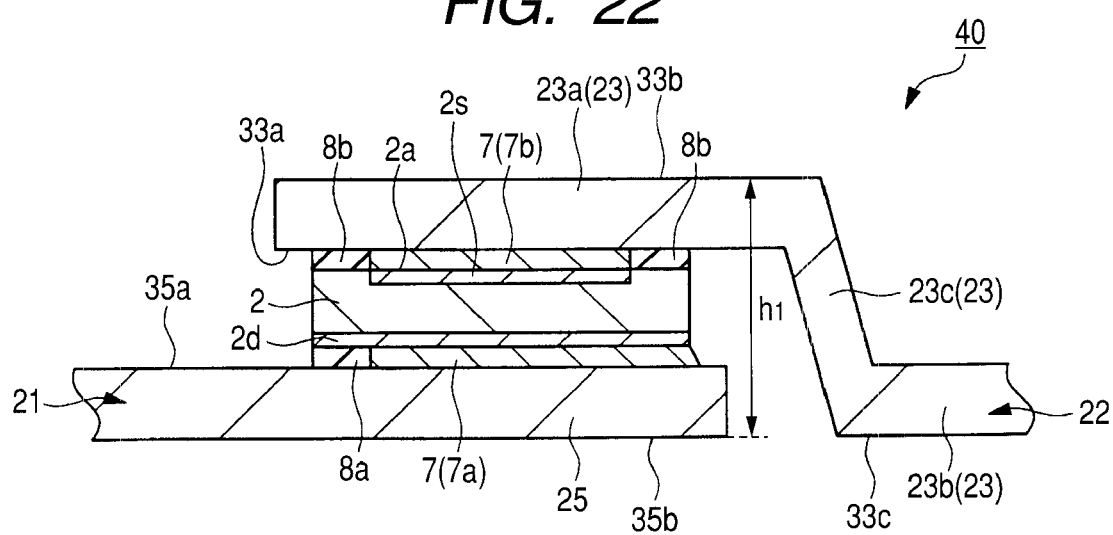
FIG. 22 is a sectional view of the semiconductor device in the manufacturing process, following FIG. 20.
Figure 23:
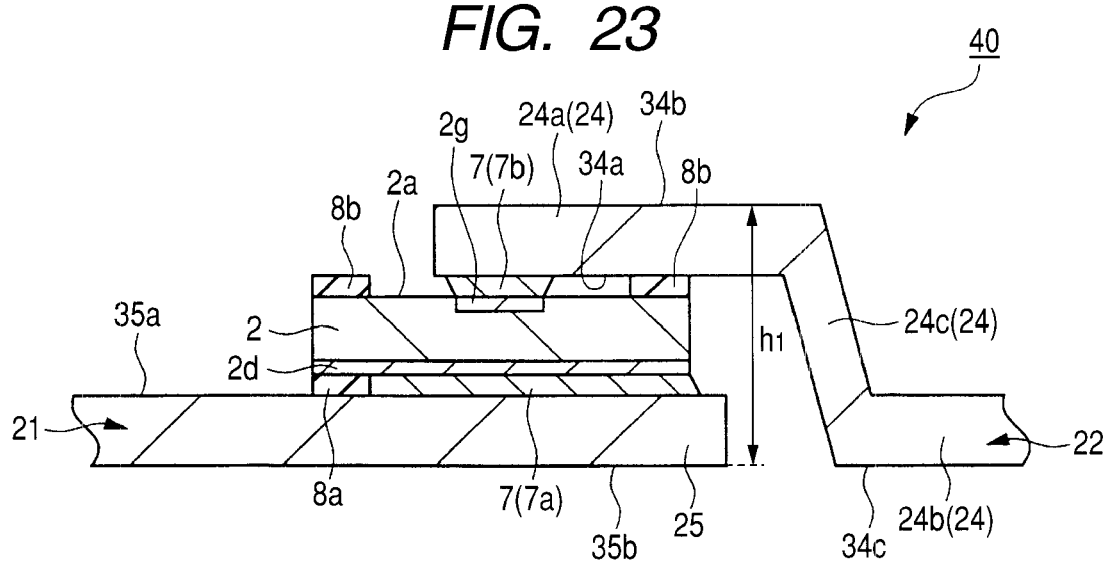
FIG. 23 is another sectional view of the same semiconductor device as in FIG. 22 in the manufacturing process.

As the result of the curing step, Step S8, for the bonding materials 7a, 7b, the following are respectively joined and electrically coupled together through the bonding material 7 (the cured bonding materials 7a, 7b) as illustrated in FIG. 22 and FIG. 23: each source terminal portion 23, gate terminal portion 24, and drain terminal portion 25 of the lead frames 21, 22 and the source pad electrode 2s, gate pad electrode 2g, and back surface drain electrode 2d of each semiconductor chip 2. More specific description will be given. The first portion 23a (first principal surface 33a thereof) of a source terminal portion 23 of the lead frame 22 and the source pad electrode 2s of the semiconductor chip 2 are joined and electrically coupled together through the bonding material 7. The first portion 24a (first principal surface 34a thereof) of a gate terminal portion 24 of the lead frame 22 and the gate pad electrode 2g of the semiconductor chip 2 are joined and electrically coupled together through the bonding material 7. The back surface drain electrode 2d of the semiconductor chip 2 and (the first principal surface 35a of) a drain terminal portion 25 of the lead frame 21 are joined and electrically coupled together through the bonding material 7.

The bonding material 7 is the bonding materials 7a, 7b cured by the processing of Step S8. When the bonding materials 7a, 7b are solder paste, the bonding materials 7a, 7b comprised of solder paste are melted and solidified by the solder reflow at Step S8 and turned into the bonding material 7 comprised of solder. When the bonding materials 7a, 7b are silver paste, the bonding materials 7a, 7b comprised of silver paste are cured by the heat treatment of Step S8 and turned into the bonding material 7.

As the result of the heat treatment at the curing step, Step S8, for the bonding materials 7a, 7b, the film members 8a, 8b are also cured. The cured film member 8a contributes to the junction (bonding) between the back surface 2b of the semiconductor chip 2 and the drain terminal portion 25. The cured film member 8b contributes to the junction (bonding) between the front surface 2a of the semiconductor chip 2 and the first portion 23a of the source terminal portion 23 and the first portion 24a of the gate terminal portion 24. For this reason, the film members 8a, 8b can be regarded as films for bonding (film-type adhesive, film-type bonding material).

When the bonding materials 7a, 7b are solder paste, the following processing may be carried out after solder reflow is carried out at the curing step, Step S8, for the bonding materials 7a, 7b: cleaning may be carried out to remove flux and the like as required.

As mentioned above, the following are joined through the bonding material 7: a source terminal portion 23 of the lead frame 22 is joined to the source pad electrode 2s in the front surface 2a of the semiconductor chip 2; a gate terminal portion 24 of the lead frame 22 is joined to the gate pad electrode 2g in the front surface 2a of the semiconductor chip 2; and a drain terminal portion 25 of the lead frame 21 is joined to the back surface drain electrode 2d in the back surface 2b of the semiconductor chip 2. As a result, an assembly (work) 40 comprised of the lead frames 21, 22 and a semiconductor chip 2 joined therebetween is obtained.

A molding step (resin molding step, for example, transfer molding step) is carried out to form the encapsulation resin section 6 and each semiconductor chip 2 is sealed with the encapsulation resin section 6 (Step S9).

Figure 24:
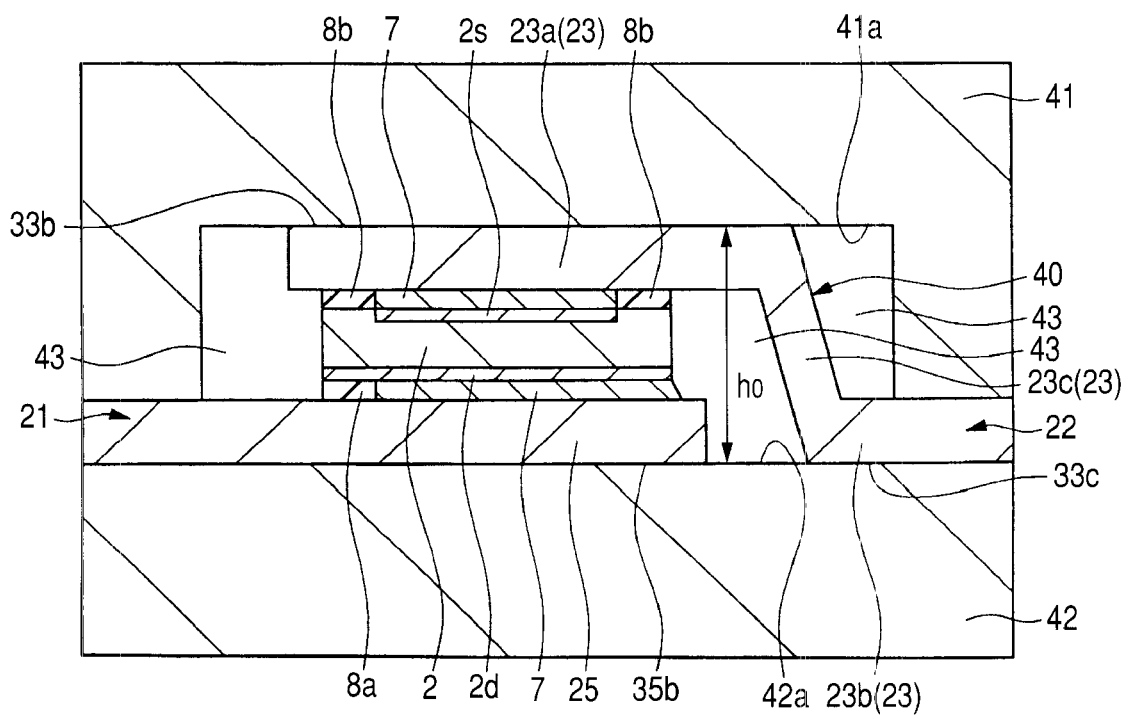
FIG. 24 is a sectional view of the semiconductor device in the manufacturing process, following FIG. 22.

FIG. 24 illustrates the assembly 40 fixed in a mold 41, 42 (upper die 41 and lower die 42) at the molding step, Step S9.

To carry out the molding step, Step S9, first, the assembly 40 is fixed in the mold 41, 42. More specific description will be given. As illustrated in FIG. 24, the peripheral portions of the lead frames 21, 22 are sandwiched and clamped (fixed) between the dies 41, 42 so that the following is implemented: each source terminal portion 23 and gate terminal portion 24 of the lead frame 22, each drain terminal portion 25 of the lead frame 21, and each semiconductor chip 2 therebetween are disposed in a cavity 43. This cavity is formed by the under surface 41a of the die 41 and the top surface 42a of the die 42.

When the lead frames 21, 22 are clamped between the dies 41, 42, it is ensured that the following are brought into contact (close contact) with the top surface 42a of the die (lower die) 42: the second principal surface (under surface) 35b of each drain terminal portion 25 of the lead frame 21; the under surface 34c of the second portion 24b of each gate terminal portion 24 of the lead frame 22; and the under surface 33c of the second portion 23b of each source terminal portion 23 of the lead frame 22. In addition, it is ensured that the following are brought into contact (close contact) with the under surface 41a of the die (upper die) 41: the second principal surface (top surface) 33b of the first portion 23a of each source terminal portion 23 of the lead frame 22; and the second principal surface (top surface) 34b of the first portion 24a of each gate terminal portion 24 of the lead frame 22.

The second principal surface (under surface) 35b of each drain terminal portion 25 of the lead frame 21 is a surface on the opposite side to the side where it is opposed to the back surface 2b of the semiconductor chip 2. That is, the second principal surface (under surface) 35b of the drain terminal portion 25 of the lead frame 21 is a surface on the opposite side to the side where it is joined to the back surface drain electrode 2d. When the manufacture of the semiconductor device 1 is completed, the second principal surface (under surface) 35b becomes the under surface 15b of the drain terminal 5. When the manufacture of the semiconductor device 1 is completed, the under surface 33c of the second portion 23b of each source terminal portion 23 of the lead frame 22 becomes the following: the under surface 13c of the second portion 3b of the source terminal 3. When the manufacture of the semiconductor device 1 is completed, the under surface 34c of the second portion 24b of each gate terminal portion 24 of the lead frame 22 becomes the following: the under surface 14c of the second portion 4b of the gate terminal 4. When the manufacture of the semiconductor device 1 is completed, the second principal surface (top surface) 33b of the first portion 23a of each source terminal portion 23 of the lead frame 22 becomes the following: the top surface 13b of the first portion 3a of the source terminal 3. When the manufacture of the semiconductor device 1 is completed, the second principal surface (top surface) 34b of the first portion 24a of each gate terminal portion 24 of the lead frame 22 becomes the following: the top surface 14b of the first portion 4a of the gate terminal 4.

It is desirable that the height $h_1$ (indicated in FIG. 22 and FIG. 23) of the assembly 40 immediately before the molding step should be substantially equal to the height $h_0$ (indicated in FIG. 24) of the cavity 43 in the mold 41, 42 ($h_1 = h_0$). The height $h_1$ of the assembly 40 immediately before the molding step is equivalent to the height (distance) from the second principal surface (under surface) 35b of the drain terminal portion 25 to the following: the second principal surface (top surface) 33b of the first portion 23a of the source terminal portion 23 and the second principal surface (top surface) 34b of the first portion 24a of the gate terminal portion 24. The height $h_0$ of the cavity 43 in the mold 41, 42 is equivalent to the distance from the under surface 41a of the die 41 to the top surface 42a of the die 42 in the cavity 43 when the dies 41, 42 are clamped together.

Figure 25:
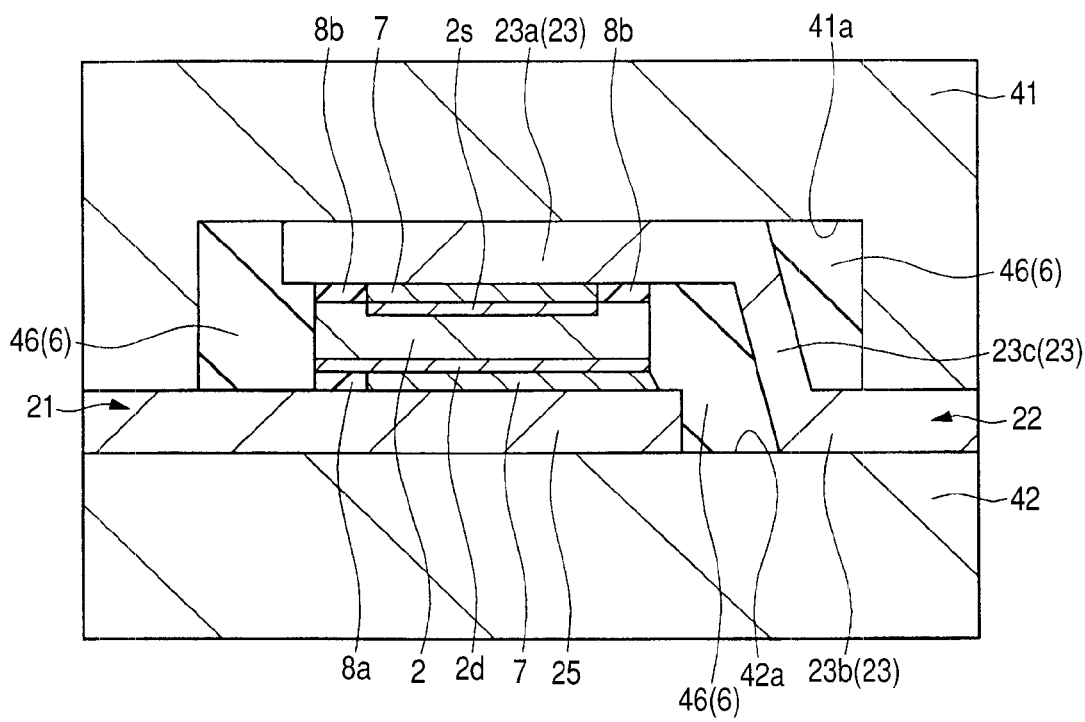
FIG. 25 is a sectional view of the semiconductor device in the manufacturing process, following FIG. 24.

The lead frames 21, 22 are clamped and fixed between the dies 41, 42 as illustrated in FIG. 24. Thereafter, encapsulation resin material 46 as the material for the formation of the encapsulation resin section 6 is injected (guided, filled) into the cavity 43 in the mold 41, 42 as illustrated in FIG. 25. The injected encapsulation resin material 46 is cured to form the encapsulation resin section 6. The encapsulation resin material 46 for the formation of the encapsulation resin section 6 is comprised of resin material, such as thermosetting resin material, or the like. The encapsulation resin material may contain filler or the like and, for example, epoxy resin containing filler and the like can be used as the encapsulation resin material. When the encapsulation resin material 46 is comprised of thermosetting resin material, the encapsulation resin material 46 is injected into the cavity 43 in the mold 41, 42 and then the dies 41, 42 are heated to a predetermined temperature. The encapsulation resin material 46 can be thereby heated and cured. When the bonding material 7 is solder, it is desirable that the temperature at which the encapsulation resin material 46 is cured should be lower than the melting point of the solder composing the bonding material 7. As a result, it is possible to prevent the solder from being melted while the encapsulation resin material 46 is being cured. Thus the encapsulation resin section 6 is formed.

As another embodiment, the following measure may be taken: the work and the mold in FIG. 24 and FIG. 25 are turned upside down and the lead frames 21, 22 and the semiconductor chip 2 are set in the dies 41, 42 so that the back surface drain electrode 2d of the semiconductor chip 2 faces upward. In this case, the die 41 is lower die and the die 42 is upper die.

Figure 26:
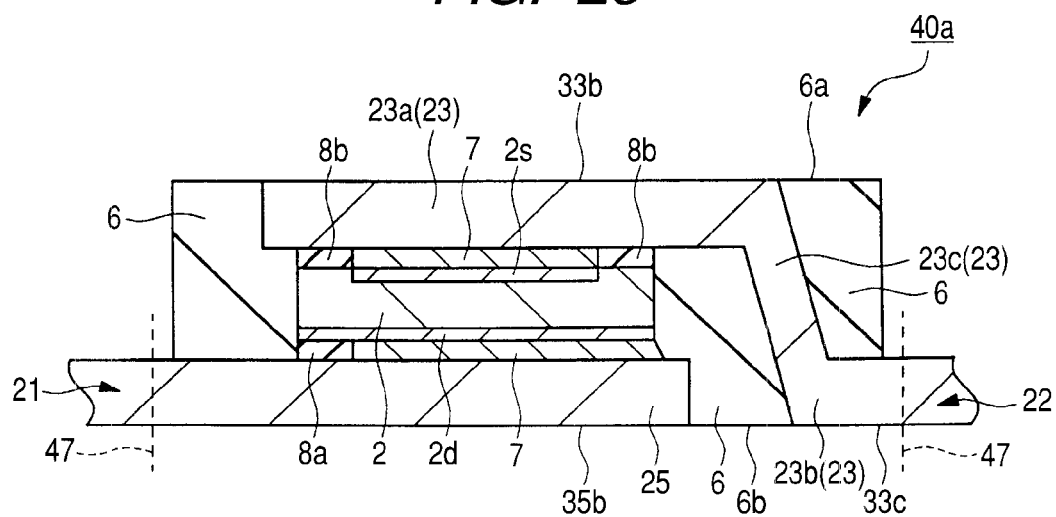
FIG. 26 is a sectional view of the semiconductor device in the manufacturing process, following FIG. 25.
Figure 27:
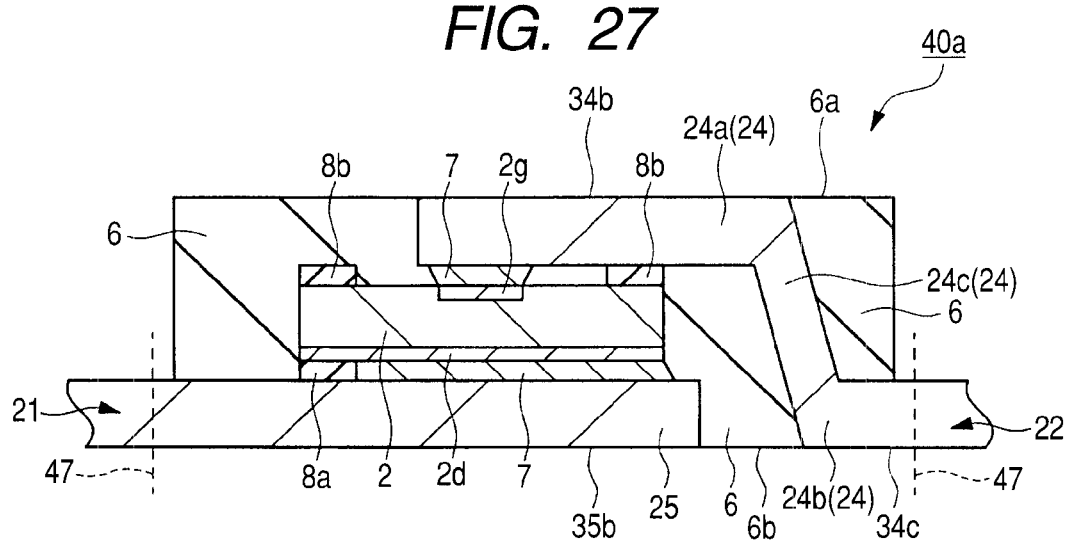
FIG. 27 is another sectional view of the same semiconductor device as in FIG. 26 in the manufacturing process.

After the encapsulation resin material 46 is cured and the encapsulation resin section 6 is formed, the assembly 40 with the encapsulation resin section 6 formed thereon (that is, an assembly 40a) is released from the dies 41, 42. The molding step, Step S9, is carried out as mentioned above. Thereafter, fins and the like are removed from the encapsulation resin section 6 as required. As a result, such an assembly (work) 40a as illustrated in FIG. 26 and FIG. 27 is obtained. The assembly 40a is the assembly 40 with the encapsulation resin section 6 formed thereon. The formed encapsulation resin section 6 has a top surface 6a and a back surface 6b which are two principal surfaces positioned on the opposite side to each other. In the assembly 40a, the encapsulation resin section 6 seals the semiconductor chip 2, source terminal portion 23, gate terminal portion 24, and drain terminal portion 25.

At the molding step, Step S9, there is substantially no gap between the following and the top surface 42a of the die 42: the second principal surface (under surface) 35b of each drain terminal portion 25 of the lead frame 21; the under surface 34c of the second portion 24b of each gate terminal portion 24 of the lead frame 22; and the under surface 33c of the second portion 23b of each source terminal portion 23 of the lead frame 22. Therefore, the encapsulation resin section 6 is hardly formed thereon. At the molding step, Step S9, further, there is substantially no gap between the following and the under surface 41a of the die 41: the second principal surface (top surface) 33b of the first portion 23a of each source terminal portion 23 of the lead frame 22; and the second principal surface (top surface) 34b of the first portion 24a of each gate terminal portion 24 of the lead frame 22. Therefore, the encapsulation resin section 6 is hardly formed thereon.

For this reason, in the assembly 40a, the following are exposed from the back surface 6b of the encapsulation resin section 6: the second principal surface (under surface) 35b of the drain terminal portion 25 of the lead frame 21; the under surface 34c of the second portion 24b of the gate terminal portion 24 of the lead frame 22; and the under surface 33c of the second portion 23b of the source terminal portion 23 of the lead frame 22. Further, the following are exposed from the top surface 6a of the encapsulation resin section 6: the second principal surface (top surface) 33b of the first portion 23a of the source terminal portion 23 of the lead frame 22; and the second principal surface (top surface) 34b of the first portion 24a of the gate terminal portion 24 of the lead frame 22. Even though a fin of the encapsulation resin section 6 is formed on the surface (33b, 33c, 34b, 34c, 35b) of each terminal portion to be exposed from the top surface 6a or the back surface 6b of the encapsulation resin section 6, they can be removed at the fin removal step subsequent to the molding step.

As mentioned above, the encapsulation resin section 6 has the conductor sections (source terminal portion 23, gate terminal portion 24, and drain terminal portion 25) exposed at the top surface 6a and the back surface 6b.

Plating is carried out as required to form a metal skin (not shown) over the portions (portions comprised of conductive material) of the lead frames 21, 22 exposed from the encapsulation resin section 6 (Step S10). For example, lead-free solder can be used to carry out solder plating or the like.

The lead frames 21, 22 are cut in predetermined positions (Step S11). For example, the lead frames 21, 22 are cut along the cutting plane lines 47 indicated by broken lines in FIG. 26 and FIG. 27 to remove the lead frames 21, 22 protruded from the encapsulation resin section 6. Thus the individually divided semiconductor device 1 illustrated in FIG. 1 to FIG. 4 is obtained (manufactured). The semiconductor device 1 is manufactured as mentioned above.

The source terminal portion 23 cut and separated from the lead frame 22 becomes the source terminal 3 of the semiconductor device 1; the gate terminal portion 24 cut and separated from the lead frame 22 becomes the gate terminal 4 of the semiconductor device 1; and the drain terminal portion 25 cut and separated from the lead frame 21 becomes the drain terminal 5 of the semiconductor device 1. The first portion 23a of the source terminal portion 23 becomes the first portion 3a of the source terminal 3; the second portion 23b of the source terminal portion 23 becomes the second portion 3b of the source terminal 3; and the stepped portion 23c of the source terminal portion 23 becomes the stepped portion 3c of the source terminal 3. The first portion 24a of the gate terminal portion 24 becomes the first portion 4a of the gate terminal 4; the second portion 24b of the gate terminal portion 24 becomes the second portion 4b of the gate terminal 4; and the stepped portion 24c of the gate terminal portion 24 becomes the stepped portion 4c of the gate terminal 4. The second principal surface (top surface) 33b of the first portion 23a of the source terminal portion 23 becomes the top surface 13b of the first portion 3a of the source terminal 3 exposed from the top surface 6a of the encapsulation resin 6; and the second principal surface (top surface) 34b of the first portion 24a of the gate terminal portion 24 becomes the top surface 14b of the first portion 4a of the gate terminal 4 exposed from the top surface 6a of the encapsulation resin 6. The second principal surface (under surface) 35b of the drain terminal portion 25 becomes the under surface 15b of the drain terminal 3 exposed from the back surface 6b of the encapsulation resin 6. The under surface 33c of the second portion 23b of the source terminal portion 23 becomes the under surface 13c of the second portion 3b of the source terminal 3 exposed from the back surface 6b of the encapsulation resin section 6; and the under surface 34c of the second portion 24b of the gate terminal portion 24 becomes the under surface 14c of the second portion 4b of the gate terminal 4 exposed from the back surface 6b of the encapsulation resin section 6.

Figure 28:
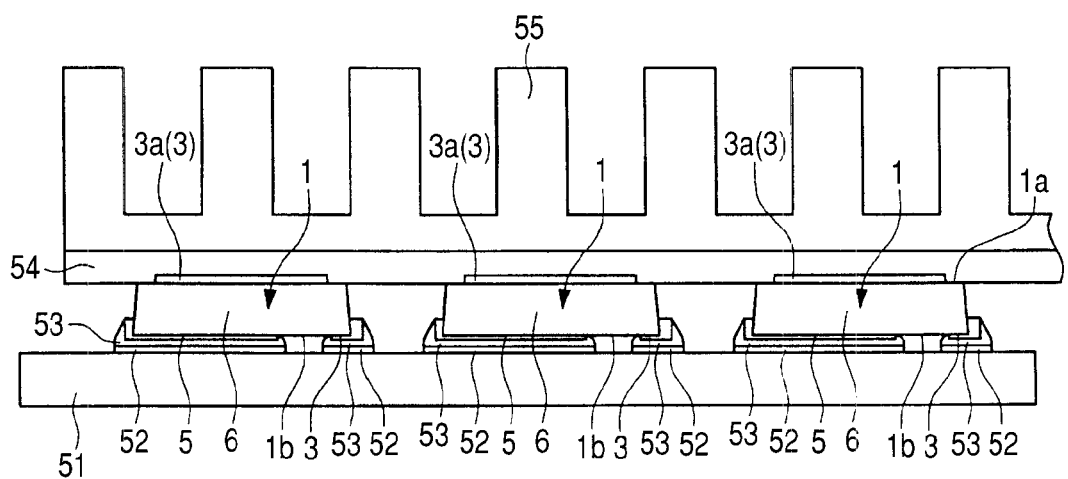
FIG. 28 is a sectional view illustrating how multiple semiconductor devices are mounted over a mounting board.

FIG. 28 is a side view (sectional view) illustrating multiple semiconductor devices 1 mounted over a mounting board 51.

As illustrated in FIG. 28, multiple semiconductor devices 1 are mounted over the mounting board (wiring board) 51. At this time, the back surface (bottom surface) 1b of each semiconductor device 1 functions as the mounting surface when it is mounted over the mounting board 51. The external coupling terminals exposed at the back surface 1b of each semiconductor device 1 are joined and electrically coupled with terminals 52 of the mounting board 51 through conductive bonding material 53, such as solder. These external coupling terminals are the source terminal 3, gate terminal 4, and drain terminal 5 (the respective under surfaces 13c, 14c, 15b thereof). The sectional view in FIG. 28 depicts that each source terminal 3 (under surface 13c of the second portion 3b thereof) and each drain terminal 5 (under surface 15b thereof) exposed at the back surface 1b of each semiconductor device 1 are joined to terminals 52 of the mounting board 51 through the bonding material 53. In another cross section, each gate terminal 4 (under surface 14c of the second portion 4b thereof) exposed at the back surface 1b of the semiconductor device 1 is joined to a terminal 52 of the mounting board 51 through the bonding material 53.

Over the top surfaces (front surfaces) 1a of the multiple semiconductor devices 1, there is disposed (mounted) a radiation fin (heat radiation part, heat sink) 55 with a heat conduction sheet (heat radiation sheet) 54 in-between. The radiation fin 55 is a heat radiating member formed of, for example, such metal material as aluminum (Al) or aluminum alloy. The heat conduction sheet 54 is an elastic insulating sheet and is relatively high in thermal conductivity. The heat conduction sheet 54 is formed of, for example, silicon, acrylic, or ethylene-propylene material and is comprised of a rubber-like or gel-like sheet or the like. The heat conduction sheet 54 may be formed of a material obtained by mixing the above materials with glass cloth as base material. The heat conduction sheet 54 can be sandwiched between the semiconductor devices 1 and the radiation fin 55 as a heat radiation part and caused to function to enhance the heat radiation effect. The radiation fin 55 is fixed over the mounting board 51 by screws, fixing brackets (not shown), or the like. Instead of the heat conduction sheet 54, heat-radiating resin adhesive or the like may be used to join and fix the radiation fin 55 with and on the top surfaces 1a of the semiconductor devices 1.

When each semiconductor device 1 is actuated to operate the semiconductor chip 2 in the semiconductor device 1, the semiconductor chip 2 in the semiconductor device 1 produces heat. The semiconductor chip 2 is coupled with the source terminal 3, gate terminal 4, and drain terminal 5. The source terminal 3, gate terminal 4, and drain terminal 5 are formed of a conductive material (such metal as copper alloy) higher in thermal conductivity than the encapsulation resin section 6. For this reason, heat produced in the semiconductor chip 2 in each semiconductor device 1 is radiated to outside the semiconductor device 1 through the source terminal 3, gate terminal 4, and drain terminal 5. At this time, heat from each semiconductor chip 2 is radiated to the mounting board 51 through the source terminal 3, gate terminal 4, and drain terminal 5. At the same time, the heat is radiated to the radiation fin 55 through the source terminal 3, gate terminal 4, and heat conduction sheet 54. The radiation fin 55 has multiple fins formed therein and heat conducted from each semiconductor device 1 to the radiation fin 55 is further radiated to the outside air.

In the semiconductor device 1 in this embodiment, the following are exposed as external coupling terminals at the back surface 1b of the semiconductor device 1: the source terminal 3 (second portion 3b thereof); the gate terminal 4 (second portion 4b thereof); and the drain terminal 5. At the same time, the following are exposed at the top surface 1a of the semiconductor device 1 (the top surface 6a of the encapsulation resin section 6): the top surface 13b of the first portion 3a of the source terminal 3; and the top surface 14b of the first portion 4a of the gate terminal 4. For this reason, heat from the semiconductor chip 2 in the semiconductor device 1 can be radiated from both the surfaces (both the sides) of the semiconductor device 1. That is, the heat can be radiated from the side of the back surface 1b and the side of the top surface 1a of the semiconductor device. (On the back surface side, there are the second portion 3b of the source terminal 3, the second portion 4b of the gate terminal 4, and the drain terminal 5.) (On the top surface side, there are the first portion 3a of the source terminal 3 and the first portion 4a of the gate terminal 4.) As a result, it is possible to enhance the heat radiation characteristic (radiation performance) of the semiconductor device of a resin sealed semiconductor package type.

However, to manufacture a resin sealed semiconductor package, such as the semiconductor device 1, with terminals exposed at the top and under surfaces, it is important to suppress variation (fluctuation) in the height $h_1$ of the assembly 40 immediately before the molding step. An example of the reasons for this is as follows:

If there is variation in the height $h_1$ of the assembly 40, the following takes place when the assembly 40 is fixed in the mold 41, 42 as illustrated in FIG. 24: pressure is applied to the semiconductor chip 2 from above and below and there is a possibility that cracking or the like occurs in the semiconductor chip 2. This results in the degraded fabrication yield of semiconductor devices. The reason for this is as follows. If the height $h_1$ of the assembly 40 is excessively larger than the height $h_0$ of the cavity 43 in the mold 41, 42 when the assembly 40 is clamped between the dies 41, 42, the following takes place: pressure from the dies 41, 42 is applied to the semiconductor chip 2 from above and below through the following: the first portion 23a of the source terminal portion 23 and the first portion 24a of the gate terminal portion 24 positioned above the semiconductor chip 2 and the drain terminal portion 25 positioned below the semiconductor chip 2. Conversely, if the height $h_1$ of the assembly 40 is excessively smaller than the height $h_0$ of the cavity 43 in the mold 41, 42, the following takes place: the portions of the source terminal portion 23, gate terminal portion 24, and drain terminal portion 25 to be exposed from the encapsulation resin 6 are covered with the encapsulation resin section 6 and are not exposed.

Variation in the height $h_1$ of the assembly 40 immediately before the molding step is caused by the following: variation in the state of the junction between the semiconductor chip 2 and the lead frames 21, 22, variation in the quantity of bonding material, or the like. A large quantity of bonding material increases the thickness of the bonding material layers between the semiconductor chip 2 and the lead frames 21, 22. As a result, the height $h_1$ of the assembly 40 is increased. Meanwhile, a small quantity of bonding material reduces the thickness of the bonding material layers between the semiconductor chip 2 and the lead frames 21, 22. As a result, the height $h_1$ of the assembly 40 is reduced. However, it is difficult to precisely control the quantity of bonding material supplied during the manufacturing process. There is a limit to the control of the quantity of supplied bonding material to reduce variation in the quantity of bonding material between the semiconductor chip 2 and the lead frames 21, 22. Even though the quantity of supplied bonding material can be precisely controlled, variation is produced in the state of the junction between the semiconductor chip 2 and the lead frames 21, 22. This variation in the state of junction varies the height $h_1$ of the assembly 40 immediately before the molding step.

The height of the finished semiconductor device (resin sealed semiconductor package) is defined by the height $h_1$ of the assembly 40 immediately before the molding step. Therefore, if there is variation in the height $h_1$ of the assembly 40 immediately before the molding step, the height of the finished semiconductor device varies. If there is variation in the height of the semiconductor device 1, a problem can arise in the following cases: cases where multiple semiconductor devices 1 are mounted over a mounting board 51 and a radiation fin 55 is mounted over the semiconductor devices 1 with a heat conduction sheet 54 in-between as illustrated in FIG. 28. Variation is produced in the state of coupling between the radiation fin 55 and the semiconductor devices 1 through the heat conduction sheet 54. As a result, there is a possibility that the state of heat radiation varies from semiconductor device 1 to semiconductor device 1.

In this embodiment, not only the bonding material 7 (7a, 7b) but also the film members 8a, 8b are placed between the semiconductor chip 2 and the lead frames 21, 22. Variation (fluctuation) in the height $h_1$ of the assembly 40 immediately before the molding step is thereby suppressed.

More specific description will be given. In this embodiment, the following processing is carried out at Steps S2 to S4: the semiconductor chip 2 is placed (mounted) over the first principal surface 35a of each drain terminal portion 25 of the lead frame 21 with the film member 8a and the bonding material 7a in-between. Further, at Steps S5 to S7, the following are placed (mounted) over the front surface 2a of the semiconductor chip 2 with the film member 8a and the bonding material 7b in-between: the first portion 23a of a source terminal portion 23 and the first portion 24a of a gate terminal portion 24 of the lead frame 22.

For this reason, the following is implemented immediately before the curing step, Step S8, for the bonding materials 7a, 7b: not only the bonding material 7a but also the film member 8a exists between the back surface 2b of the semiconductor chip 2 and the first principal surface 35a of each drain terminal portion 25 of the lead frame 21. In addition, not only the bonding material 7b but also the film member 8b exist between the following surfaces: the front surface 2a of the semiconductor chip 2; and the first principal surface 33a of the first portion 23a of each source terminal portion 23 and the first principal surface 34a of the first portion 24a of each gate terminal portion 24 of the lead frame 22.

If there is not provided the film members 8a, 8b, unlike this embodiment, the following is caused by variation in the quantity of the bonding materials 7a, 7b supplied or the like as described above: after the bonding materials 7a, 7b are cured at Step S8, there is variation in the height $h_1$ of the assembly 40.

In this embodiment, meanwhile, the film member 8a exists between the semiconductor chip 2 and each drain terminal portion 25 of the lead frame 21. For this reason, the film member 8a defines the distance (length) $D_1$ between the first principal surface (top surface) 35a of each drain terminal portion 25 of the lead frame 21 and the back surface 2b of the semiconductor chip 2. This distance $D_1$ substantially agrees with the thickness $T_1$ of the film member 8a (that is, $D_1=T_1$) and is hardly influenced by the quantity of the supplied bonding material 7a. Further, the film member 8b exists between the semiconductor chip 2 and each source terminal portion 23 and gate terminal portion 24 of the lead frame 22. For this reason, the film member 8b defines the distance (length) $D_2$ between the front surface 2a of the semiconductor chip 2 and the following: the first principal surface (under surface) 33a of the first portion 23a of each source terminal portion 23 and the first principal surface (under surface) 34a of the first portion 24a of each gate terminal portion 24 of the lead frame 22. This distance $D_2$ substantially agrees with the thickness $T_2$ of the film member 8b (that is, $D_2=T_2$) and is hardly influenced by the quantity of the supplied bonding material 7a.

The film members 8a, 8b are film-like members and thus the thicknesses $T_1$, $T_2$ thereof are easy to control. The film members 8a, 8b having desired thicknesses $T_1$, $T_2$ can be obtained by, for example, cutting a film 8 having a desired thickness into a predetermined shape (shape of the film members 8a, 8b) as illustrated in FIG. 14. For this reason, it is possible to prevent variation in the thicknesses $T_1$, $T_2$ of the film members 8a, 8b.

The film member 8a exists between the semiconductor chip 2 and each the drain terminal portion 25 of the lead frame 21. The film member 8a functions to keep the distance $D_1$ between the back surface 2b of the semiconductor chip 2 and each drain terminal portion 25 of the lead frame 21 substantially constant until the bonding materials 7a, 7b are cured at Step S8. The film member 8b exists between the semiconductor chip 2 and each source terminal portion 23 and gate terminal portion 24 of the lead frame 22. The film member 8b functions to keep the following distance substantially constant until the bonding materials 7a, 7b are cured at Step S8: the distance $D_2$ between the front surface 2a of the semiconductor chip 2 and the first portion 23a of each source terminal portion 23 and the first portion 24a of each gate terminal portion 24 of the lead frame 22.

The bonding material 7 obtained by curing the bonding material 7a is so formed that the following is implemented: the bonding material 7 is in contact with the back surface drain electrode 2d of the semiconductor chip 2 and a drain terminal portion 25 of the lead frame 21 and joins them together. The film thickness thereof is defined by the film thickness of the film member 8a, not by the quantity of the supplied bonding material 7a. Similarly, the bonding material 7 obtained by curing the bonding material 7b is so formed that it is in contact with the following: the source pad electrode 2s and gate pad electrode 2g of the semiconductor chip 2 and the first portion 23a of each source terminal portion 23 and the first portion 24a of each gate terminal portion 24 of the lead frame 22. Thus the bonding material 7 joins them together. The film thickness thereof is defined by the film thickness of the film member 8b, not by the quantity of the supplied bonding material 7b. Fluctuation in the quantities of the supplied bonding materials 7a, 7b can be absorbed by variation in the planar size (area) of the bonding material 7. For this reason, the film thickness of the bonding material 7 can be controlled to a predetermined value by adjusting the film thickness of each of the film members 8a, 8b. Therefore, use of the film members 8a, 8b having predetermined film thicknesses makes it possible to suppress variation (fluctuation) in the film thickness of the bonding material 7. Thus it is possible to suppress variation (fluctuation) in the height $h_1$ of the assembly 40 immediately before the molding step.

Therefore, it is required that the film members 8a, 8b should be less prone to be deformed under load (load in the direction of thickness) as compared with the bonding materials 7a, 7b. That is, it is required that the film members 8a, 8b should be low in the ratio of deformation (ratio of deformation in the direction of thickness) under load (load in the direction of thickness) as compared with the bonding materials 7a, 7b. This means the following: when the bonding materials 7a, 7b and the film members 8a, 8b are placed on a plane and the same load is applied to them, the film members 8a, 8b are less prone to be deformed than the bonding materials 7a, 7b. (That is, the film members 8a, 8b are less prone to be deformed in the direction of thickness perpendicular to the above plane.) Since the film members 8a, 8b are film-like members, they are less prone to be deformed under load (lower in ratio of deformation) as compared with the paste-like bonding materials 7a, 7b. For this reason, the above distances $D_1$, $D_2$ can be kept substantially constant by placing not only the bonding materials 7a, 7b but also the film members 8a, 8b between the semiconductor chip 2 and the terminals.

It is more desirable that the film members 8a, 8b should have elasticity. This brings about the effect that thermal stress in the semiconductor device is absorbed and cracking in the semiconductor chip 2 and fatigue breakdown of the bonding material 7 can be more appropriately prevented. Therefore, it is desirable that a material higher in elasticity than the bonding materials 7a, 7b should be used for the film members 8a, 8b.

Further, it is desirable that the following material should be used for the film members 8a, 8b: a material that does not deform in the direction of thickness during the heat treatment or reflow processing at the curing step, Step S8, for the bonding materials 7a, 7b; the thicknesses $T_1$, $T_2$ thereof can be maintained as much as possible; and the above distances $D_1$, $D_2$ can be kept at predetermined values as much as possible.

For this reason, examples of materials desirable for the film members 8a, 8b include: a material obtained by mixing spacer particles in a base film (base material layer) comprised of resin material (polyimide, epoxy resin, or the like). That is, the film members 8a, 8b are formed of a resin film (base film) with spacer particles mixed therein. For the material of the spacer particles, a material that is hardly deformed by heating during the curing step, Step S8, is desirable and it is desirable that the shape of the material should be spherical. Metal particles are more desirable as the spacer particles; however, any other particles obtained by curing thermosetting resin particles beforehand or the like can be used as the spacer particles.

When a resin film with spacer particles mixed therein is used for the film members 8a, 8b, it is desirable that the diameter of the spacer particles in the film member 8a should be substantially the same as the thickness $T_1$ of the film member 8a. Similarly, it is desirable that the diameter of the spacer particles in the film member 8b should be substantially the same as the thickness $T_2$ of the film member 8b. When a resin film with spacer particles mixed therein is used for the film members 8a, 8b, the spacer particles are hardly deformed even if the resin film is shrunken by heating at the curing step, Step S8. Therefore, the above distances $D_1$, $D_2$ can be appropriately kept at predetermined values.

Even though a resin film does not contain a spacer particle, it can be used for the film members 8a, 8b as long as it is less prone to be deformed (shrunken) in the direction of thickness at the following step: the curing step (heat treatment or reflowing), Step S8, for the bonding materials 7a, 7b.

Both a conductive film member and an insulating film member can be used as the film members 8a, 8b. When a conductive film member is used as the film member 8a, not only the bonding material 7 but also the film member 8a can contribute to the electrical coupling between the electrodes of the semiconductor chip 2 and the terminals. Therefore, coupling resistance can be reduced more.

The electrodes of the semiconductor chip 2 could be joined with the source terminal 3, gate terminal 4, and drain terminal 5 only by a conductive film member without use of the bonding material 7 (7a, 7b) unlike this embodiment. In this case, however, a problem arises. The resistance between the electrodes of the semiconductor chip 2 and the source terminal 3, gate terminal 4, and drain terminal 5 is increased as compared with cases where a bonding material 7 high in electrical conductivity, comprised of silver paste, solder, or the like. As a result, the performance of the semiconductor device is degraded. Especially, when a semiconductor chip with a vertical power MISFET of trench gate structure formed therein is used as the semiconductor chip 2, the passed current is large. Therefore, it is required to reduce the resistance between the electrodes of the semiconductor chip 2 and the source terminal 3, gate terminal 4, and drain terminal 5 as much as possible.

In this embodiment, meanwhile, the bonding material 7 (7a, 7b) is used to join together the electrodes of the semiconductor chip 2 and the source terminal 3, gate terminal 4, and drain terminal 5. A material higher in electrical conductivity (lower in electric resistivity) than the film members 8a, 8b can be used as the bonding material 7 (7a, 7b). Therefore, it is possible to reduce the resistance between the electrodes of the semiconductor chip 2 and the source terminal 3, gate terminal 4, and drain terminal 5 and thus enhance the performance of the semiconductor device 1.

In this embodiment, therefore, it is desirable that the bonding material 7 should be higher in electrical conductivity (that is, lower in electric resistivity) than the film members 8a, 8b. In other words, it is desirable that the bonding material 7 should be lower in resistance per unit area than the film members 8a, 8b. (The unit area is a unit area on a plane parallel with the front surface 2a or the back surface 2b of the semiconductor chip 2.) As a result, it is possible to reduce the resistance between the electrodes of the semiconductor chip 2 and the source terminal 3, gate terminal 4, and drain terminal 5 and enhance the performance of the semiconductor device 1.

With respect to the film member 8a placed between the semiconductor chip 2 and the drain terminal 5 (drain terminal portion 25), it is desirable that the following measure should be taken as seen from FIG. 12: the film member 8a is placed in the peripheral portion of the back surface 2b of the semiconductor chip 2, not in the central portion of the back surface 2b of the semiconductor chip 2 as viewed on a plane. (This plane is a plane parallel with the back surface 2b of the semiconductor chip 2.) As a result, it is possible to hold mainly the bonding material 7, high in electrical conductivity and adhesion, responsible for the following: the junction between the back surface drain electrode 2d of the semiconductor chip 2 and the drain terminal 5 (drain terminal portion 25).

The bonding material 7a and at least one film member 8a are placed between the semiconductor chip 2 and the drain terminal 5 (drain terminal portion 25). As seen from FIG. 12, it is more desirable that multiple film members 8a should be placed on the back surface 2b (preferably, the peripheral portion of the back surface 2b) of the semiconductor chip 2. In the example in FIG. 12, two film members 8a are placed. At this time, it is more desirable that the following measure should be taken as illustrated in FIG. 12: the film members 8a are placed in positions in the direction of a diagonal line of or positions along the two opposite sides of the back surface 2b of the semiconductor chip 2. This makes it possible to enhance the parallelism between the top surface 15a (first principal surface 35a) of the drain terminal 5 (drain terminal portion 25) and the back surface 2b of the semiconductor chip 2.

The two film members 8a in FIG. 12 could be coupled together to form one film member in a planar ring shape. In this case, however, an escape route for the bonding material 7a is eliminated if a too large quantity of the bonding material 7a is supplied. Therefore, it is required to relatively accurately adjust the quantity of the supplied bonding material 7a.

When the film member 8a is divided into multiple pieces and these pieces are placed in the peripheral portion of the back surface 2b of the semiconductor chip 2 as illustrated in FIG. 12, the following advantage is brought: even though a too large quantity of the bonding material 7a is supplied, the bonding material 7a can escape to the peripheral side when the semiconductor chip 2 is mounted at Step S4; and thus the above distance $D_1$ can be made identical with the thickness $T_1$ of the film member 8a. For this reason, it is possible to ensure a margin of the quantity of the supplied bonding material 7a.

With respect to the film member 8b placed between the semiconductor chip 2 and the source terminal 3 (source terminal portion 23) and gate terminal 4 (gate terminal portion 24), it is desirable that the following measure should be taken as seen from FIG. 17: the film member 8b is placed (mounted) in a position on the front surface 2a of the semiconductor chip 2 where it does not overlap the gate pad electrode 2g or the source pad electrode 2s. As a result, it is possible to appropriately place the bonding material 7b on the gate pad electrode 2g and the source pad electrode 2s at Step S6.

The bonding material 7b and at least one film member 8b are placed between the semiconductor chip 2 and the source terminal 3 (source terminal portion 23) and gate terminal 4 (gate terminal portion 24). As seen from FIG. 17, it is more desirable that the multiple film members 8b should be placed on the front surface 2a (preferably, the peripheral portion of the front surface 2a) of the semiconductor chip 2. In the example in FIG. 17, two film members 8b are placed. At this time, it is more desirable that the following measure should be taken as illustrated in FIG. 17: the film members 8b are placed in positions in the direction of a diagonal line of or positions along the two opposite sides of the front surface 2a of the semiconductor chip 2. This makes it possible to enhance the parallelism between the front surface 2a of the semiconductor chip 2 and the following: the under surface 13a (first principal surface 33a) of the source terminal 3 (source terminal portion 23) and the under surface 14a (first principal surface 34a) of the gate terminal 4 (gate terminal portion 24).

In this embodiment, as mentioned above, not only the bonding material 7 (7a, 7b) but also the film members 8a, 8b are placed between the semiconductor chip 2 and the terminals. It is thereby made possible to suppress variation (fluctuation) in the height $h_1$ of the assembly 40 immediately before the molding step. As a result, it is possible to prevent a crack or the like from being produced in the semiconductor chip at the molding step and thus enhance the fabrication yield of semiconductor devices. In addition, it is possible to equalize the heights of the finished semiconductor devices 1. Since the heights of the finished semiconductor devices 1 can be equalized, the following can be implemented when a member for heat radiation (for example, the above-mentioned radiation fin 55) is mounted over multiple semiconductor devices 1: the state of coupling between each semiconductor device 1 and the member for heat radiation becomes even and thus the state of heat radiation in each semiconductor device 1 can be made even. Therefore, it is possible to make the heat radiation characteristic of each semiconductor device uniform and enhance the performance thereof.

In this embodiment, the semiconductor device 1 of a resin sealed semiconductor package type with the terminals exposed at the top and under surfaces is manufactured so that the following is implemented: the semiconductor chip 2 is sandwiched from above and below by the multiple terminals (source terminal 3, gate terminal 4, and drain terminal 5). A semiconductor chip having an electrode at only either of the front surface 2a and the back surface 2b could be used as the semiconductor chip 2. (Such a semiconductor chip has an electrode at the front surface 2a and does not have an electrode at the back surface 2a.) For the above reason, however, the great effect can be obtained when this embodiment is applied to a case where a semiconductor chip having an electrode at both the front surface 2a and the back surface 2b is used as the semiconductor chip 2. (Such a semiconductor chip has a front surface electrode and a back surface electrode.) This is the same with the second to seventh embodiments described below.

Semiconductor chips with various semiconductor elements formed therein can be used as the semiconductor chip 2 in this embodiment. The semiconductor chip need not be the above-mentioned semiconductor chip with a vertical power MISFET (Metal Insulator Semiconductor Field Effect Transistor) of trench gate structure formed therein and any other type of semiconductor chip can be used. However, the great effect can be obtained when this embodiment is applied to the following case: a case where a semiconductor chip producing a large amount of heat, for example, a semiconductor chip with such a power transistor as a power MISFET formed therein is used as the semiconductor chip 2. (An example of the semiconductor chip producing a large amount of heat is a semiconductor chip with a semiconductor amplifying element for power amplification formed therein.) This is because the semiconductor device 1 in this embodiment has the radiation performance thereof enhanced by exposing terminals at the top and under surfaces. The above-mentioned semiconductor chip with a vertical power MISFET of trench gate structure formed therein produces a relatively large amount of heat when it operates. Therefore, the greater effect can be obtained when this embodiment is applied to a case where a semiconductor chip with a vertical power MISFET of trench gate structure formed therein is used as the semiconductor chip 2. This is the same with the second to seventh embodiments described below.

Second Embodiment

In the first embodiment, variation in the height $h_1$ of the assembly 40 immediately before the molding step is suppressed by taking the following measure: not only the bonding materials 7a, 7b (7) but also the film members 8a, 8b are placed between the semiconductor chip 2 and the terminals. In the second embodiment, variation in the height $h_1$ of the assembly immediately before the molding step is suppressed without use of the film member 8a or 8b. This is done by giving a twist to the type of the bonding materials 7a, 7b and the curing step for the bonding materials 7a, 7b.

Figure 29:
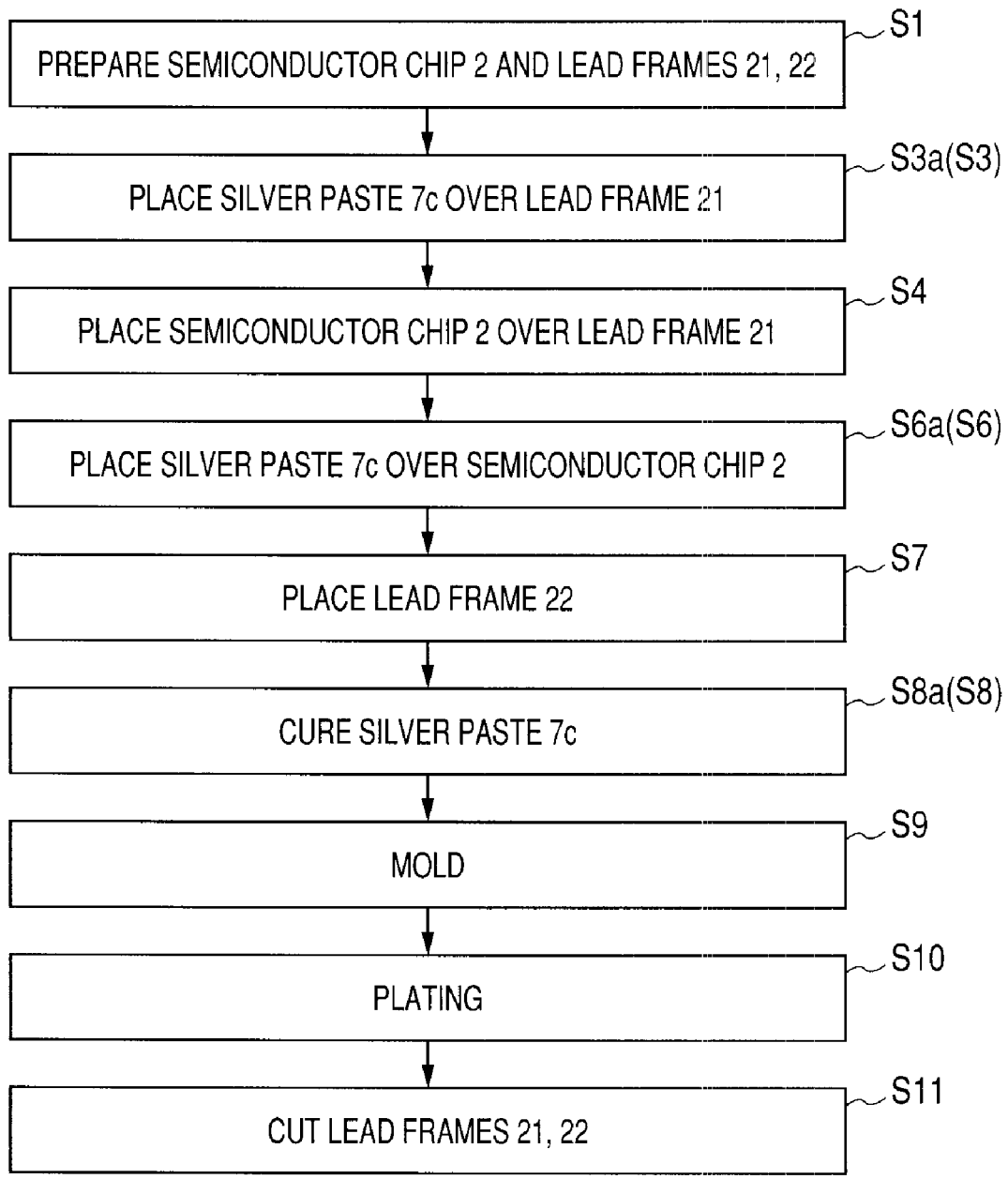
FIG. 29 is a process flowchart illustrating a manufacturing process for a semiconductor device in a second embodiment of the invention.
Figure 30:
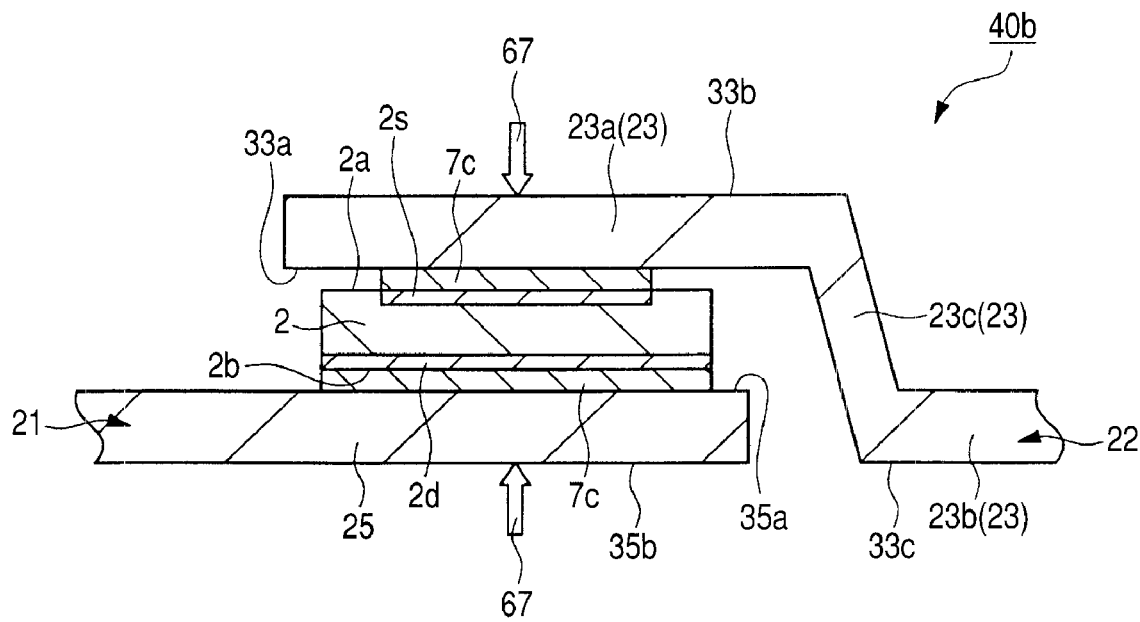
FIG. 30 is a sectional view of a semiconductor device in the second embodiment of the invention in the manufacturing process.
Figure 31:
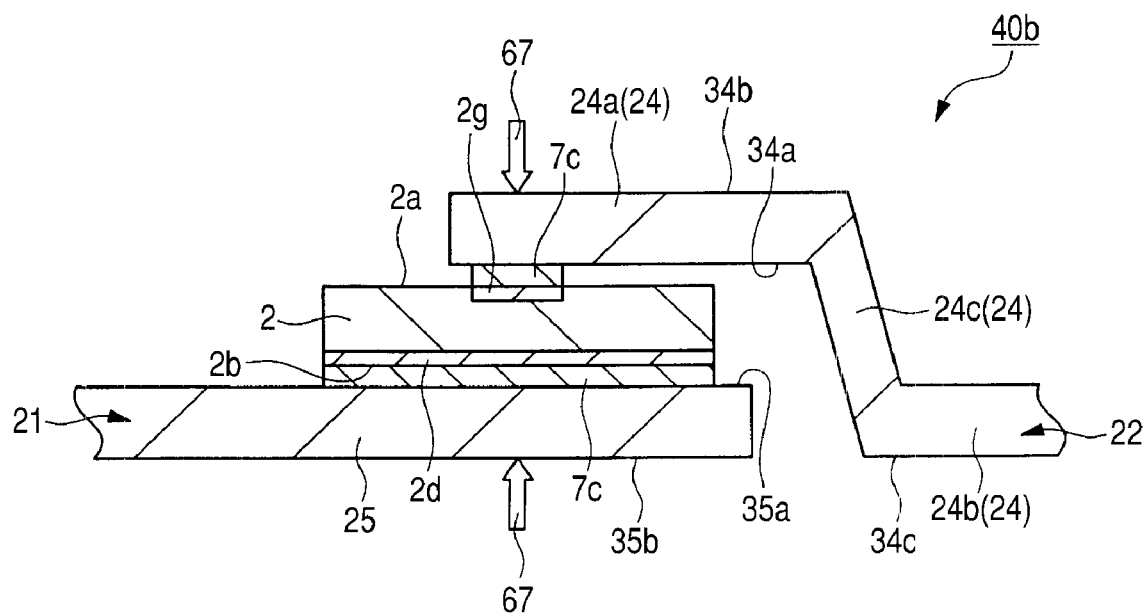
FIG. 31 is another sectional view of the same semiconductor device as in FIG. 30 in the manufacturing process.
Figure 32:
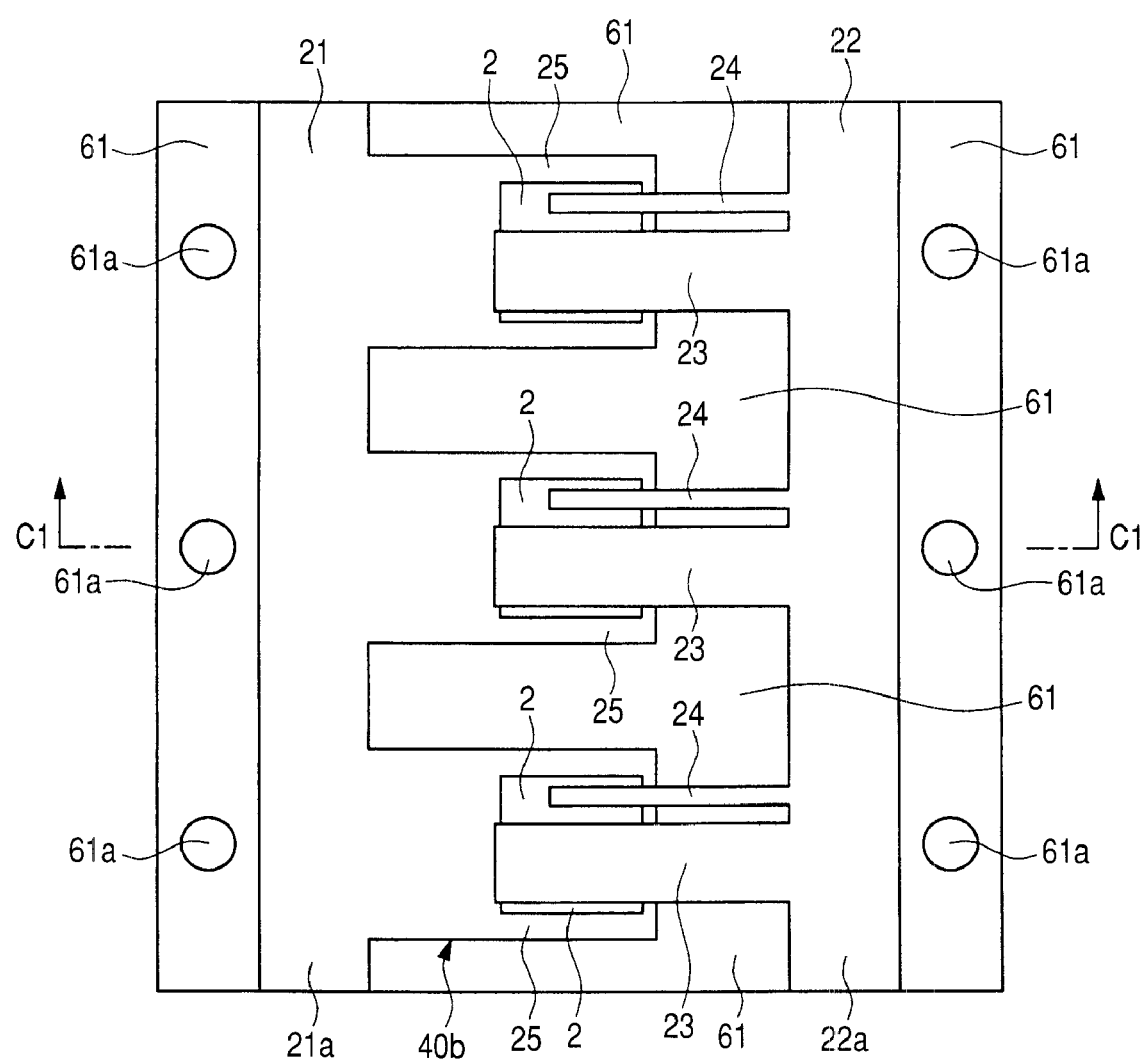
FIG. 32 is an explanatory drawing of a curing step for silver paste.
Figure 33:
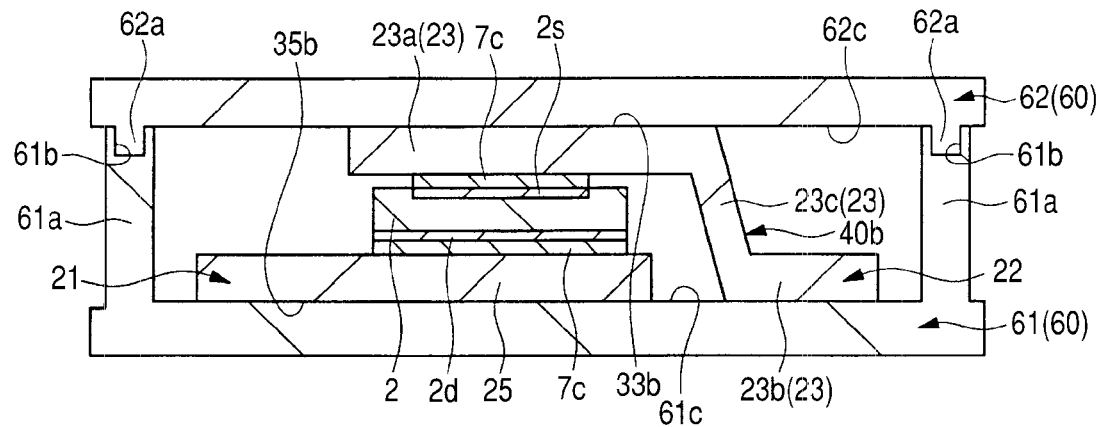
FIG. 33 is an explanatory drawing of the curing step for silver paste.
Figure 34:
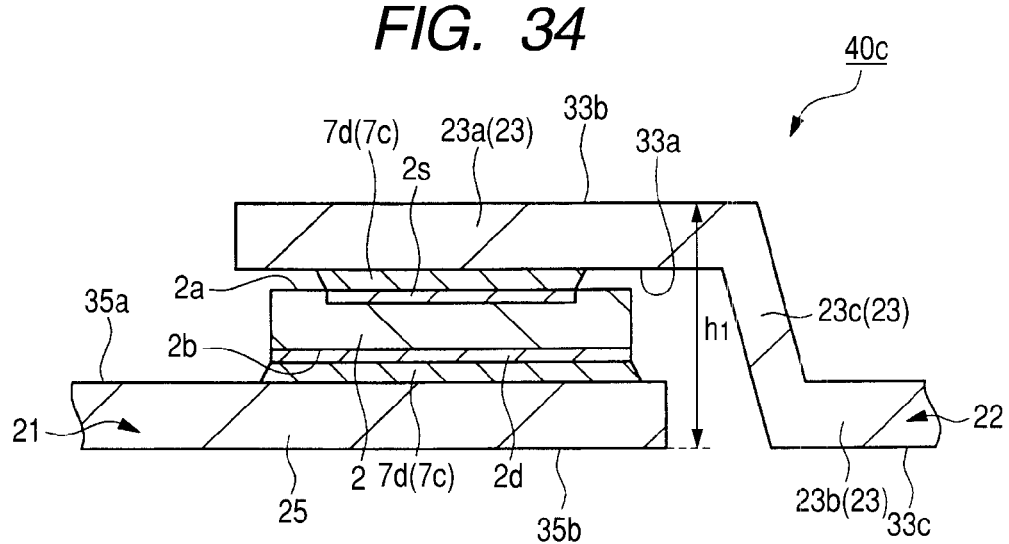
FIG. 34 is a sectional view of the semiconductor device in the manufacturing process, following FIG. 30.
Figure 35:
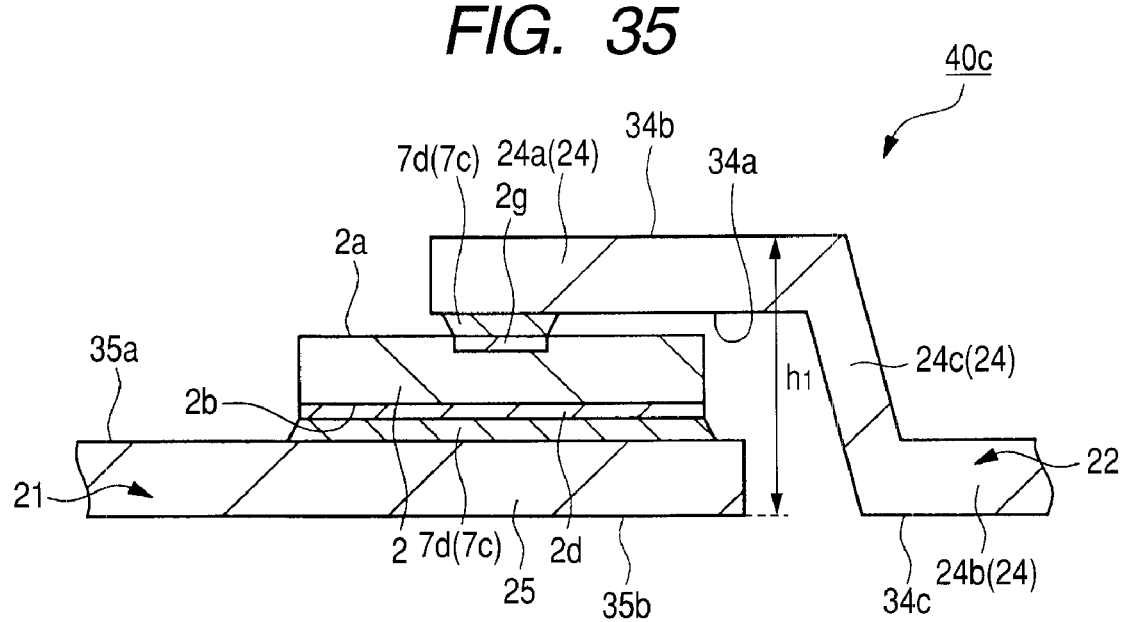
FIG. 35 is another sectional view of the same semiconductor device as in FIG. 34 in the manufacturing process.
Figure 36:
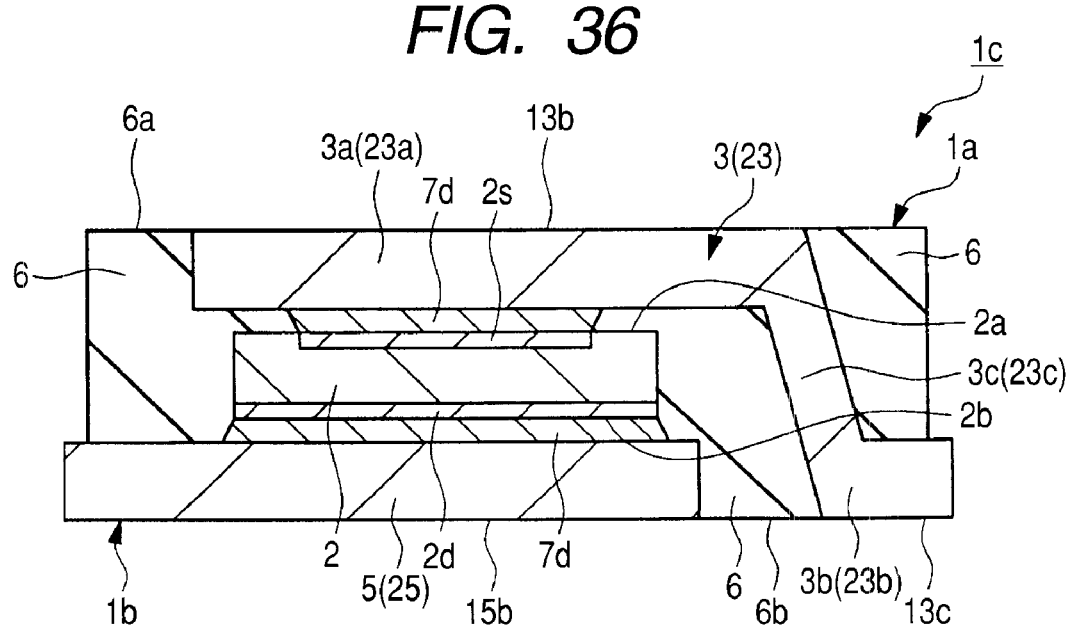
FIG. 36 is a sectional view of a semiconductor device in the second embodiment of the invention.
Figure 37:
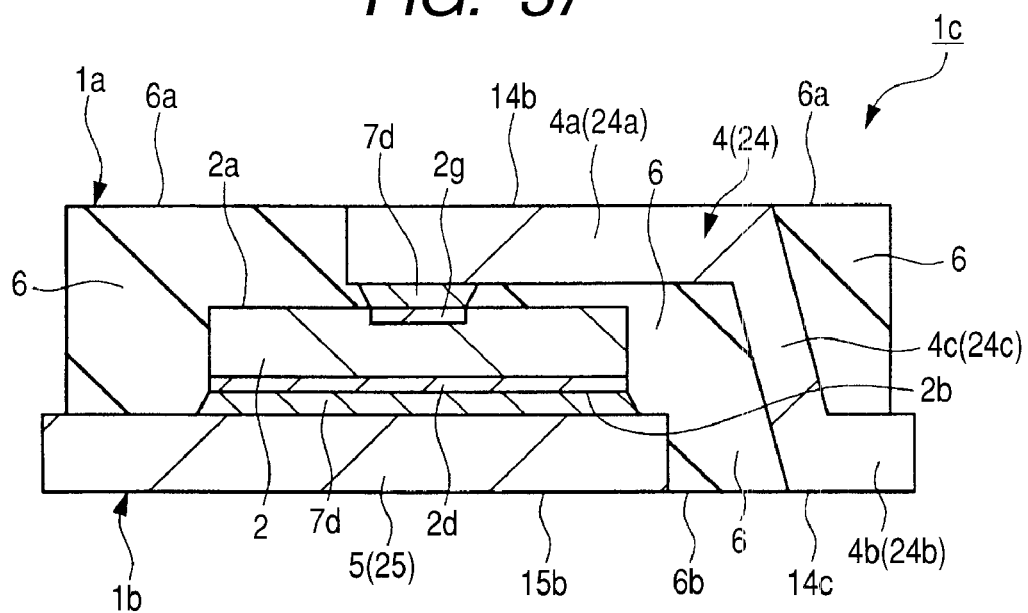
FIG. 37 is another sectional view of a semiconductor device in the second embodiment of the invention.

FIG. 29 is a process flowchart illustrating the manufacturing process for the semiconductor device 1c in this embodiment. FIG. 30, FIG. 31, and FIG. 34 to FIG. 37 are substantial part sectional views illustrating the manufacturing process for the semiconductor device 1c in this embodiment. Of these drawings, FIG. 30 and FIG. 31 are different sectional views illustrating an identical process step; FIG. 34 and FIG. 35 are different sectional views illustrating an identical process step; and FIG. 36 and FIG. 37 are different sectional views illustrating an identical process step. FIG. 30 corresponds to a cross section in the same position at the same process step as in FIG. 20 in relation to the first embodiment; FIG. 31 substantially corresponds to a cross section in the same position at the same process step as in FIG. 21 in relation to the first embodiment; FIG. 34 substantially corresponds to a cross section in the same position at the same process step as in FIG. 22 in relation to the first embodiment; and FIG. 35 substantially corresponds to a cross section in the same position at the same process step as in FIG. 23 in relation to the first embodiment. FIG. 36 is a sectional view corresponding to FIG. 3 in relation to the first embodiment and FIG. 37 is a sectional view corresponding to FIG. 4 in relation to the first embodiment. FIG. 32 and FIG. 33 are explanatory drawings of the curing step for silver paste 7c. Of these drawings, FIG. 32 is a plan view and FIG. 33 is a sectional view. FIG. 33 illustrates a cross section corresponding to that in FIG. 30.

In this embodiment, the steps up to Step S7 (lead frame 22 placement step) are carried out as in the first embodiment, except that: neither Step S2 nor S5 (film member 8a, 8b placement step) is carried out; and silver paste 7c is used as the bonding materials 7a, 7b at Steps S3 and S6 (bonding material 7a, 7b placement steps). (That is, Steps S3a and S6a are carried out in place of Steps S3 and S6.) As a result, the structure illustrated in FIG. 30 and FIG. 31 equivalent to FIG. 20 and FIG. 21 in relation to the first embodiment is obtained.

More specific description will be given. At Step S1, the semiconductor chip 2 and the lead frames 21, 22 are prepared as in the first embodiment. The structure and the manufacturing method of the semiconductor chip 2 and the lead frames 21, 22 are the same as in the first embodiment. Unlike the first embodiment, Step S2 (film member 8a placement step) is not carried out. As what corresponding to the bonding material 7a, silver (Ag) paste 7c (first silver paste) is placed (applied to) over the first principal surface 35a of each drain terminal portion 25 of the lead frame 21 (Step S3a). Step S3a (silver paste 7c placement step) is substantially the same as Step S3 (bonding material 7a placement step) mentioned above except that the silver paste 7c is used as the bonding material 7a. Therefore, the silver paste 7c is placed or applied in an area in the first principal surface 35a of each drain terminal portion 25 of the lead frame 21 where the semiconductor chip 2 is to be mounted. The silver paste 7c contains spacer particles (spacer particles 66 described later), which will be described in detail later.

At Step S4, the semiconductor chip 2 is placed (mounted) over each drain terminal portion 25 of the lead frame 21 as in the first embodiment. The method for placing the semiconductor chip 2 over each drain terminal portion 25 of the lead frame 21 is the same as in the first embodiment. Thus the semiconductor chip 2 is placed (mounted) over the first principal surface 35a of each drain terminal portion 25 of the lead frame 21 with the silver paste 7c in-between and is temporarily fixed by the adhesion (adherence) of the silver paste 7c. In this embodiment, Step S2 (film member 8a placement step) is omitted. Therefore, only the silver paste 7c exists between the back surface 2b (back surface drain electrode 2d) of the semiconductor chip 2 and the first principal surface (top surface) 35a of each drain terminal portion 25 of the lead frame 21.

Unlike the first embodiment, Step S5 (film member 8b placement step) is not carried out. As what corresponding to the bonding material 7b, silver (Ag) paste 7c (second silver paste) is placed (applied to) over the gate pad electrode 2g and source pad electrode 2s in the front surface 2a of the semiconductor chip 2 (Step 6a). Step S6a (silver paste 7c placement step) is substantially the same as Step S6 (bonding material 7a placement step) mentioned above except that the silver paste 7c is used as the bonding material 7b.

At Step S7, the lead frame 22 is placed over the front surface 2a of each semiconductor chip 2 as in the first embodiment. The method for placing the lead frame 22 over the front surface 2a of each semiconductor chip 2 is the same as in the first embodiment. Thus the first portion 23a of each source terminal portion 23 of the lead frame 22 is placed over the source pad electrode 2s of each semiconductor chip 2 with the silver paste 7c in-between. At the same time, the first portion 24a of each gate terminal portion 24 of the lead frame 22 is placed over the gate pad electrode 2g of each semiconductor chip 2 with the silver paste 7c in-between. They are temporarily fixed by the adhesion (adherence) of the silver paste 7c.

Thus the structure (temporary assembly 40b) illustrated in FIG. 30 and FIG. 31 is obtained. The temporary assembly 40b is comprised of the lead frames 21, 22 and the semiconductor chip 2 sandwiched therebetween through the silver paste 7c; however, the silver paste 7c has not been cured yet.

In this embodiment, Steps S2 and S5 (film member 8a, 8b placement step) are omitted. Therefore, only the silver paste 7c exists between the following surfaces in the temporary assembly 40b: the back surface 2b (back surface drain electrode 2d) of the semiconductor chip 2 and the first principal surface (top surface) 35a of each drain terminal portion 25 of the lead frame 21. In the temporary assembly 40b, only the silver paste 7c exists between the front surface 2a of the semiconductor chip 2 and the following: the first principal surface 33a of the first portion 23a of each source terminal portion 23 and the first principal surface 34a of the first portion 24a of each gate terminal portion 24 of the lead frame 22.

The silver paste 7c is cured (Step S8a). Step S8a (silver paste 7c curing step) corresponds to Step S8 (bonding material 7a, 7b curing step) mentioned above. At Step S8a, the silver paste 7c is cured by heat treatment (heating).

This embodiment is characterized in that the curing processing for (heat treatment for curing) the silver paste 7c is carried out while the following operation is performed at the curing step, Step S8a, for the silver paste 7c: pressure (load) is applied to each drain terminal portion 25 of the lead frame 21 and each source terminal portion 23 and gate terminal portion 24 of the lead frame 22 with the semiconductor chip 2 sandwiched therebetween. In FIG. 30 and FIG. 31, this pressure (load) is schematically indicated by an arrow 67 and the direction of the arrow 67 is equivalent to the direction of the application of pressure (load).

FIG. 32 and FIG. 33 are explanatory drawings illustrating an example of the curing step for the silver paste 7c. FIG. 32 illustrates the way the temporary assembly 40b is set over the base portion 61 of a retaining jig 60 (with the lid portion 62 removed) in the form of plan view. FIG. 33 illustrates the way, after the temporary assembly 40b is set over the base portion 61 of the retaining jig 60, the lid portion 62 of the retaining jig 60 is attached to the base portion 61 in the form of sectional view. The position in which the section in the FIG. 33 is taken corresponds to line C1-C1 of FIG. 32.

To carry out the curing step for the silver paste 7c, first, the temporary assembly 40b is set over the base portion 61 of the retaining jig 60 as illustrated in FIG. 32 and FIG. 33. Then the lid portion 62 of the retaining jig 60 is attached to the base portion 61. The base portion 61 is provided with multiple prop-like height fixing pins 61a. The lid portion 62 is fixed on the base portion 61 by fitting the protrusions (projected portions) 62a of the lid portion 62 in the holes 61b provided in the tops of the height fixing pins 61a. Thus when the temporary assembly 40b is set on the retaining jig 60, the temporary assembly 40b can be held from above and below by the lid portion 62 and base portion 61 of the retaining jig 60.

The second principal surface (under surface) 35b of each drain terminal portion 25 of the lead frame 21 is brought into contact with the top surface 61c of the base portion 61 of the retaining jig 60; and the following are brought into contact with the under surface 62c of the lid portion 62 of the retaining jig 60: the second principal surface (top surface) 33b of the first portion 23a of each source terminal portion 23 and the second principal surface (top surface) 34b of the first portion 24a of each gate terminal portion 24 of the lead frame 22. As the result of being clamped and held between the base portion 61 and the lid portion 62, pressure (load) is applied to the area between the following surfaces: the second principal surface (top surface) 33b of the first portion 23a of each source terminal portion 23 and the second principal surface (top surface) 34b of the first portion 24a of each gate terminal portion 24 of the lead frame 22; and the second principal surface (under surface) 35b of each drain terminal portion 25 of the lead frame 21. Adjustment of the height of the height fixing pins 61a makes it possible to prevent excessive pressure (load) from being applied to the temporary assembly 40b.

The temporary assembly 40b set on the retaining jig 60 is heated (subjected to heat treatment) to cure the silver paste 7c in the temporary assembly 40b. As a result, the silver paste 7c is turned into a bonding material 7d comprised of cured silver paste. The bonding material 7d corresponds to the bonding material 7 in the first embodiment; however, the bonding material 7d (equivalent to the bonding material 7) in this embodiment is obtained by curing the silver paste 7c. The retaining jig 60 is fabricated from a material that endures this heat treatment. This makes it possible to place the temporary assembly 40b, held from above and below by the retaining jig 60, in a heating furnace together with the retaining jig 60 and heat it (carry out heating for curing the silver paste 7c).

Thus the curing step, Step S8a, for the silver paste 7c can be carried out. As a result, the following portions and electrodes are joined and electrically coupled together through the bonding material 7d (cured silver paste 7c) as illustrated in FIG. 34 and FIG. 35: each source terminal portion 23, gate terminal portion 24, and drain terminal portion 25 of the lead frames 21, 22; and the source pad electrode 2s, gate pad electrode 2g, and back surface drain electrode 2d of each semiconductor chip 2. That is, each source terminal portion 23(the first principal surface 33a thereof) of the lead frame 22 and the source pad electrode 2s of each semiconductor chip 2 are joined and electrically coupled together through the bonding material 7d. Each gate terminal portion 24 (first principal surface 34a thereof) of the lead frame 22 and the gate pad electrode 2g of each semiconductor chip 2 are joined and electrically coupled together through the bonding material 7d. The back surface drain electrode 2d of each semiconductor chip 2 and each drain terminal portion 25 (first principal surface 35a thereof) of the lead frame 21 are joined and electrically coupled together through the bonding material 7d. As a result, an assembly (work) 40c comprised of the lead frames 21, 22 and the semiconductor chips 2 joined therebetween through the bonding material 7d is obtained.

The assembly 40c is obtained by curing the silver paste 7c in the temporary assembly 40b and corresponds to the assembly 40 in the first embodiment. Unlike the assembly 40, however, there is not the film member 8a or 8b between the semiconductor chip 2 and the terminal portions. Instead, each terminal portion of the lead frames 21, 22 and each electrode of the semiconductor chip 2 are joined and electrically coupled together through the bonding material 7d (cured silver paste 7c).

The subsequent steps are the same as in the first embodiment. That is, the encapsulation resin section 6 is formed at Step S9, plating is carried out at Step S10, and the lead frames 21, 22 are cut at Step S11 as in the first embodiment. These steps are the same as in the first embodiment and the description thereof will be omitted here.

Thus the semiconductor device 1c in this embodiment is manufactured as illustrated in FIG. 36 and FIG. 37. The top view and bottom view of the semiconductor device 1c are the same as FIG. 1 and FIG. 2 in relation to the first embodiment and these drawings will be omitted here.

The semiconductor device 1c illustrated in FIG. 36 and FIG. 37 is different from the semiconductor device 1 in the first embodiment in that: the film member 8a or 8b is not used and the following are joined and electrically coupled through the conductive bonding material 7d (cured silver paste 7c): the source terminal 3 is joined and electrically coupled with the source pad electrode 2s in the front surface 2a of the semiconductor chip 2; the gate terminal 4 is joined and electrically coupled with the gate pad electrode 2g in the front surface 2a of the semiconductor chip 2; and the drain terminal 5 is joined and electrically coupled with the back surface drain electrode 2d in the back surface 2b of the semiconductor chip 2. The other configurations of the semiconductor device 1c are the same as those of the semiconductor device 1 in the first embodiment and the description thereof will be omitted here.

More detailed description will be given to the silver paste used in this embodiment.

Figure 38:
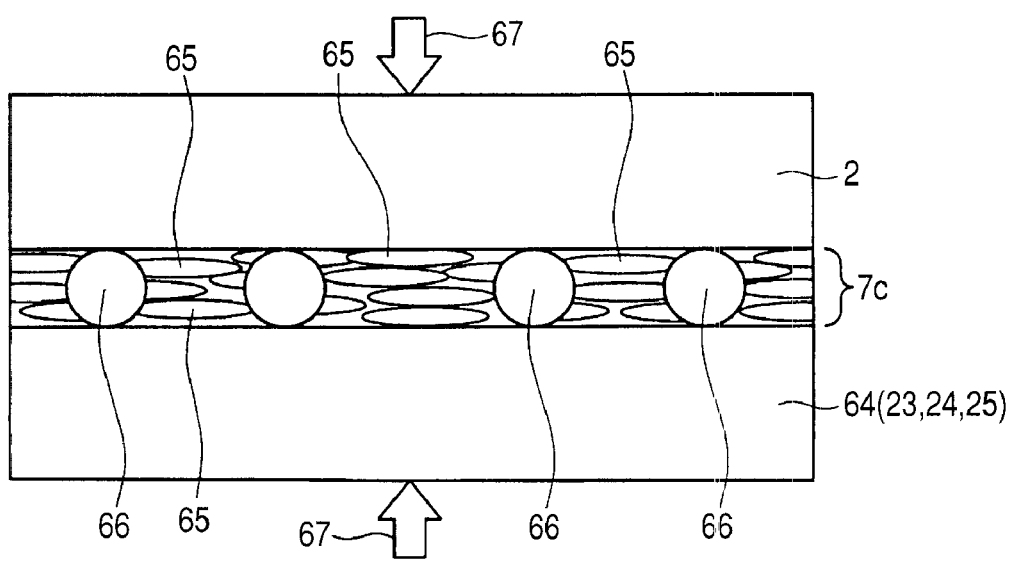
FIG. 38 is an explanatory drawing of silver paste.

FIG. 38 is an explanatory drawing of the silver paste 7c. FIG. 38 schematically depicts the way the silver paste 7c exists between a semiconductor chip 2 and a terminal portion 64 in the temporary assembly 40b. FIG. 38 is a sectional view but hatching is omitted for making the drawing understandable.

The terminal portion 64 in FIG. 38 corresponds to a drain terminal portion 25 of the lead frame 21, a source terminal portion 23 of the lead frame 22, or a gate terminal portion 24 of the lead frame 22. When the terminal portion 64 is the drain terminal portion 25, the back surface 2b (back surface drain electrode 2d) of the semiconductor chip 2 is opposed to the terminal portion 64 with the silver paste 7c in-between. When the terminal portion 64 is the source terminal portion 23, the front surface 2a (source pad electrode 2s) of the semiconductor chip 2 is opposed to the terminal portion 64 with the silver paste 7c in-between. When the terminal portion 64 is the gate terminal portion 24, the front surface 2a (gate pad electrode 2g) of the semiconductor chip 2 is opposed to the terminal portion 64 with the silver paste 7c in-between.

In general, the silver paste is comprised of conductive resin obtained by mixing Ag filler into thermosetting epoxy resin. Meanwhile, the silver (Ag) paste 7c used in this embodiment is obtained by blending spacer particles 66 into ordinary silver paste obtained by mixing Ag (silver) filler 65 into thermosetting resin (for example, thermosetting epoxy resin) as base resin. It is desirable that the spacer particles 66 should be hardly deformed when the silver paste 7c is cured at Step S8a and the shape thereof should be spherical. Particles of thermosetting resin cured beforehand are more desirable as the spacer particles 66; however, any other particles, such as metal particles, can be used for the spacer particles 66. It is desirable that the coefficient of elasticity of the spacer particles 66 should be not more than 4 Gpa.

The particle size (diameter) of the spacer particles 66 is equivalent to the thickness of the bonding material 7d (cured silver paste 7c). Therefore, the particle size of the spacer particles 66 is preferably 8 μm to 20 μm or so. This is because: if the particle size of the spacer particles 66 is too small, the thickness of the bonding material 7d is reduced and the bonding strength is lowered; and if the particle size of the spacer particles 66 is too large, the thickness of the bonding material 7d is increased and there is a possibility that voids are produced.

The silver paste 7c blended with the spacer particles 66 can be prepared as described below, for example. Solvent is added to Ag filler 65 and thermosetting resin (for example, thermosetting epoxy resin) used in ordinary silver paste to adjust the viscosity thereof and then these materials are kneaded in a roll. The kneaded mixture is deaerated in vacuum to remove air bubbles therein. Then the spacer particles 66 having a particle size of, for example, 10 μm or so is blended and the mixture is further kneaded. When the spacer particles 66 are kneaded, kneading by a roll is avoided to prevent collapse and destruction thereof and, for example, a mixer is used. As a result, the silver paste 7c blended with the spacer particles 66 having a particle size of, for example, 10 μm or so is obtained.

Unlike the silver paste in this embodiment, ordinary silver pastes are not blended with spacer particles 66 and obtained by filling Ag filler in liquid resin containing resin as base resin and solvent. When such ordinary silver paste is cured, the liquid resin is shrunken and the solvent is volatilized at the same time. Therefore, the film thickness of the Ag paste is reduced as compared with that before curing. However, it is difficult to control the film thickness of the silver paste before curing and it is also difficult to control how much the thickness of the silver paste is reduced at the curing step. Therefore, it is difficult to control the film thickness of the cured silver paste to a predetermined thickness. In the first embodiment, consequently, the film thickness of the bonding material 7 is controlled to a predetermined thickness using the film members 8a, 8b. (The reason for this is that the thickness of the bonding material 7 becomes substantially equal to the thickness of the film members 8a, 8b.)

In this embodiment, meanwhile, the silver paste 7c blended with the spacer particles 66 is used as mentioned above. Even though the base resin of the silver paste 7c is shrunken when liquid resin containing resin as the base resin and solvent is cured at the curing step, Step S8a, the following is implemented: the spacer particles 66 are not deformed (shrunken) and thus the film thickness of the silver paste 7c is not reduced to a value equal to or smaller than the particle size of the spacer particles 66.

In this embodiment, further, the following measure is taken when the silver paste 7c is cured at Step S8a: pressure (load) is applied to each drain terminal portion 25 of the lead frame 21 and each source terminal portion 23 and gate terminal portion 24 of the lead frame 22 with the semiconductor chip 2 sandwiched therebetween. In FIG. 38, this pressure (load) is schematically indicated by an arrow 67 and the direction of the arrow 67 is equivalent to the direction of the application of pressure (load). At Step S8a (curing step for the silver paste 7c), the silver paste 7c is cured while the following operation is performed: each drain terminal portion 25 of the lead frame 21 and each source terminal portion 23 and gate terminal portion 24 of the lead frame 22 with the semiconductor chip 2 sandwiched therebetween are held by the retaining jig 60. (That is, the silver paste 7c is cured while pressure is applied to these terminal portions.)

That is, in this embodiment, the silver paste 7c is cured by carrying out heat treatment while the following operation is performed: pressure (load) is applied to the area between each drain terminal portion 25 of the lead frame 21 and the semiconductor chip 2 opposed to each other with the silver paste 7c in-between; and at the same time, pressure (load) is applied to the area between each source terminal portion 23 and gate terminal portion 24 of the lead frame 22 and the semiconductor chip 2 opposed to each other with the silver paste 7c in-between. The silver paste 7c is going to be thinned under the applied pressure (load) but the spacer particles 66 blended in the silver paste 7c is hardly deformed under this pressure (load). Therefore, the film thickness of the silver paste 7c becomes equal to the particle size (diameter) of the spacer particles 66. In this state of things, (the base resin in) the silver paste 7c is cure by heating. For this reason, the film thickness of the bonding material 7d comprised of the cured silver paste 7c becomes substantially equal to the particle size (diameter) of the spacer particles 66. Therefore, the film thickness of the bonding material 7d can be controlled to a predetermined value by matching the particle size of the spacer particles 66 blended in the silver paste 7c with a desired thickness of the bonding material 7d. For this reason, use of the silver paste 7c blended with the spacer particles 66 having a predetermined particle size makes it possible to suppress variation (fluctuation) in the film thickness of the bonding material 7d. Thus it is possible to suppress variation (fluctuation) in the height $h_1$ of the assembly 40c immediately before the molding step.

In this embodiment, as mentioned above, variation (fluctuation) in the height $h_1$ of the assembly 40c immediately before the molding step can be suppressed by taking the following measure: the silver paste 7c containing the spacer particles 66 is used and the silver paste 7c is cured while pressure (load) is applied thereto. As a result, it is possible to prevent a crack or the like from being produced in the semiconductor chip at the molding step and enhance the fabrication yield of semiconductor devices. In addition, it is possible to equalize the heights of the finished semiconductor devices 1c. Since the heights of the finished semiconductor devices 1c can be equalized, the following can be implemented when a member for heat radiation (for example, the above-mentioned radiation fin 55) is mounted over multiple semiconductor devices 1c: the state of coupling between each semiconductor device 1c and the member for heat radiation becomes even and thus the state of heat radiation in each semiconductor device 1c can be made even. Therefore, it is possible to make the heat radiation characteristic of each semiconductor device uniform and enhance the performance thereof.

Third Embodiment

In the first embodiment, variation in the height $h_1$ of the assembly 40 immediately before the molding step is suppressed by taking the following measure: not only the bonding materials 7a, 7b but also the film members 8a, 8b are placed between the semiconductor chip 2 and the terminals. In the second embodiment, variation in the height $h_1$ of the assembly 40c immediately before the molding step is suppressed by taking the following measure: the silver paste 7c containing the spacer particles 66 is used and the silver paste 7c is cured while pressure (load) is applied thereto. In the third embodiment, meanwhile, a semiconductor device favorable in fabrication yield and excellent in heat radiation characteristic even though there is variation in the height of an assembly immediately before the molding step is provided.

Figure 39:
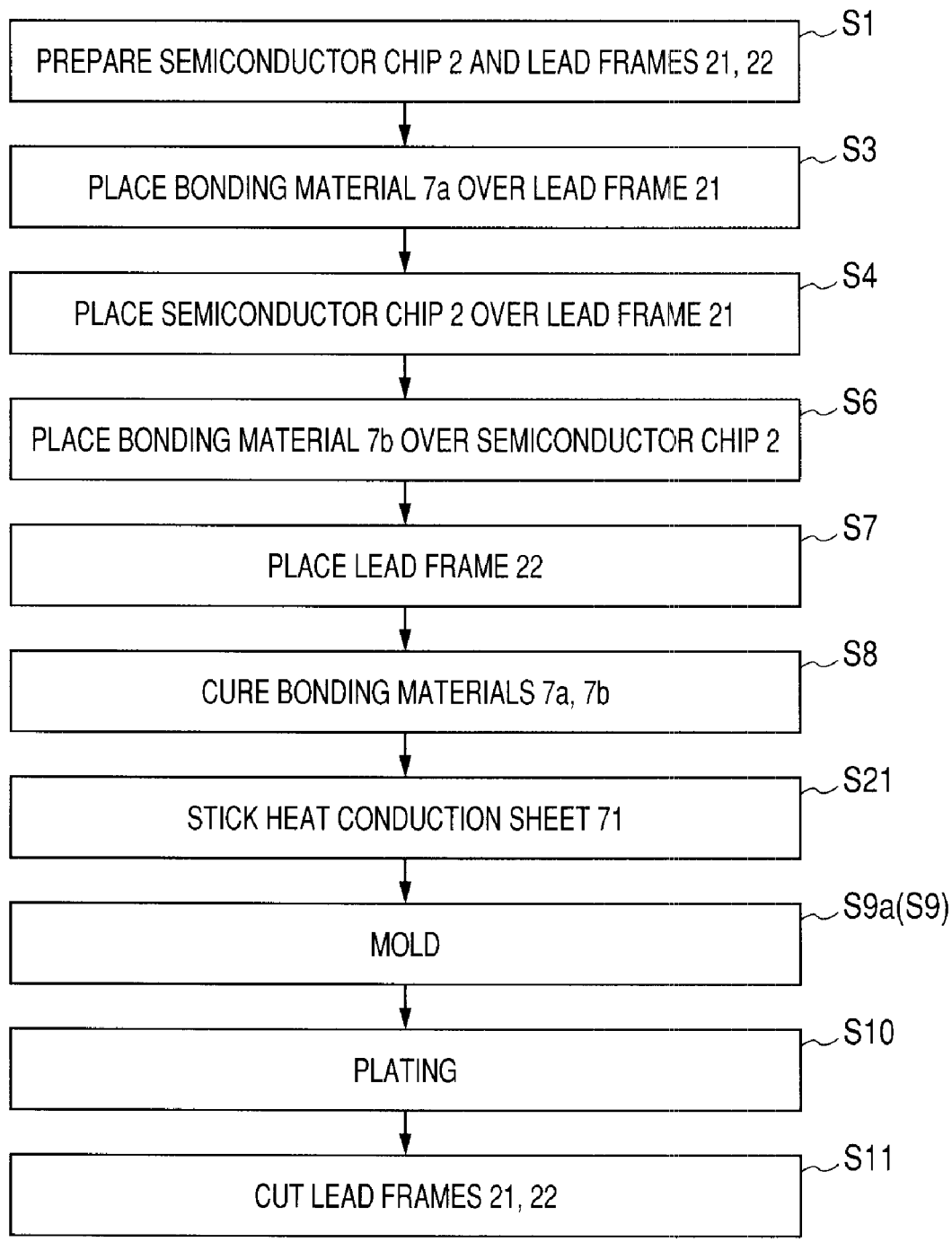
FIG. 39 is a process flowchart illustrating a manufacturing process for a semiconductor device in a third embodiment of the invention.
Figure 40:
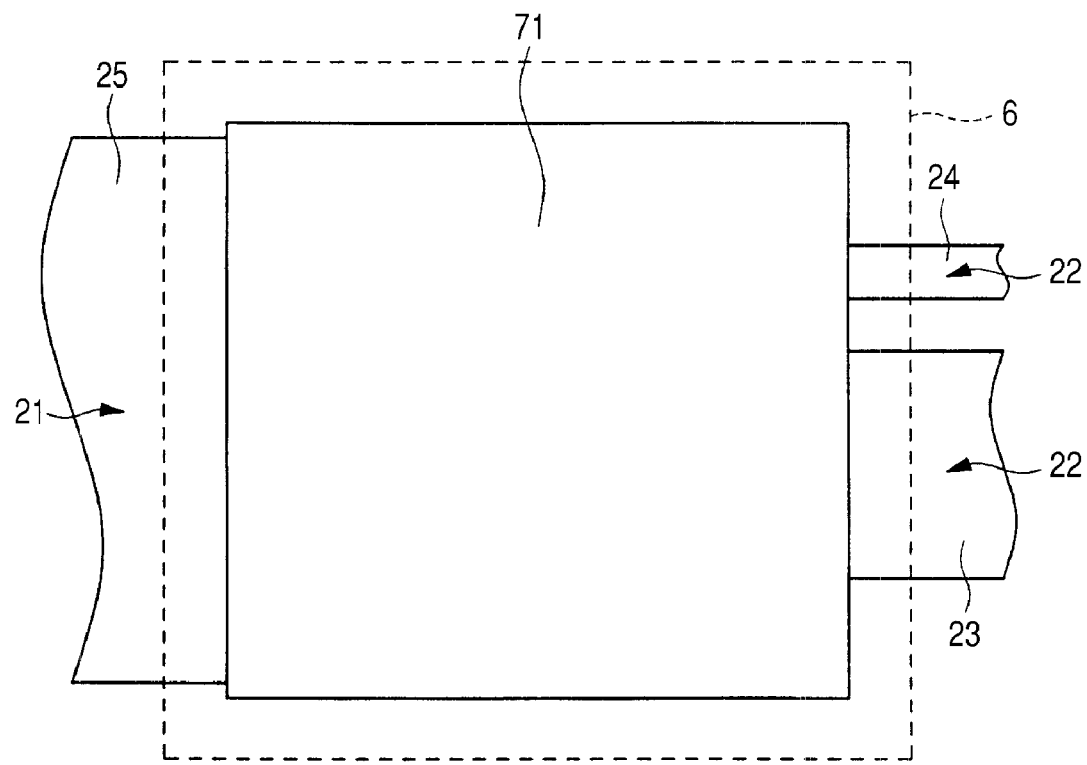
FIG. 40 is a plan view of a semiconductor device in the third embodiment of the invention in the manufacturing process.
Figure 41:
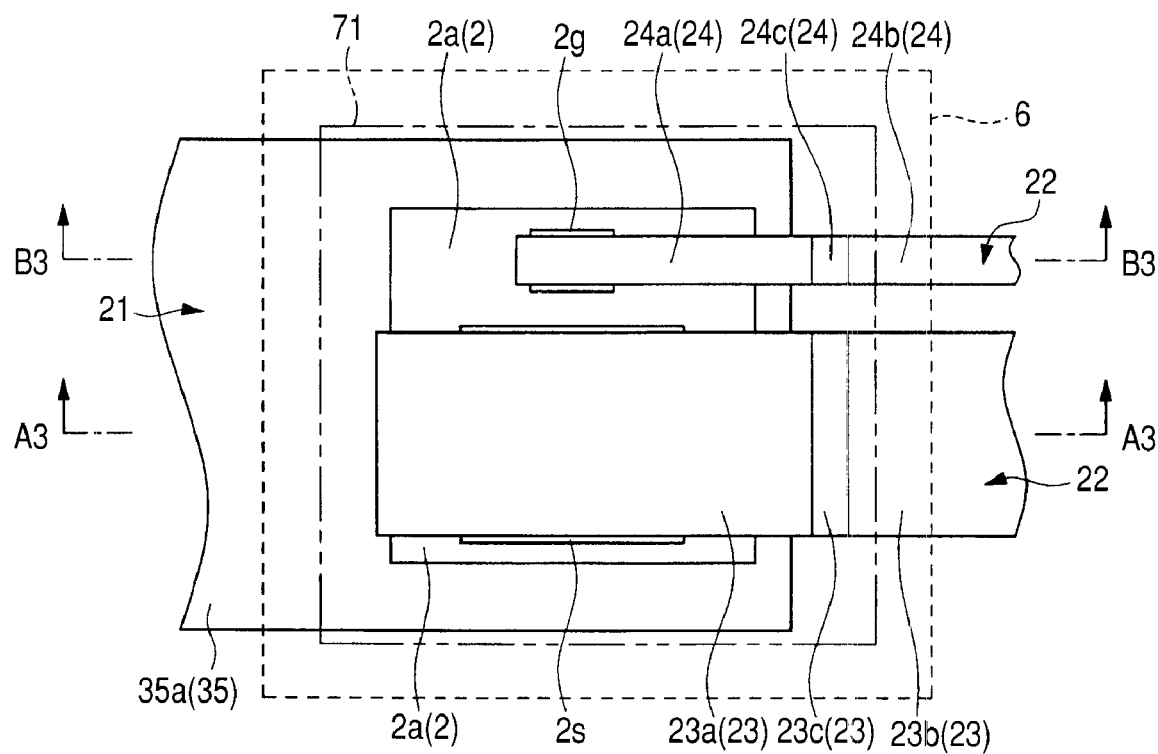
FIG. 41 is a top perspective view of the same semiconductor device as in FIG. 40 in the manufacturing process.
Figure 42:
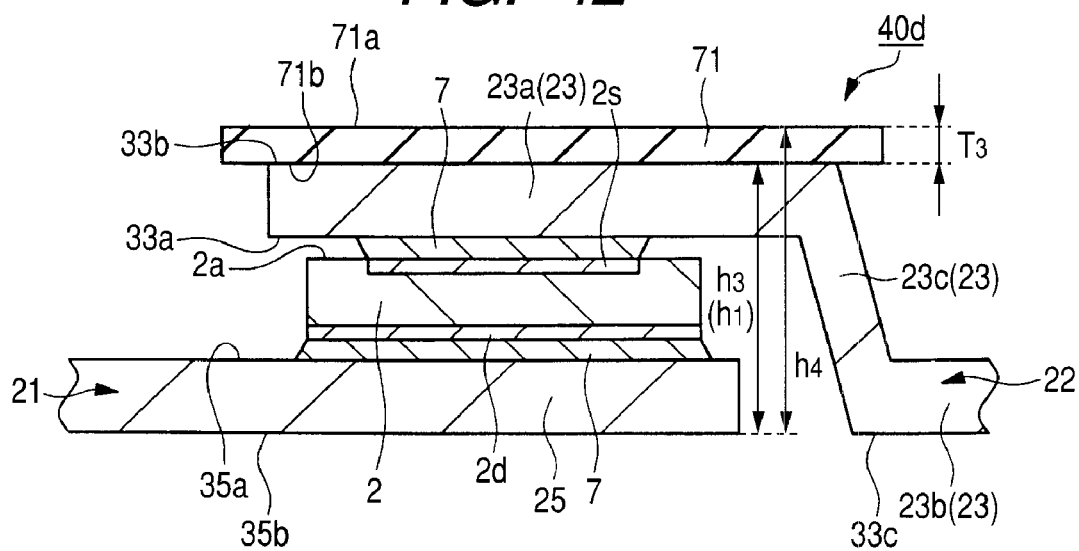
FIG. 42 is a sectional view of the same semiconductor device as in FIG. 40 in the manufacturing process.
Figure 43:
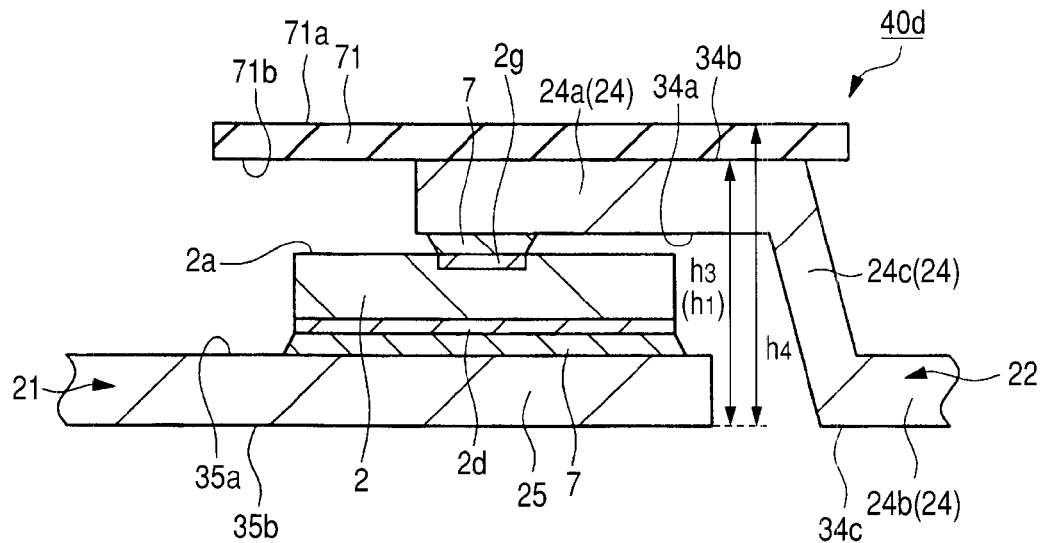
FIG. 43 is another sectional view of the same semiconductor device as in FIG. 40 in the manufacturing process.
Figure 44:
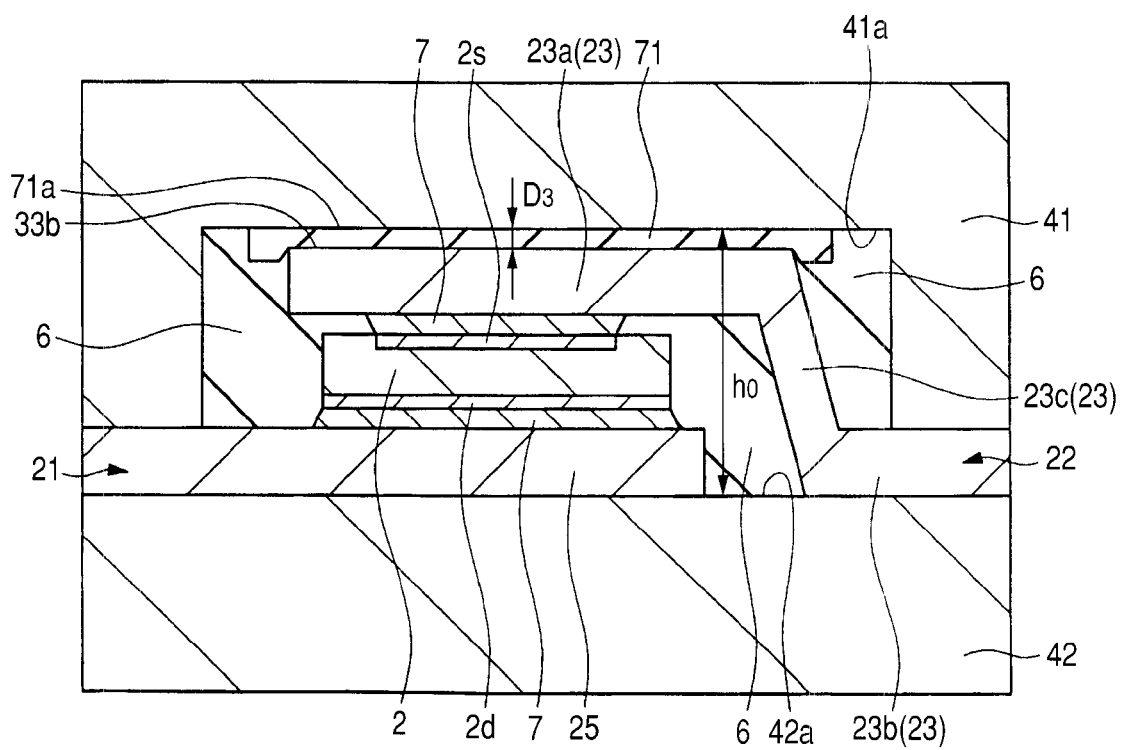
FIG. 44 is a sectional view of the semiconductor device in the manufacturing process, following FIG. 42.
Figure 45:
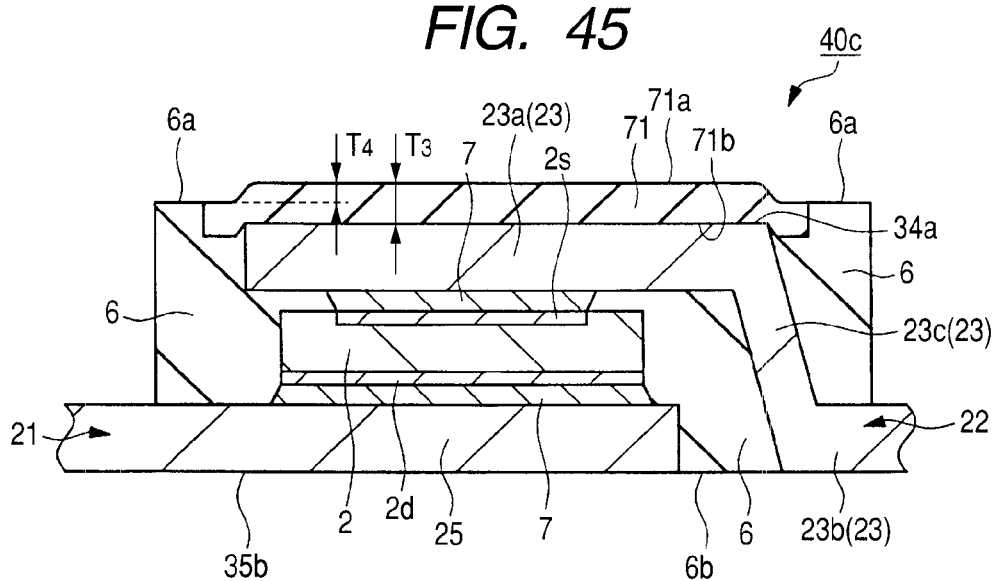
FIG. 45 is a sectional view of the semiconductor device in the manufacturing process, following FIG. 44.
Figure 46:
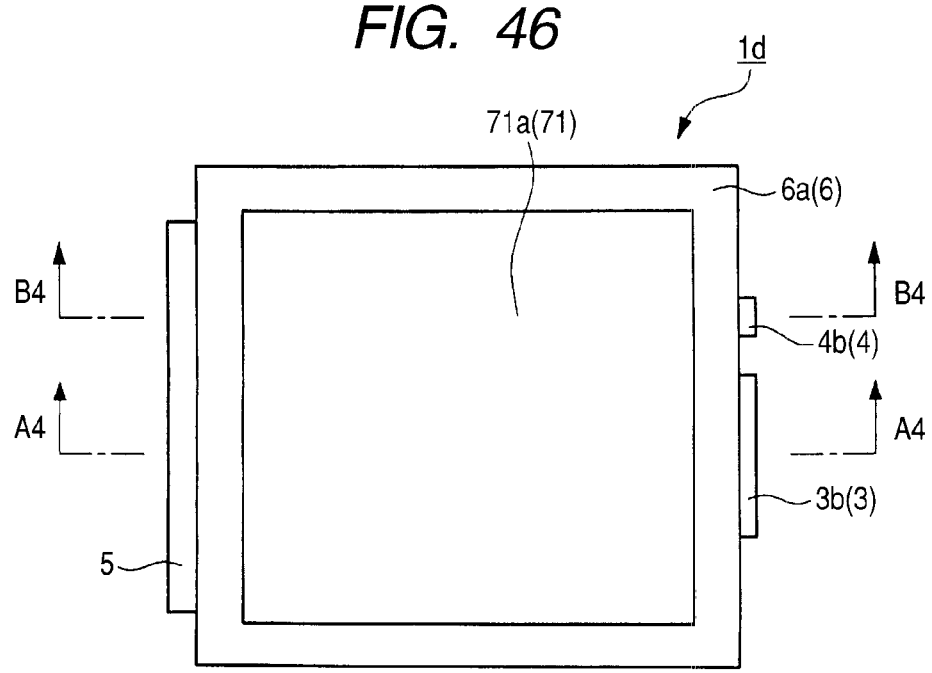
FIG. 46 is a top view of a semiconductor device in the third embodiment of the invention.
Figure 47:
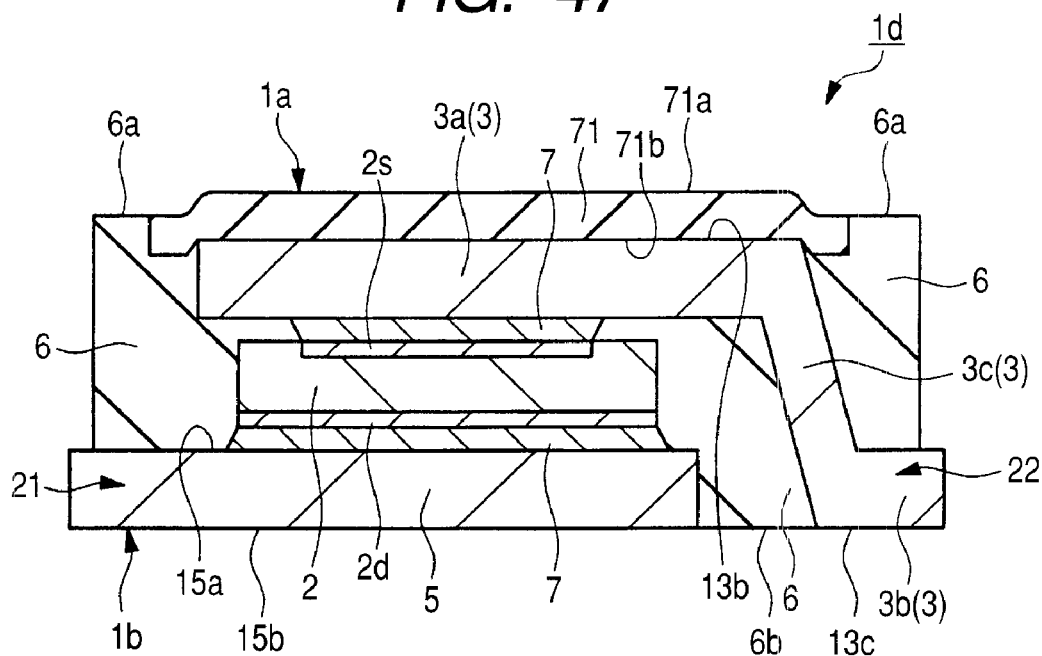
FIG. 47 is a sectional view of a semiconductor device in the third embodiment of the invention.

FIG. 39 is a process flowchart illustrating the manufacturing process for the semiconductor device 1d in this embodiment. The drawings from FIG. 40 to FIG. 48 are substantial part plan views or substantial part sectional views illustrating the manufacturing process for the semiconductor device 1d in this embodiment. Of the drawings from FIG. 40 to FIG. 48, FIG. 40, FIG. 41, and FIG. 46 are plan views (substantial part plan views) and FIG. 42 to FIG. 45, FIG. 47, and FIG. 48 are sectional views (substantial part sectional views). The drawings from FIG. 40 to FIG. 43 illustrate an identical process step. FIG. 40 is a top view; FIG. 41 is a plan view corresponding to FIG. 40 with the heat conduction sheet 71 seen through; FIG. 42 substantially corresponds to a sectional view taken along line A3-A3 of FIG. 41; and FIG. 43 substantially corresponds to a sectional view taken along line B3-B3 of FIG. 41. In FIG. 40 and FIG. 41, an area to be covered with the encapsulation resin section 6 later (area where the encapsulation resin 6 is to be formed) is indicated by a broken line to facilitate understanding. In FIG. 41, the position of the outline of the heat conduction sheet 71 seen through is indicated by an alternate long and two short dashes line to facilitate understanding. FIG. 44 and FIG. 45 are sectional views of different process steps in the position (sectional position) corresponding to the illustration in FIG. 42. FIG. 46 is a top view of the finished semiconductor device 1d; FIG. 47 substantially corresponds to a section taken along line A4-A4 of FIG. 46 and corresponds to FIG. 3 in relation to the first embodiment; and FIG. 48 substantially corresponds to a section taken along line B4-B4 of FIG. 46 and corresponds to FIG. 4 in relation to the first embodiment.

In this embodiment, the steps up to Step S8, or the curing step for the bonding materials 7a, 7b are carried out as in the first embodiment, except that: neither Step S2 (film member 8a placement step) nor Step S5 (film member 8b placement step) is carried out. In this embodiment, in other words, the following procedure is followed: the steps up to Step S7, or the lead frame 22 placement step, are carried out as in the second embodiment; however, a material (bonding material not limited to the silver paste 7c) similar with that in the first embodiment is used for the bonding materials 7a, 7b; and then the curing step, Step S8, for the bonding materials 7a, 7b is carried out as in the first embodiment.

As illustrated in FIG. 40 to FIG. 43, a heat conduction sheet (insulating sheet, heat conduction insulating sheet) 71 is placed (mounted, stuck to) over the following portions: the first portion 23a of each source terminal portion 23 and the first portion 24a of each gate terminal portion 24 of the lead frame 22 (Step S21). More specific description will be given. The heat conduction sheet 71 has a top surface 71a and an under surface 71b, which are principal surfaces on the opposite side to each other. At Step S21, the heat conduction sheet 71 is stuck so that the under surface 71b of the heat conduction sheet 71 is brought into contact with the following surfaces: the second principal surface (top surface) 33b of the first portion 23a of each source terminal portion 23 and the second principal surface (top surface) 34b of the first portion 24a of each gate terminal portion 24 of the lead frame 22. Thus an assembly (work) 40d comprised of the lead frames 21, 22, semiconductor chips 2 joined therebetween, and the heat conduction sheets 71 stuck to over the lead frame 22. The assembly 40d corresponds to the assemblies 40, 40c in the first and second embodiments but it is different from these assemblies mainly in that the heat conduction sheets 71 are stuck.

As seen from FIG. 41 and the like, it is desirable that the heat conduction sheet 71 stuck at Step S21 should embrace the first portion 23a of a source terminal portion 23 and the first portion 24a of a gate terminal portion 24 on a plane. As a result, the radiation performance of the semiconductor device 1d can be further enhanced. The heat conduction sheet 71 has a thickness (initial thickness) $T_3$. The heat conduction sheet 71 is temporarily fixed on the first portion 23a of a source terminal portion 23 and the first portion 24a of a gate terminal portion 24 by the adhesion of the heat conduction sheet 71.

The heat conduction sheet 71 is comprised of insulator and has insulation properties. For this reason, the heat conduction sheet 71 is an insulating sheet. This makes it possible to prevent the source terminal 3 and the gate terminal 4 from being short-circuited in the finished semiconductor device 1d. Since the heat conduction sheet 71 is used for heat radiation, it is desirable that it should be high in thermal conductivity and it is required that it should be higher in thermal conductivity than at least the encapsulation resin section 6. It is further desirable that the thermal conductivity of the heat conduction sheet 71 should be 5 to 10 W/m·K. Further, the heat conduction sheet 71 has elasticity and is shrinkable in the direction of thickness under pressure (load). For this reason, when at least part of the heat conduction sheet 71 is formed of an elastic body, elasticity can be easily provided and this is desirable. Therefore, the heat conduction sheet 71 is desirably an elastic sheet. It is more desirable that the coefficient of elasticity of the heat conduction sheet 71 should be 1 to 100 Mpa. For example, the following material can be used as the heat conduction sheet 71: a material obtained by placing glass cloth (woven cloth of glass fiber) in a base film of silicone rubber for maintaining strength and containing filler therein for the enhancement of thermal conductivity.

The height $h_4$ of the assembly 40d immediately before the molding step (indicated in FIG. 42 and FIG. 43) corresponds to the following value: a value obtained by adding the thickness $T_3$ of the heat conduction sheet 71 to the height $h_3$ thereof before the heat conduction sheet 71 is stuck. (That is, $h_4=h_3+T_3$.) The height $h_4$ of the assembly 40d corresponds to the height (distance) from the second principal surface (under surface) 35b of the drain terminal portion 25 to the following: the top surface 71a of the heat conduction sheet 71 over the first portion 23a of the source terminal portion 23 and the first portion 24a of the gate terminal portion 24. The height $h_3$ corresponds to the height (distance) from the second principal surface (under surface) 35b of the drain terminal portion 25 to the following: the second principal surface (top surface) 33b of the first portion 23a of the source terminal portion 23 and the second principal surface (top surface) 34b of the first portion 24a of the gate terminal portion 24. This height $h_3$ before the heat conduction sheet 71 is stuck corresponds to the height $h_1$ of the assembly immediately before the molding step in the first and second embodiments.

A molding step (resin molding step, for example, transfer molding step) is carried out to form the encapsulation resin section 6 and each semiconductor chip 2 is sealed with the encapsulation resin section 6 (Step S9a). Step S9a (molding step) corresponds to Step S9 (molding step) in the first and second embodiments except for a difference. Description will be given to this difference from Step S9 (molding step) with reference to FIG. 44.

FIG. 44 illustrates the encapsulation resin section 6 formed by doing the following procedure: the assembly 40d is clamped (fixed) between the dies 41, 42; encapsulation resin material (corresponding to the above-mentioned resin material 46) for the formation of the encapsulation resin section 6 is injected into the cavity in the mold 41, 42; and the injected encapsulation resin material is cured. FIG. 44 corresponds to FIG. 25 in relation to the first embodiment. The molding step, Step S9a, in the third embodiment is different from the molding step, Step S9, in the first embodiment in the following point:

In this embodiment, the heat conduction sheet 71 exists between the under surface 41a of the die (upper die) 41 and the following as illustrated in FIG. 44: the first portion 23a of each source terminal portion 23 and the first portion 24a of each gate terminal portion 24 of the lead frame 22. Therefore, the following is not brought into contact with the under surface 41a of the die (upper die) 41: the second principal surface (top surface) 33b of the first portion 23a of each source terminal portion 23 or the second principal surface (top surface) 34b of the first portion 24a of each gate terminal portion 24.

In this embodiment, it is desirable that the height $h_0$ (indicated in FIG. 44) of the cavity in the mold 41, 42 should be smaller than the following: the height $h_4$ (indicated in FIG. 42 and FIG. 43) of the assembly 40d immediately before the molding step ($h_0 < h_4$). The height $h_0$ of the cavity in the mold 41, 42 is equivalent to the following distance: the distance from the under surface 41a of the die 41 to the top surface 42a of the die 42 in the cavity when the dies 41, 42 are clamped together. However, it is required that the height $h_0$ of the cavity in the mold 41, 42 should be made larger than the height $h_3$ of the assembly 40d before the heat conduction sheet 71 is stuck. (That is, $h_0 > h_3$.)

Thus, when the lead frames 21, 22 are clamped between the dies 41, 42, the distance $D_3$ between the under surface 41a of the die (upper die) 41 and the following surfaces is smaller than the thickness (initial thickness) $T_3$ of the heat conduction sheet 71: the second principal surface (top surface) 33b of the first portion 23a of each source terminal portion 23 and the second principal surface (top surface) 34b of the first portion 24a of each gate terminal portion 24 of the lead frame 22. (Here, the relation expressed as $D_3 = h_0 - h_3$ holds.) (That is, $0 < D_3 < T_3$.)

For this reason, the dies 41, 42 are clamped together, the top surface 71a of the heat conduction sheet 71 is brought into close contact with the under surface 41a of the die 41. At the same time, the heat conduction sheet is pushed (pressed) downward by the die 41 and is shrunken in the direction of thickness. That is, the heat conduction sheet 71 is shrunken in the direction of thickness so that the thickness of the heat conduction sheet 71 becomes equal to the above distance $D_3$ between the following and the under surface 41a of the die 41: the first portion 23a of the source terminal portion 23 and the first portion 24a of the gate terminal portion 24. The amount of shrinkage in the heat conduction sheet 71 in the direction of thickness substantially corresponds to the difference (that is, $T_3 - D_3$) between the above thickness $T_3$ and the above distance $D_3$. Since the heat conduction sheet 71 has elasticity, pressure (load) from the die 41 is absorbed at the heat conduction sheet 71 and it is possible to prevent a crack or the like from occurring in the semiconductor chip 2.

Thus the encapsulation resin section 6 is formed with the heat conduction sheet 71 crushed (shrunken) in the direction of thickness between the following and the die 41: the first portion 23a of the source terminal portion 23 and the first portion 24a of the gate terminal portion 24.

The assembly 40d with the encapsulation resin section 6 formed thereon (that is, an assembly 40e) is released from the dies 41, 42 and fins and the like are removed from the encapsulation resin section 6 as required. Thus the molding step, Step S9a, is completed. As a result, such an assembly (work) 40e as illustrated in FIG. 45 is obtained. The assembly 40e is the assembly 40d with the encapsulation resin section 6 formed thereon and corresponds to the assemblies 40a, 40c in the first and second embodiments. In the assembly 40e, the encapsulation resin section 6 seals the semiconductor chip 2, source terminal portion 23, gate terminal portion 24, drain terminal portion 25, and heat conduction sheet 71.

Also in this embodiment, as in the first and second embodiments, the following are exposed from the back surface 6b of the encapsulation resin section 6 in the assembly 40e: the second principal surface (under surface) 35b of the drain terminal portion 25 of the lead frame 21; the under surface 34c of the second portion 24b of the gate terminal portion 24 of the lead frame 22; and the under surface 33c of the second portion 23b of the source terminal portion 23 of the lead frame 22.

In this embodiment, however, the heat conduction sheet 71 exists between each source terminal portion 23 and gate terminal portion 24 of the lead frame 22 and the under surface 41a of the die 41 at the molding step. Unlike the first and the second embodiments, therefore, each source terminal portion 23 or gate terminal portion 24 of the lead frame 22 is not exposed at the top surface 6a of the encapsulation resin section 6 in the assembly 40e.

In this embodiment, the encapsulation resin section 6 is formed with the top surface 71a of the heat conduction sheet 71 in close contact with the under surface 41a of the die 41 at the molding step. In the assembly 40e, therefore, the top surface 71a of the heat conduction sheet 71 is exposed at the top surface 6a of the encapsulation resin section 6 as illustrated in FIG. 45.

As mentioned above, the encapsulation resin section 6 is formed with the heat conduction sheet 71 crushed (shrunken) in the direction of thickness. When the assembly 40e is released from the dies 41, 42, however, it gets free of the pressure (load) from the die 41 and thus the heat conduction sheet 71 is going to be returned to the origin thickness $T_3$ by elastic force. For this reason, the top surface 6a of the encapsulation resin section 6 and the top surface 71a of the heat conduction sheet 71 do not become flush with each other. As a result, the top surface 71a of the heat conduction sheet 71 is slightly protruded from the top surface 6a of the encapsulation resin section 6 as illustrated in FIG. 45. The amount (thickness) $T_4$ of the protrusion of the heat conduction sheet 71 from the top surface 6a of the encapsulation resin section 6 substantially corresponds to the following: the amount of shrinkage in the heat conduction sheet 71 in the direction of thickness at the molding step. (That is, $T_4 = T_3 - D_3$.) Therefore, it becomes substantially equal to the difference between the height $h_4$ of the assembly 40d and the height $h_0$ of the cavity in the mold 41, 42 immediately before the molding step. (That is, $T_4 = h_4 - h_0$.) The above amount (thickness) $T_4$ of the protrusion is equal to the difference between the following and the height position of the top surface 6a of the encapsulation resin section 6: the height position of the top surface 71a of the heat conduction sheet 71 over the first portion 23a of the source terminal portion 23 and the first portion 24a of the gate terminal portion 24.

In this embodiment, as mentioned above, the encapsulation resin section 6 has the conductor sections (source terminal portion 23, gate terminal portion 24, and drain terminal portion 25) exposed at the back surface 6b. At the top surface 6a, however, the conductor sections (source terminal portion 23, gate terminal portion 24, and drain terminal portion 25) are not exposed but the heat conduction sheet 71 is exposed.

The subsequent steps are the same as in the first and second embodiments. That is, plating is carried out at Step S10 and the lead frames 21, 22 are cut at Step S11 as in the first and second embodiments. These steps are the same as in the first and second embodiments and the description thereof will be omitted here.

Figure 48:
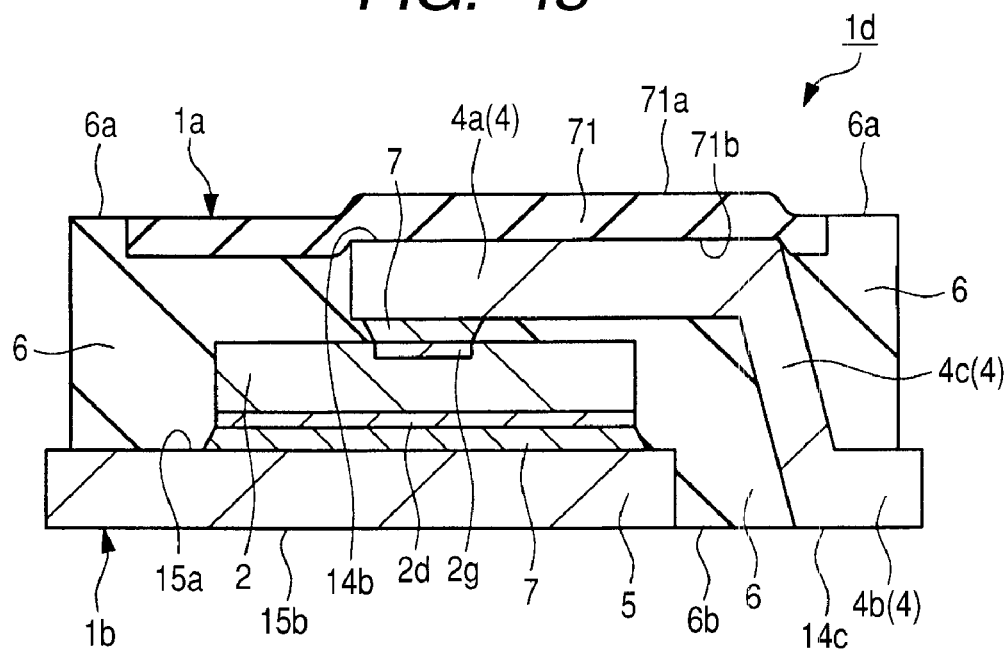
FIG. 48 is another sectional view of a semiconductor device in the third embodiment of the invention.

Thus the semiconductor device id in this embodiment is manufactured as illustrated in FIG. 46 to FIG. 48. The bottom view of the semiconductor device 1d is the same as FIG. 2 in relation to the first embodiment and that drawing will be omitted here.

The semiconductor device 1d illustrated in FIG. 46 to FIG. 48 is different from the semiconductor device 1 in the first embodiment in that: the film member 8a or 8b is not used; the heat conduction sheet 71 is used; and at the top surface 6a of the encapsulation resin section 6, the source terminal 3 (first portion 3a thereof) or the gate terminal 4 (first portion 4a thereof) is not exposed but the heat conduction sheet 71 is exposed. The top surface 13b of the first portion 3a of the source terminal 3 and the top surface 14b of the first portion 4a of the gate terminal 4 are in close contact with the under surface 71b of the heat conduction sheet 71. The top surface 6a of the encapsulation resin section 6 and the top surface 71a of the heat conduction sheet 71 are not flush with each other. The top surface 71a of the heat conduction sheet 71 is slightly protruded from the top surface 6a of the encapsulation resin section 6. (The amount of protrusion is the same as the above amount $T_4$ of protrusion.) However, at least part (lower part) of the heat conduction sheet 71 is buried and sealed in the encapsulation resin section 6. The other configurations of the semiconductor device 1d are the same as those of the semiconductor device 1 in the first embodiment and the description thereof will be omitted here.

In the semiconductor device 1d in this embodiment, the following are exposed as external coupling terminals at the back surface 1b of the semiconductor device 1d (the back surface 6b of the encapsulation resin section 6): the source terminal 3 (second portion 3b thereof); the gate terminal 4 (the second portion 4b thereof); and the drain terminal 5. At the same time, terminals are not exposed but the heat conduction sheet 71 is exposed at the top surface 1a of the semiconductor device 1d (the top surface 6a of the encapsulation resin section 6). This heat conduction sheet 71 is high in thermal conductivity (higher in thermal conductivity than at least the encapsulation resin section 6). In the encapsulation resin section 6, the top surface 13b of the first portion 3a of the source terminal 3 and the top surface 14b of the first portion 4a of the gate terminal 4 are in close contact with the under surface 71b of the heat conduction sheet 71. For this reason, it is possible to radiate heat from the semiconductor chip 2 from the back surface 1b of the semiconductor device 1d through the source terminal 3 (the second portion 3b thereof), the gate terminal 4 (the second portion 4b thereof), and the drain terminal 5. At the same time, it is also possible to radiate the heat from the top surface 1a of the semiconductor device 1d through the source terminal 3 (first portion 3a thereof), the gate terminal 4 (the first portion 4a thereof), and the heat conduction sheet 71. That is, heat can be radiated from the top and under surfaces of the semiconductor device 1d. As a result, it is possible to enhance the heat radiation characteristic of the semiconductor device of a resin sealed semiconductor package type and the performance thereof.

In this embodiment, the encapsulation resin section 6 is formed with the heat conduction sheet 71 having elasticity placed between the die 41 and the following portions: the first portion 23a of the source terminal portion 23 and the first portion 24a of the gate terminal portion 24. For this reason, even though there is variation in the height $h_3$ of assemblies before the heat conduction sheet 71 is stuck, this variation can be absorbed by the following fluctuation: fluctuation in the amount of shrinkage in the heat conduction sheet 71 in the direction of thickness when the dies 41, 42 are clamped together. As a result, it is possible to prevent a crack or the like from being produced in a semiconductor chip at the molding step and enhance the fabrication yield of semiconductor devices.

In this embodiment, the top surface 6a of the encapsulation resin section 6 and the top surface 71a of the heat conduction sheet 71 are not flush with each other. The top surface 71a of the heat conduction sheet 71 is protruded from the top surface 6a of the encapsulation resin section 6. For this reason, when a member for heat radiation (for example, the above-mentioned radiation fin 55) is mounted over semiconductor devices 1d, the member for heat radiation can be brought into close contact with the heat conduction sheet 71 of each semiconductor device 1d. As a result, it is possible to enhance the heat radiation characteristic of the semiconductor device. Therefore, it is unnecessary to separately prepare such a material as the above-mentioned heat conduction sheet 54 and place it between each semiconductor device 1d and the member for heat radiation. This makes is easy to mount the member for heat radiation over semiconductor devices 1d. In this embodiment, further, it is possible to reduce the required area of heat conduction sheet per semiconductor device as compared with a case illustrated in FIG. 28. (The heat conduction sheet is the heat conduction sheet 71 in this embodiment and the heat conduction sheet 54 in FIG. 28.) Therefore, a cost can be reduced.

The third embodiment may be combined with the first or second embodiment. When this embodiment and the first embodiment are combined with each other, the following procedure can be followed: the steps up to Step S8 (bonding material 7a, 7b curing step) are carried out to obtain the above assembly 40 as in the first embodiment; thereafter, the heat conduction sheets 71 are stuck to the assembly 40 at Step S21 as in the this embodiment; and then Step S9a (molding step), Step S10 (plating step), and Step S11 (lead frame 21, 22 cutting step) are carried out as in this embodiment. When this embodiment and the second embodiment are combined with each other, the following procedure can be followed: the steps up to Step S8a (silver paste 7c curing step) are carried out to obtain the assembly 40c as in the second embodiment; thereafter, the heat conduction sheets 71 are stuck to the assembly 40c at Step S21 as in this embodiment; and then Step S9a (molding step), Step S10 (plating step), and Step S11 (lead frame 21, 22 cutting step) are carried out as in this embodiment. Combining this embodiment with the first or second embodiment as mentioned above makes it possible to obtain the effect of this embodiment in addition to the effect obtained in the first or second embodiment.

Fourth Embodiment

In the description of the first embodiment, a semiconductor device so structured that the following is implemented has been taken as an example: the terminal on the lower side of the semiconductor chip (side of the back surface of the semiconductor device) is taken as the drain terminal 5; and the terminals on the upper side of the semiconductor chip (side of the top surface of the semiconductor device) are taken as the source terminal 3 and the gate terminal 4. (This type of semiconductor device is designated as so-called drain bottom-type semiconductor device.) In the description of the fourth embodiment, a case where the first embodiment is applied to a semiconductor device so structured that the following is implemented will be taken as an example: the terminals on the lower side of the semiconductor chip (side of the back surface of the semiconductor device) are taken as the source terminal 3 and the gate terminal 4; and the terminal on the upper side of the semiconductor chip (side of the top surface of the semiconductor device) is taken as the drain terminal 5. (This type of semiconductor device is designated as so-called drain top-type semiconductor device.)

Figure 49:
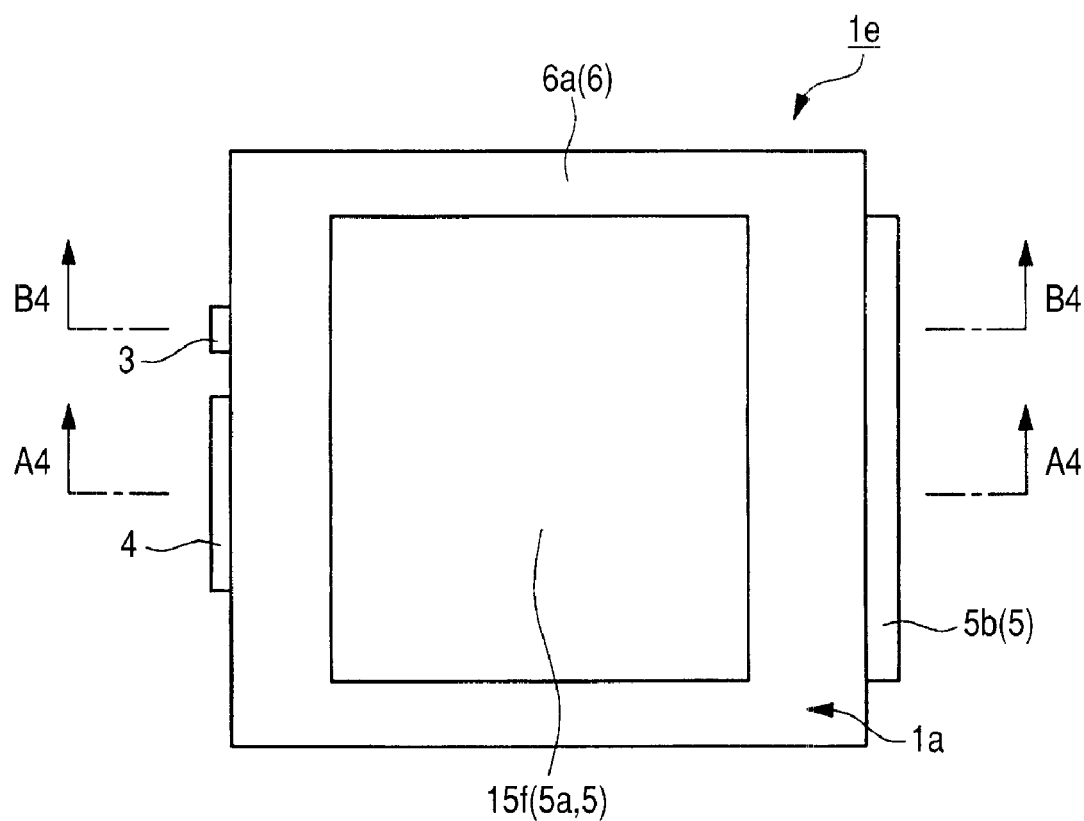
FIG. 49 is a top view of a semiconductor device in a fourth embodiment of the invention.
Figure 50:
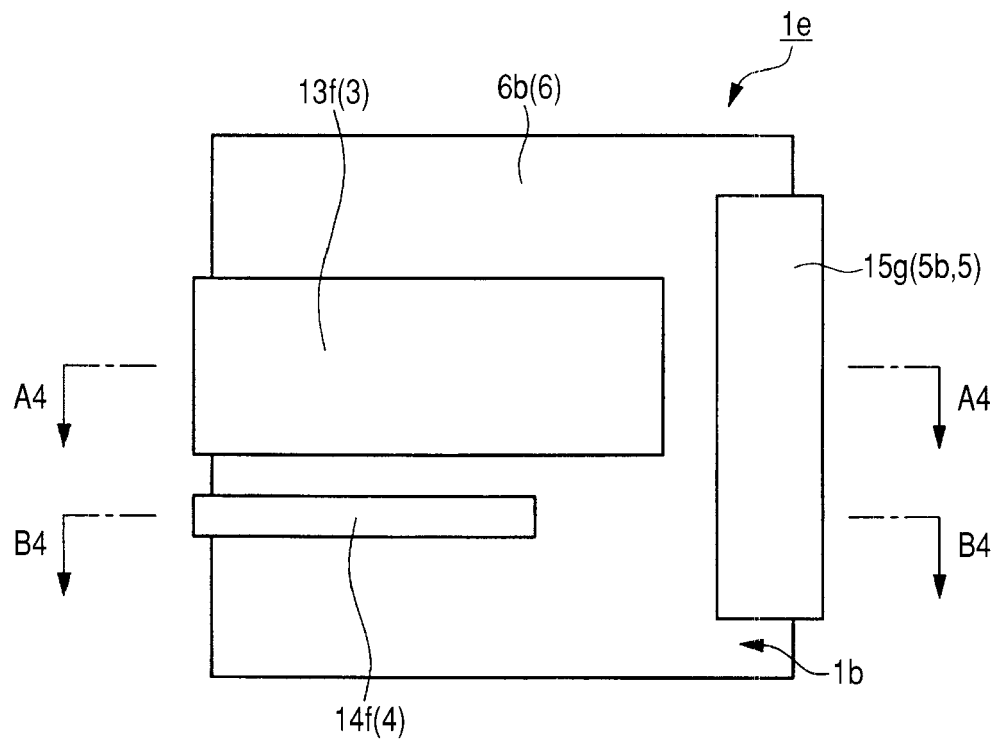
FIG. 50 is a bottom view of the semiconductor device in FIG. 49.
Figure 51:
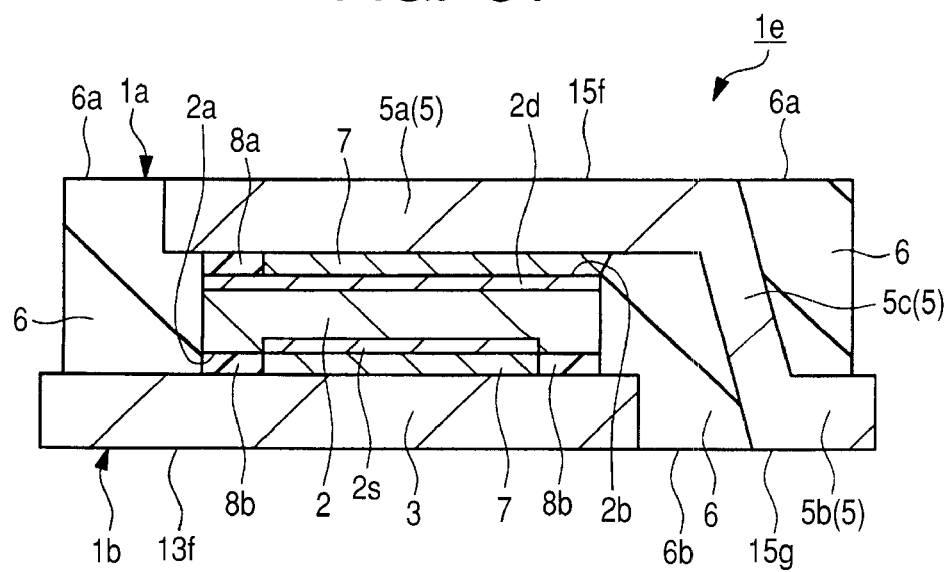
FIG. 51 is a sectional view of the semiconductor device in FIG. 49.
Figure 52:
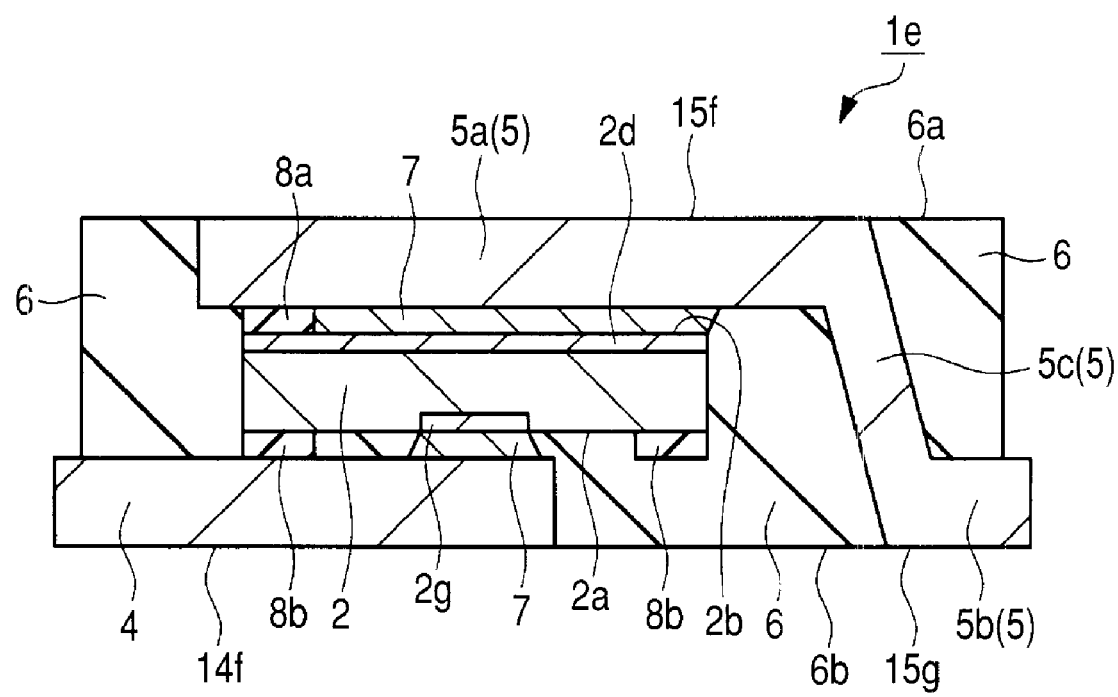
FIG. 52 is another sectional view of the semiconductor device in FIG. 49.

FIG. 49 is a top view (plan view) of a semiconductor device 1e in this embodiment; FIG. 50 is a bottom view (base view, back surface view, plan view) thereof; and FIG. 51 and FIG. 52 are sectional views (side surface sectional views) thereof. The section taken along line A4-A4 of FIG. 49 (that is, the section taken along line A4-A4 of FIG. 50) substantially corresponds to FIG. 51; and the section taken along line B4-B4 of FIG. 49 (that is, the section taken along line B4-B4 of FIG. 50) substantially corresponds to FIG. 52.

Description will be given to the semiconductor device 1e in this embodiment, illustrated in FIG. 49 to FIG. 52, with a focus on a difference from the semiconductor device 1 in the first embodiment.

In the semiconductor device 1 in the first embodiment, the drain terminal 5 is of flat structure and the source terminal 3 and the gate terminal 4 are of such structure that they are bent at midpoints. In the semiconductor device 1e in this embodiment, illustrated in FIG. 49 to FIG. 52, the source terminal 3 and the gate terminal 4 are of flat structure and the drain terminal 5 is of such structure that it is bent at midpoints.

More specific description will be given. The source terminal 3 in this embodiment is of such flat structure that the first portion 3a and the second portion 3b are integrally coupled together without the above stepped portion 3c. The gate terminal 4 in this embodiment is of such flat structure that the first portion 4a and the second portion 4b are integrally coupled together without the above stepped portion 4c. Meanwhile, the drain terminal 5 in this embodiment includes the following portions like the source terminal 3 and the gate terminal 4 in the first embodiment: a first portion (chip coupling portion, conductor section) 5a; a second portion (external terminal composing portion, conductor section) 5b; and a stepped portion (bent portion, coupling portion, conductor section) 5c that couples the first portion 5a and the second portion 5b together. The first portion 5a, second portion 5b, and stepped portion 5c are integrally formed of the same conductive material. The stepped portion 5c couples together the first portion 5a and the second portion 5b different in height position from each other and the drain terminal 5 is thereby formed.

The semiconductor chip 2 is disposed between the source terminal 3 and the gate terminal 4 positioned under the semiconductor chip 2 and the drain terminal 5 positioned above the semiconductor chip 2 so that the following is implemented: the front surface 2a of the semiconductor chip 2 faces downward. The following is implemented through the conductive bonding material 7: the source terminal 3 is joined and electrically coupled with the source pad electrode 2s in the front surface 2a of the semiconductor chip 2: the gate terminal 4 is joined and electrically coupled with the gate pad electrode 2g in the front surface 2a of the semiconductor chip 2; and the drain terminal 5 is joined and electrically coupled with the back surface drain electrode 2d in the back surface 2b of the semiconductor chip 2.

The semiconductor chip 2, source terminal 3, gate terminal 4, and drain terminal 5 are sealed in the encapsulation resin section 6. At the back surface 6b (second surface) of the encapsulation resin section 6, the following surfaces are exposed: the under surface 13f of the source terminal 3, the under surface 14f of the gate terminal 4, and the under surface 15g of the second portion 5c of the drain terminal 5. At the top surface 6a (first surface) of the encapsulation resin section 6, the top surface 15f of the first portion 5c of the drain terminal 5 is exposed. The following surfaces exposed at the back surface 6b of the encapsulation resin section 6, or the mounting surface of the semiconductor device 1e, are taken as the external coupling terminals of the semiconductor device 1e: the under surface 13f of the source terminal 3; the under surface 14f of the gate terminal 4; and the under surface 15g of the second portion 5c of the drain terminal 5. It is desirable that these surfaces are formed substantially flush.

Also in this embodiment, as in the first embodiment, the following is implemented: not only the bonding material 7 but also the film member 8a exists between the back surface 2b (back surface drain electrode 2d) of the semiconductor chip 2 and the first portion 5a of the drain terminal 5; and not only the bonding material 7 but also the film member 8b exists between the front surface 2a of the semiconductor chip 2 and the source terminal 3 and gate terminal 4.

As mentioned above, the semiconductor device 1e in this embodiment is also a semiconductor device of a resin sealed semiconductor package type having exposed conductors at the top and under surfaces like the semiconductor device 1 in the first embodiment. Therefore, it is possible to enhance the heat radiation characteristic of the semiconductor device 1e and the performance of the semiconductor device 1e.

Description will be given to a manufacturing process for the semiconductor device in this embodiment.

Figure 53:
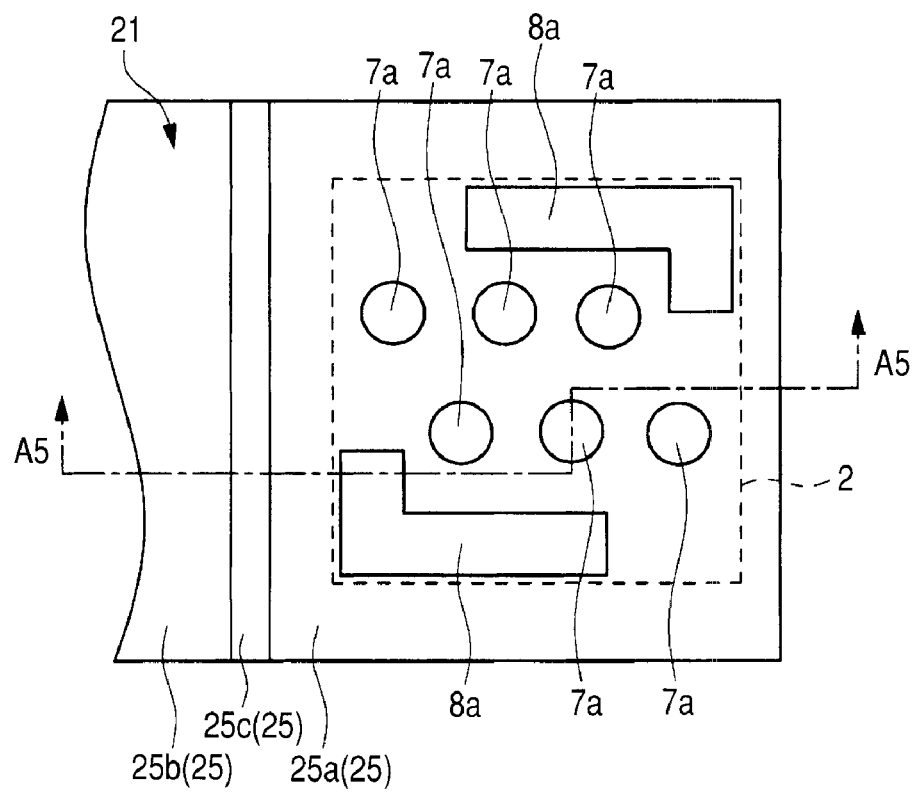
FIG. 53 is a plan view of a semiconductor device in the fourth embodiment of the invention in a manufacturing process.
Figure 54:
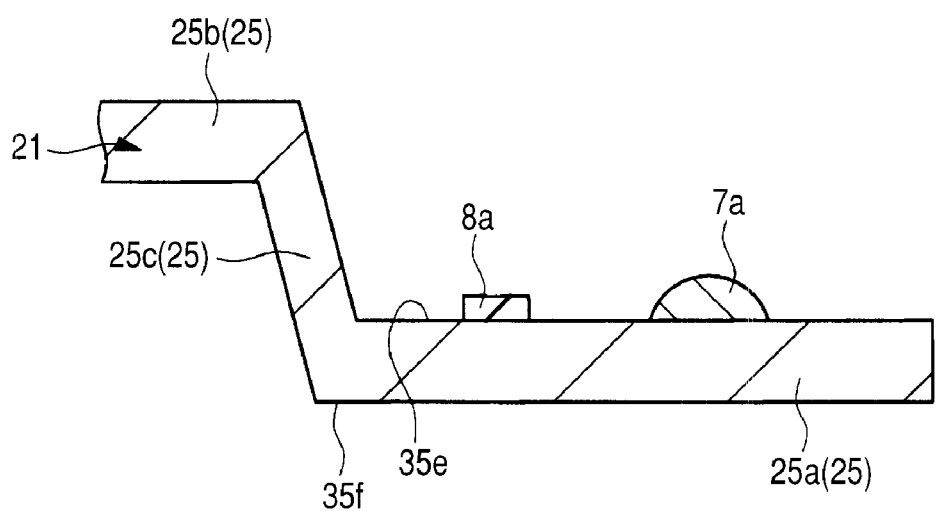
FIG. 54 is a sectional view of the same semiconductor device as in FIG. 53 in the manufacturing process.
Figure 55:
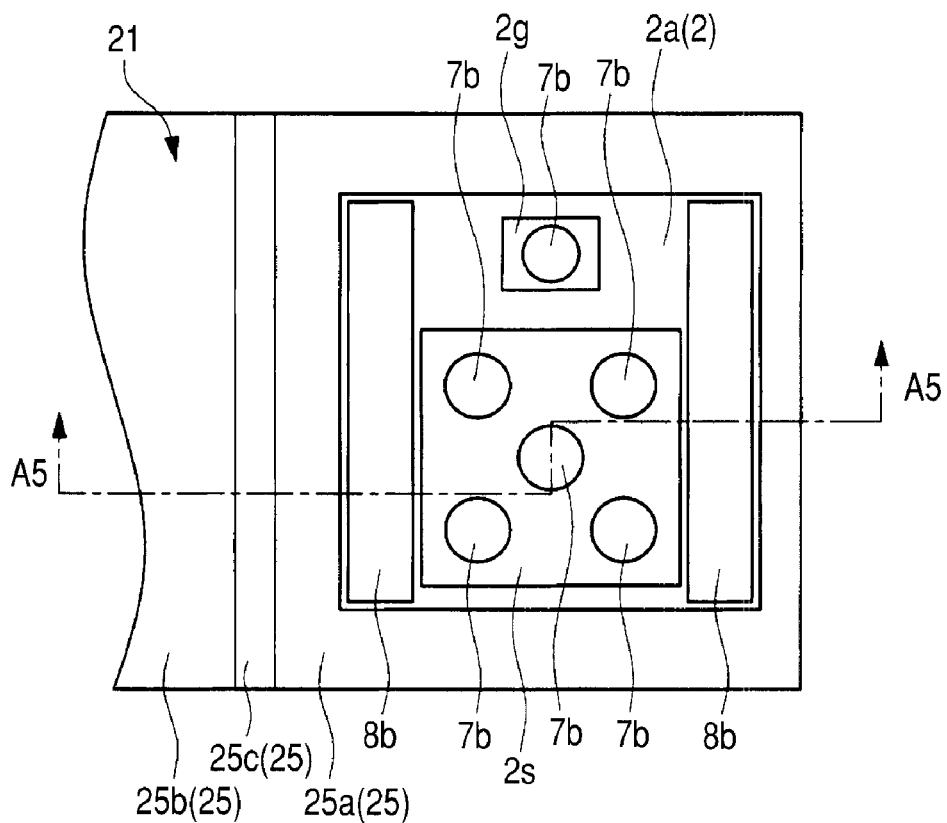
FIG. 55 is a plan view of the semiconductor device in the manufacturing process, following FIG. 53.
Figure 56:
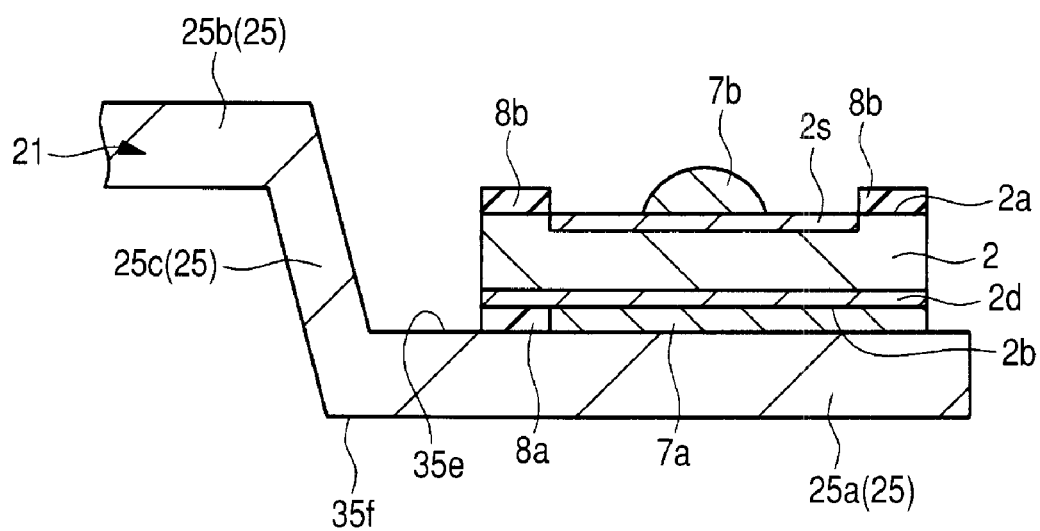
FIG. 56 is a sectional view of the same semiconductor device as in FIG. 55 in the manufacturing process.
Figure 57:
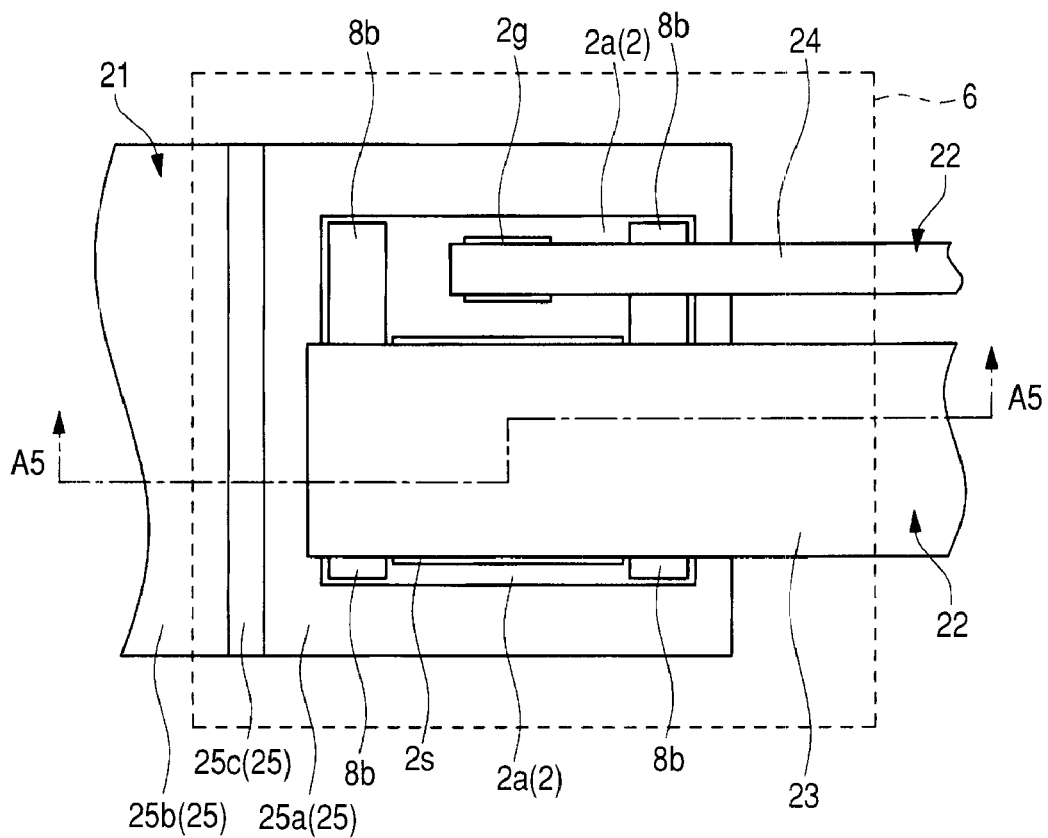
FIG. 57 is a plan view of the semiconductor device in the manufacturing process, following FIG. 55.
Figure 58:
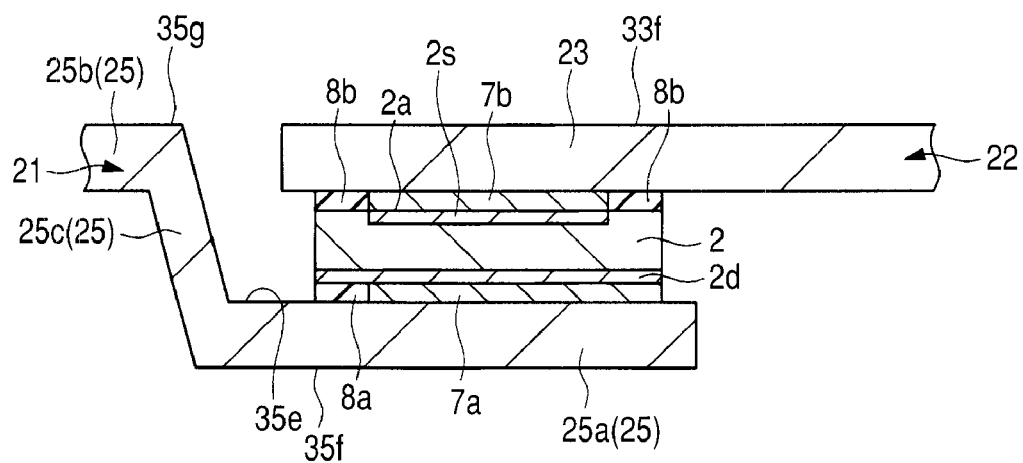
FIG. 58 is a sectional view of the same semiconductor device as in FIG. 57 in the manufacturing process.
Figure 59:
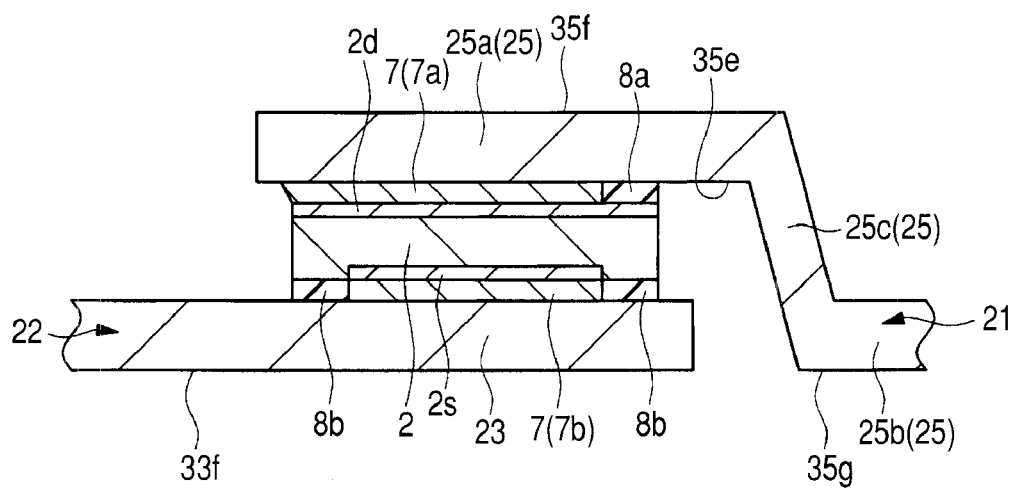
FIG. 59 is a sectional view of the semiconductor device in the manufacturing process, following FIG. 58.

The drawings from FIG. 53 to FIG. 60 are substantial part plan views or substantial part sectional views illustrating the manufacturing process for the semiconductor device 1e in this embodiment. Of the drawings from FIG. 53 to FIG. 60, FIG. 53, FIG. 55, and FIG. 57 are plan views (substantial part plan views) and FIG. 54, FIG. 56, and FIG. 58 to FIG. 60 are sectional views (substantial part sectional views). FIG. 53 and FIG. 54 correspond to the process step illustrated in FIG. 12 and FIG. 13 in relation to the first embodiment; FIG. 55 and FIG. 56 correspond to the process step illustrated in FIG. 17 and FIG. 18 in relation to the first embodiment; FIG. 57 and FIG. 58 correspond to the process step illustrated in FIG. 19 and FIG. 20 in relation to the first embodiment; FIG. 59 corresponds to the process step illustrated in FIG. 22 in relation to the first embodiment; and FIG. 60 corresponds to the process step illustrated in FIG. 26 in relation to the first embodiment. FIG. 54, FIG. 56, and FIG. 58 to FIG. 60 are sectional views that substantially correspond to the sections taken along line A5-A5 illustrated in FIG. 53, FIG. 55, and FIG. 57 and are substantially equivalent to FIG. 51. In FIG. 12, the area where the semiconductor chip 2 is disposed later (area to be mounted with the semiconductor chip 2) is indicated by a broken line to facilitate understanding. In FIG. 57, the area that is covered with the encapsulation resin section 6 later (area where the encapsulation resin 6 is to be formed) is indicated by a broken line for the same purpose.

The semiconductor device 1e in this embodiment is manufactured substantially similarly with the semiconductor device 1 in the first embodiment, except that the shape of the lead frames 21, 22 is different.

At Step S1, first, the semiconductor chip 2 and the lead frames 21, 22 are prepared. The lead frame 22 used in this embodiment has source terminal portions 23 that become source terminals 3 later and gate terminal portions 24 that become gate terminals 4 later. Since the source terminal 3 and the gate terminal 4 are flat as mentioned above, the source terminal portions 23 and the gate terminal portions 24 are also flat. The lead frame 21 used in this embodiment has drain terminal portions 25 that become drain terminals 5 later. As mentioned above, the drain terminal 5 is comprised of the first portion 5a, second portion 5b, and stepped portion 3c. For this reason, each drain terminal portion 25 of the lead frame 21 includes: the first portion 25a of the drain terminal portion 25 that becomes the first portion 5a of the drain terminal 5 later; the second portion 25b of the drain terminal portion 25 that becomes the second portion 5b of the drain terminal 5 later; and the stepped portion 25c of the drain terminal portion 25 that becomes the stepped portion 5c of the drain terminal 5 later. These portions are integrally formed. The other configurations of the lead frames 21, 22 are the same as those in the first embodiment.

As illustrated in FIG. 53 and FIG. 54, the film members 8a are placed over the lead frame 21 at Step S2 and then the bonding material 7a is placed over the lead frame 21 at Step S3 as in the first embodiment. At this time, the film members 8a and the bonding material 7a are placed over the first principal surface 35e of the first portion 25a of each drain terminal portion 25 of the lead frame 21. The first portion 25a of each drain terminal portion 25 of the lead frame 21 has a first principal surface 35e and a second principal surface 35f on the opposite side to each other. The second principal surface 35f becomes the top surface 15f (face exposed from the encapsulation resin section 6) of the first portion 5a of the drain terminal 5 later. In other respects, Steps S2 and S3 are carried out as in the first embodiment. The configuration, functions, and effect of the film member 8a are also the same as in the first embodiment.

As illustrated in FIG. 55 and FIG. 56, the following procedure is followed as in the first embodiment: at Step S4, each semiconductor chip 2 is placed over the lead frame 21 and then the film members 8b are placed over the front surface 2a of the semiconductor chip 2 at Step S5; and thereafter, the bonding material 7b is placed over the front surface 2a of the semiconductor chip 2 at Step S6. At this time, the semiconductor chip 2 is placed over the first principal surface 35e of the first portion 25a of each drain terminal portion 25 of the lead frame 21 with the film members 8a and the bonding material 7a in-between. In other respects, Steps S4, S5, and S6 are carried out as in the first embodiment. The configuration, functions, and effect of the film member 8b are also the same as in the first embodiment.

As illustrated in FIG. 57 and FIG. 58, the lead frame 22 is placed over the front surface 2a of each semiconductor chip 2 at Step S7 as in the first embodiment. Though there is the difference of whether the terminal portion 23 and the gate terminal portion 24 are flat or bent, the procedure in this embodiment is the same as in the first embodiment in that: the lead frame 22 is placed over the lead frame 21 and each semiconductor chip 2 so that the following is implemented: (part of) each source terminal portion 23 of the lead frame 22 is placed over the source pad electrode 2s of a semiconductor chip 2; and at the same time, (part of) each gate terminal portion 24 of the lead frame 22 is placed over the gate pad electrode 2g of a semiconductor chip 2.

At Step S8, the bonding materials 7a, 7b are cured as in the first embodiment. As a result, each source terminal portion 23, gate terminal portion 24, and drain terminal portion 25 of the lead frames 21, 22 are joined and electrically coupled with the following with the bonding material 7 in-between as illustrated in FIG. 59: the source pad electrode 2s, gate pad electrode 2g, and back surface drain electrode 2d of each semiconductor chip 2. (The bonding material 7 is the cured bonding materials 7a, 7b.) That is, each source terminal portion 23 of the lead frame 22 and the source pad electrode 2s of each semiconductor chip 2 are joined and electrically coupled together with the bonding material 7 in-between. Each gate terminal portion 24 of the lead frame 22 and the gate pad electrode 2g of each semiconductor chip 2 are joined and electrically coupled together with the bonding material 7 in-between. The back surface drain electrode 2d of each semiconductor chip 2 and the first portion 25a of each drain terminal portion 25 of the lead frame 21 are joined and electrically coupled together with the bonding material 7 in-between. FIG. 59 is equivalent to the structure illustrated in FIG. 58 turned upside down.

Figure 60:
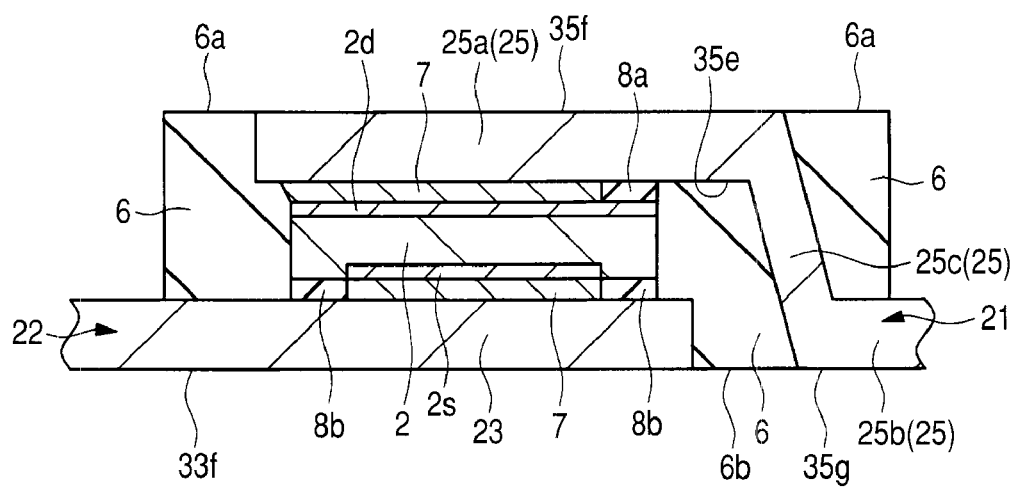
FIG. 60 is a sectional view of the semiconductor device in the manufacturing process, following FIG. 59.

As illustrated in FIG. 60, Step S9, or the molding step, is carried out to form the encapsulation resin section 6 as in the first embodiment.

The molding step in this embodiment is different from that in the first embodiment in the following respects. When the lead frames 21, 22 are clamped between the above-mentioned dies 41, 42, the following are brought into contact (close contact) with the top surface 42a of the die 42: the first principal surface 35g of the second portion of each drain terminal portion 25 of the lead frame 21; the first principal surface (not shown here) of each gate terminal portion 24 of the lead frame 22; and the first principal surface 33f of each source terminal portion 23 of the lead frame 22. Further, the second principal surface 35f of the first portion 25a of each drain terminal portion 25 of the lead frame 21 is brought into contact (close contact) with the under surface 41a of the die 41. In other respects, the molding step can be carried out as in the first embodiment. That is, in the foregoing state of things, the above-mentioned encapsulation resin material 46 is injected into the cavity 43 in the mold 41, 42 and cured to form the encapsulation resin section 6.

As a result, the following are exposed at the back surface 6b of the encapsulation resin section 6: the first principal surface 35g of the second portion of each drain terminal portion 25 of the lead frame 21; and the first principal surface (not shown here) of each gate terminal portion 24 and the first principal surface 33f of each source terminal portion 23 of the lead frame 22. In addition, the second principal surface 35f of the first portion 25a of each drain terminal portion 25 of the lead frame 21 is exposed at the top surface 6a of the encapsulation resin section 6.

The second principal surface 35f of the first portion 25a of a drain terminal portion 25 of the lead frame 21 is exposed at the top surface 6a of the encapsulation resin section 6. When the manufacture of the semiconductor device 1e is completed, it becomes the top surface 15f of the first portion 5a of the drain terminal 5. The first principal surface 33f of a source terminal portion 23 of the lead frame 22, exposed at the back surface 6b of the encapsulation resin section 6, is on the opposite side to the side where it is opposed to the semiconductor chip 2. That is, it is a surface on the opposite side to the side where it is joined with the source pad electrode 2s. When the manufacture of the semiconductor device 1 is completed, it becomes the under surface 13f of the source terminal 3. The first principal surface (not shown here) of a gate terminal portion 24 of the lead frame 22 is exposed at the back surface 6b of the encapsulation resin section 6. It is on the opposite side to the side where it is opposed to the semiconductor chip 2. That is, it is a surface on the opposite side to the side where it is joined with the gate pad electrode 2g. When the manufacture of the semiconductor device 1e is completed, it becomes the under surface 14f of the gate terminal 4. The first principal surface 35g of the second portion of a drain terminal portion 25 of the lead frame 21 is exposed at the back surface 6b of the encapsulation resin section 6. It is on the same side as the first principal surface 35e of the first portion 25a of the drain terminal portion 25. When the manufacture of the semiconductor device 1e is completed, it becomes the under surface 15g of the second portion 5a of the drain terminal 5.

The subsequent steps are the same as in the first embodiment. That is, plating is carried out at Step S10 and the lead frames 21, 22 are cut at Step S11 as in the first embodiment. As a result, the semiconductor device 1e in this embodiment, illustrated in FIG. 49 to FIG. 52, is manufactured.

Also in such a drain top-type semiconductor device 1e as in this embodiment, substantially the same effect as in the first embodiment can be obtained by applying the same technique (use of the film members 8a, 8b) as in the first embodiment as mentioned above.

The above-mentioned second embodiment can also be applied to such a drain top-type semiconductor device as in this embodiment and this will be described below.

Figure 61:
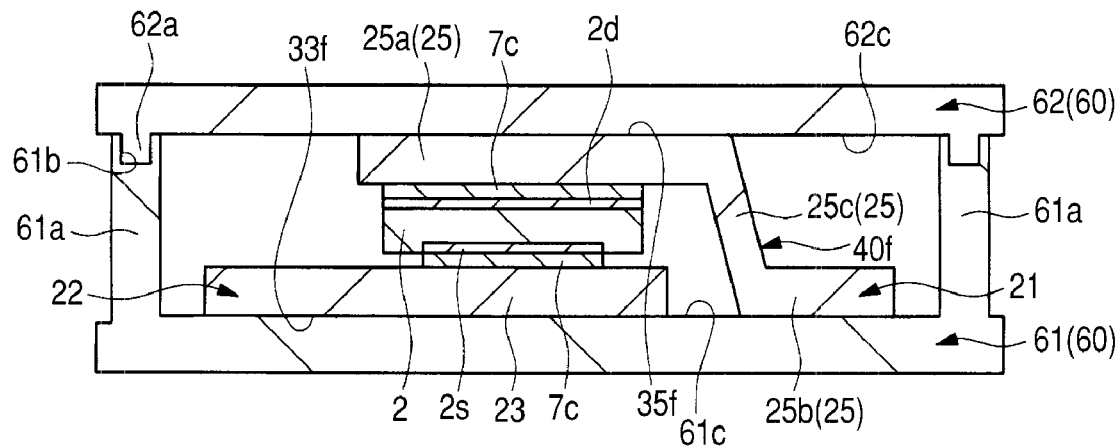
FIG. 61 is a sectional view of a semiconductor device in the fourth embodiment of the invention in another manufacturing process.

FIG. 61 is a sectional view of another semiconductor device in this embodiment in the manufacturing process. (This semiconductor device is obtained by applying the second embodiment to a drain top-type semiconductor device.) FIG. 61 corresponds to FIG. 33 in relation to the second embodiment.

In the above-mentioned manufacturing process for the semiconductor device 1e, neither Step S2 nor Step S5 (film member 8a, 8b placement steps) is carried out. Further, the silver paste 7c is used as the bonding materials 7a, 7b at Steps S3 and S6 (bonding material 7a, 7b placement steps). The same manufacturing process as for the semiconductor device 1e, except for the foregoing, is carried out up to Step S7 (lead frame 22 placement step). As a result, the temporary assembly 40f (equivalent to the temporary assembly 40b in the second embodiment) illustrated in FIG. 61 is fabricated.

As illustrated in FIG. 61, the silver paste 7c is cured at Step S8a as in the second embodiment. Step S8a, or the curing step for the silver paste 7c, is carried out as in the second embodiment. That is, the silver paste 7c is cured (subjected to heat treatment for curing) while pressure is applied to the following: each drain terminal portion 25 of the lead frame 21 and each source terminal portion 23 and gate terminal portion 24 of the lead frame 22 with the semiconductor chip 2 sandwiched therebetween.

For example, the procedure illustrated in FIG. 61 is followed as in the second embodiment. That is, the temporary assembly 40f is set on the base portion 61 of the retaining jig 60 and then the lid portion 62 of the retaining jig 60 is attached to the base portion 61. The temporary assembly 40f is thereby held from above and below by the lid portion 62 and the base portion 61 of the retaining jig 60. As the result of being clamped and held between the base portion 61 and the lid portion 62, pressure (load) is applied to the area between the following portions: each source terminal portion 23 and gate terminal portion 24 (not shown in FIG. 61) of the lead frame 22; and the first portion 25a of each drain terminal portion 25 of the lead frame 21. The temporary assembly 40f set on the retaining jig 60 is heated (subjected to heat treatment) to cure the silver paste 7c in the temporary assembly 40f.

The subsequent steps are the same as in the above-mentioned manufacturing process (steps corresponding to Steps S9 to S11) for the semiconductor device 1e and the description thereof will be omitted here.

Also in case of such a drain top-type semiconductor device as in this embodiment, substantially the same effect as in the second embodiment can be obtained by applying the same technique as in the second embodiment. (The technique includes use of the silver paste 7c and giving a twist to the silver paste 7c curing step.)

The above-mentioned third embodiment can also be applied to such a drain top-type semiconductor device as in this embodiment and this will be described below.

Figure 62:
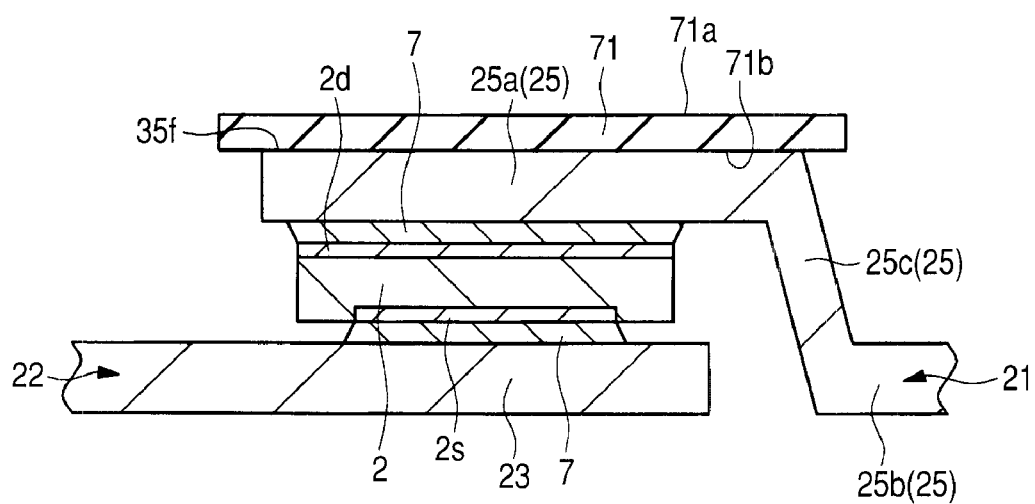
FIG. 62 is a sectional view of a semiconductor device in the fourth embodiment of the invention in another manufacturing process.
Figure 63:
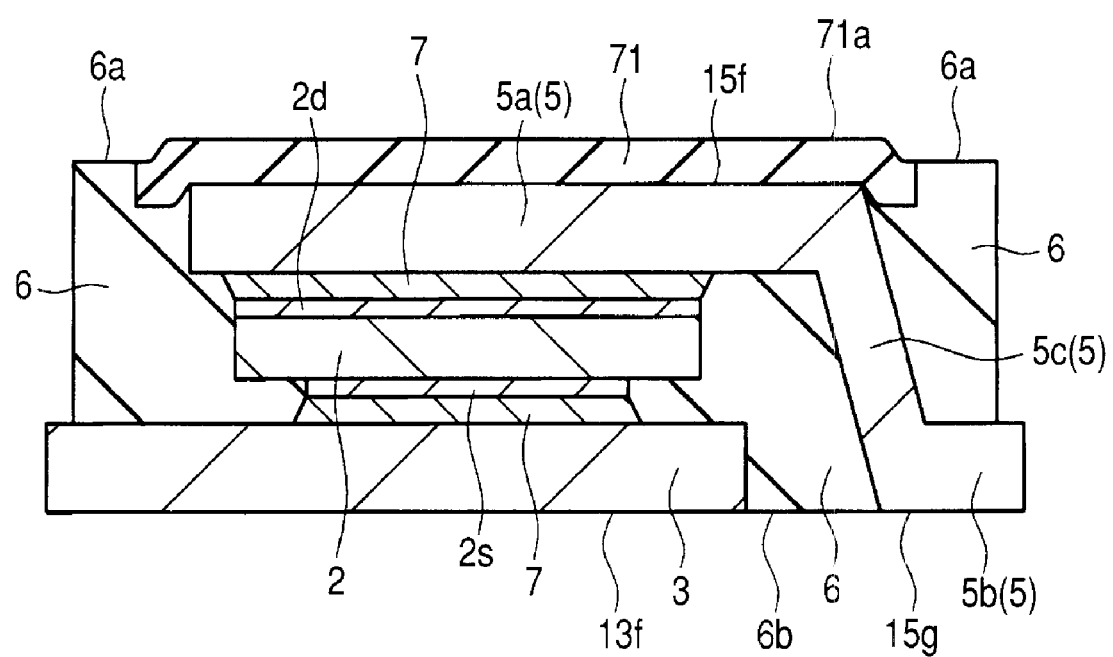
FIG. 63 is a sectional view of the semiconductor device in the manufacturing process, following FIG. 62.

FIG. 62 is a sectional view of another semiconductor device in this embodiment in the manufacturing process. (This semiconductor device is obtained by applying the third embodiment to a drain top-type semiconductor device.) FIG. 63 is a sectional view of the finished semiconductor device. FIG. 62 corresponds to FIG. 42 in relation to the third embodiment and FIG. 63 corresponds to FIG. 47 in relation to the third embodiment and FIG. 51 in relation to this embodiment.

In the above-mentioned manufacturing process for the semiconductor device 1e, neither Step S2 nor Step S5 (film member 8a, 8b placement steps) is carried out. The same manufacturing process for the semiconductor device 1e, except for the foregoing, is carried out up to Step S8 (curing step for the bonding materials 7a, 7b).

As illustrated in FIG. 62, the heat conduction sheet 71 is placed (mounted, stuck to) over the first portion 25a of each drain terminal portion 25 of the lead frame 21 at Step S21 as in the third embodiment. This modification to the fourth embodiment is different from the third embodiment in that: the heat conduction sheet 71 is stuck to over the first portion 25a of each drain terminal portion 25, not over the source terminal portion 23 or the drain terminal portion 24. The heat conduction sheet 71 is stuck so that the under surface 71b of the heat conduction sheet 71 is brought into contact with the second principal surface 35f of the first portion 25a of each drain terminal portion 25 of the lead frame 21. It is desirable that the stuck heat conduction sheet 71 should embrace the first portion 25a of a drain terminal portion 25 on a plane. As a result, the radiation performance of the semiconductor device can be further enhanced.

Step S9a, or the molding step, is carried out to form the encapsulation resin section 6 as in the third embodiment.

The molding step in this embodiment is different from that in the third embodiment in the following respects. When the lead frames 21, 22 are clamped between the above-mentioned dies 41, 42, the following are brought into contact (close contact) with the top surface 42a of the die 42: the first principal surface 35g of the second portion of each drain terminal portion 25 of the lead frame 21; the first principal surface (surface that becomes the under surface 14f of the gate terminal 4 later) of each gate terminal portion 24 of the lead frame 22; and the first principal surface 33f of each source terminal portion 23 of the lead frame 22. The heat conduction sheet 71 exists between the under surface 41a of the die 41 and the first portion 25a of each drain terminal portion 25 of the lead frame 21. In other respects, Step S9a, or the molding step, is carried out as in the third embodiment. For this reason, the encapsulation resin section 6 is formed with the heat conduction sheet 71 crushed (shrunken) in the direction of thickness between the first portion 25a of each drain terminal portion 25 and the die 41.

The subsequent steps are the same as in the above-mentioned manufacturing process (steps corresponding to Steps S10 and S11) for the semiconductor device 1e and the description thereof will be omitted here.

The thus manufactured semiconductor device illustrated in FIG. 63 is different from the semiconductor device 1e illustrated in FIG. 49 to FIG. 52 in the following respects. The way terminals are exposed at the back surface 6b of the encapsulation resin section 6 is the same as that in the semiconductor device 1e. At the top surface 6a of the encapsulation resin section 6, however, the drain terminal 5 is not exposed but the heat conduction sheet 71 is exposed as in the third embodiment. The top surface 15f of the first portion 5a of the drain terminal 5 is in close contact with the under surface 71b of the heat conduction sheet 71. The top surface 6a of the encapsulation resin section 6 and the top surface 71a of the heat conduction sheet 71 are not flush with each other. The top surface 71a of the heat conduction sheet 71 is slightly protruded from the top surface 6a of the encapsulation resin section 6. The reason for this protrusion is the same as the reason described with respect to the third embodiment. The other configurations of the semiconductor device in FIG. 63 are substantially the same as those of the semiconductor device 1e illustrated in FIG. 49 to FIG. 52 and the description thereof will be omitted here.

Also in case of such a drain top-type semiconductor device as in this embodiment, substantially the same effect as in the third embodiment can be obtained by applying the same technique as in the third embodiment. (The technique includes use of the heat conduction sheet 71 and giving a twist to the molding step.)

Fifth Embodiment

In this embodiment, multiple resin sealed semiconductor devices (semiconductor packages) with conductors (terminals) exposed at the top and under surfaces, described with respect to the first to fourth embodiments, are stacked. Description will be given to a technique for stacking them.

Figure 64:
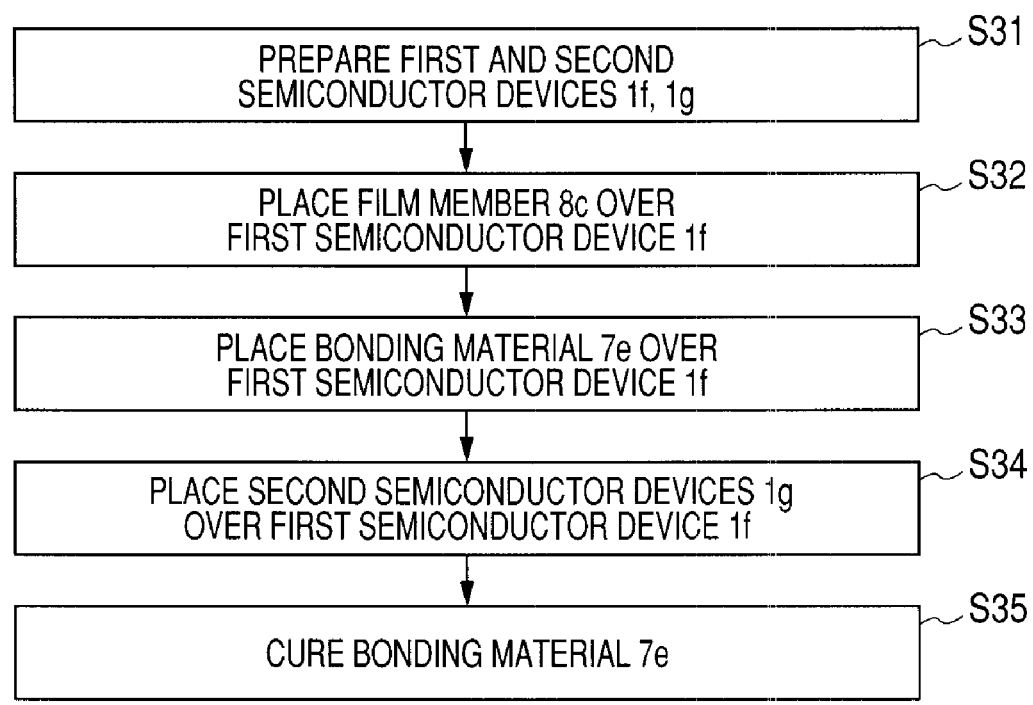
FIG. 64 is a process flowchart illustrating a manufacturing process for a semiconductor device in a fifth embodiment of the invention.
Figure 65:
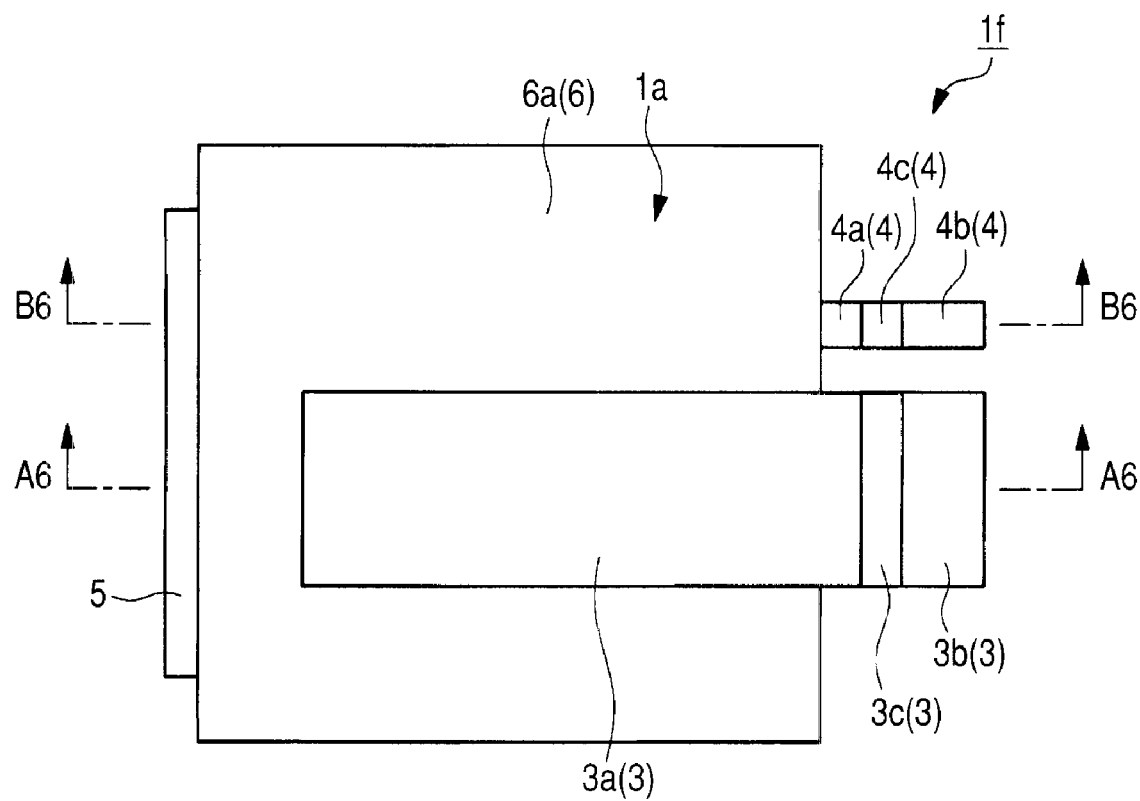
FIG. 65 is a top view of a first semiconductor device used to manufacture a semiconductor device in the fifth embodiment of the invention.
Figure 66:
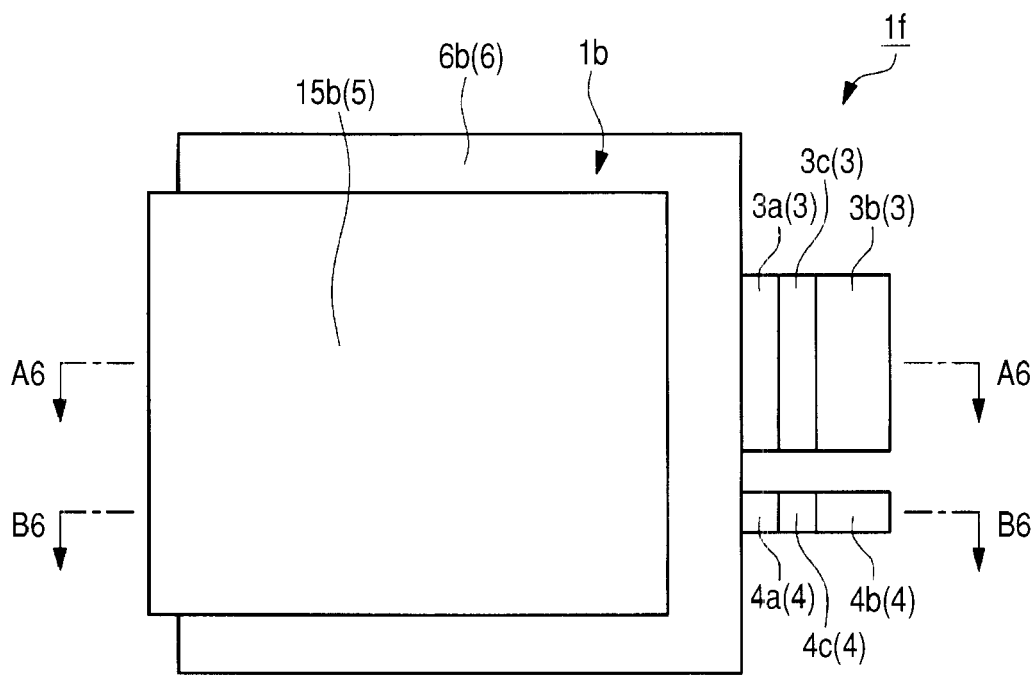
FIG. 66 is a bottom view of the first semiconductor device in FIG. 65.
Figure 67:
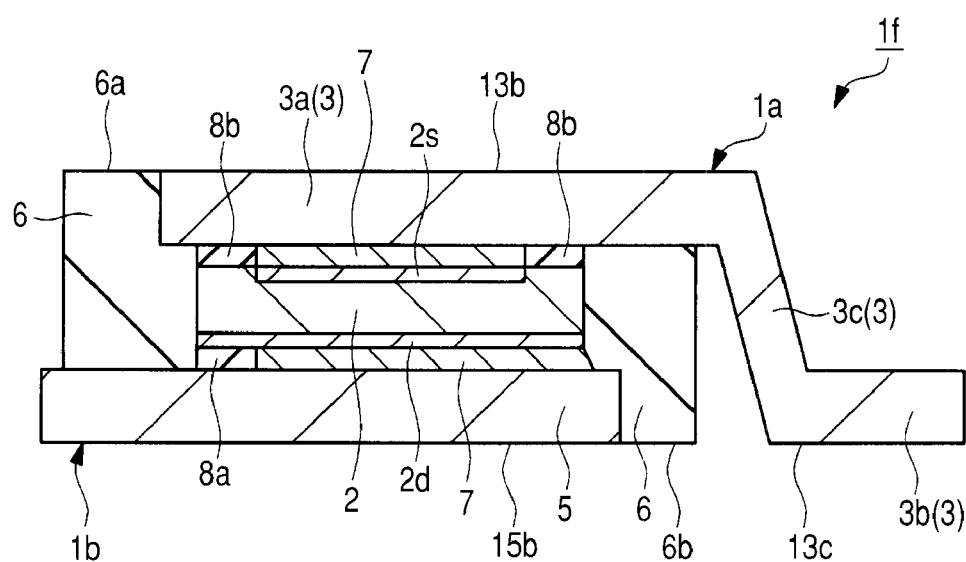
FIG. 67 is a sectional view of the first semiconductor device in FIG. 65.
Figure 68:
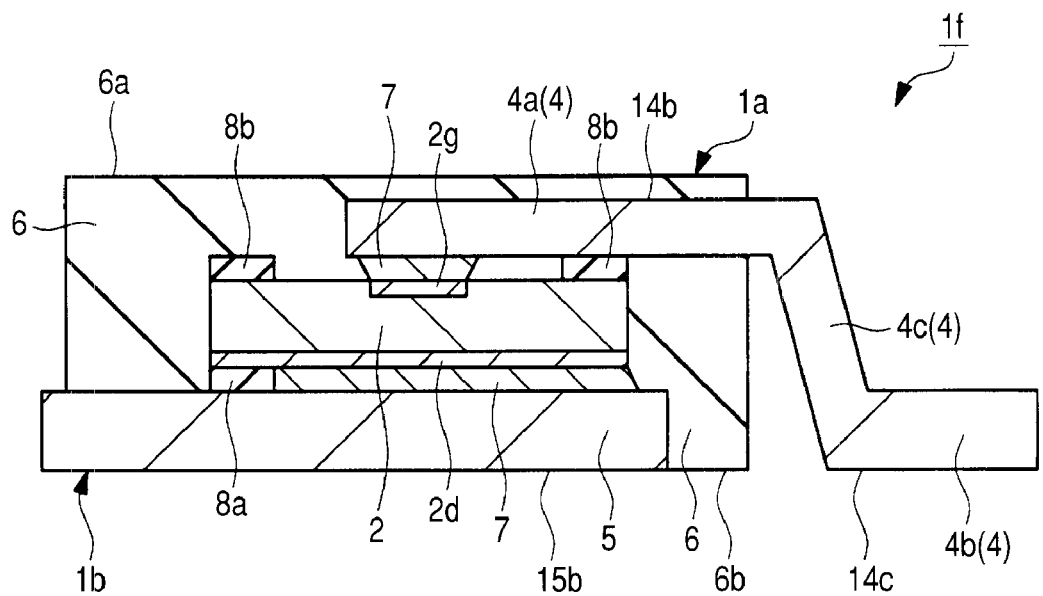
FIG. 68 is another sectional view of the first semiconductor device in FIG. 65.
Figure 69:
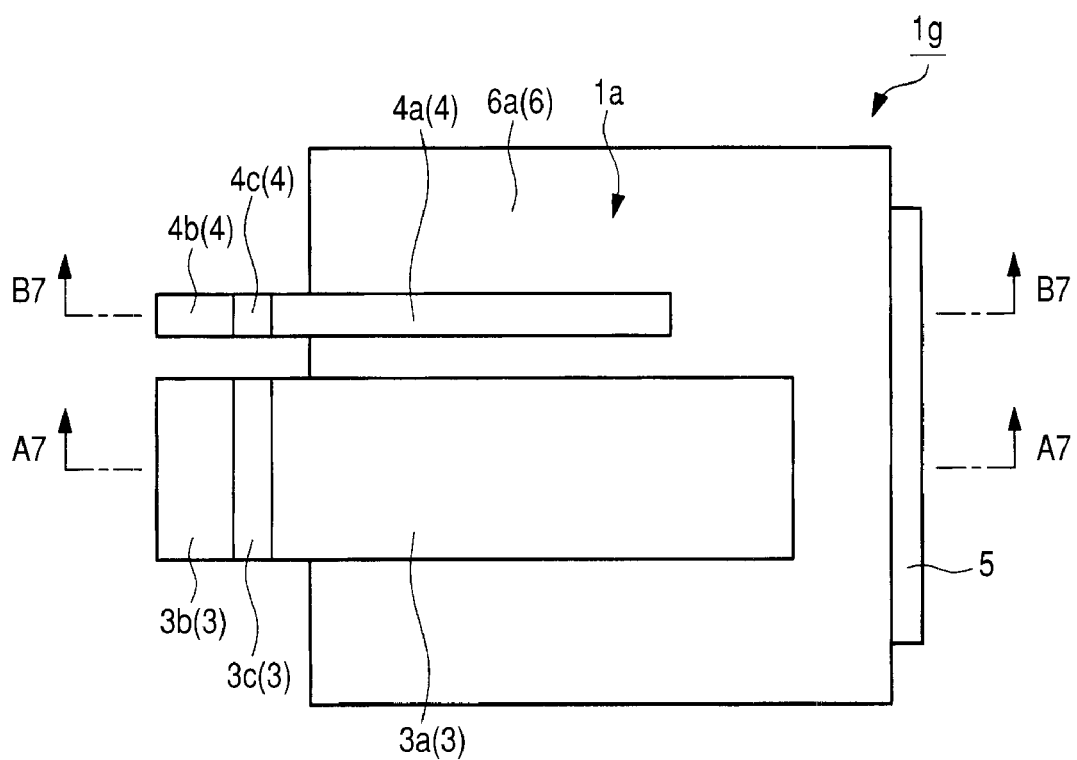
FIG. 69 is a top view of a second semiconductor device used to manufacture the semiconductor device in the fifth embodiment of the invention.
Figure 70:
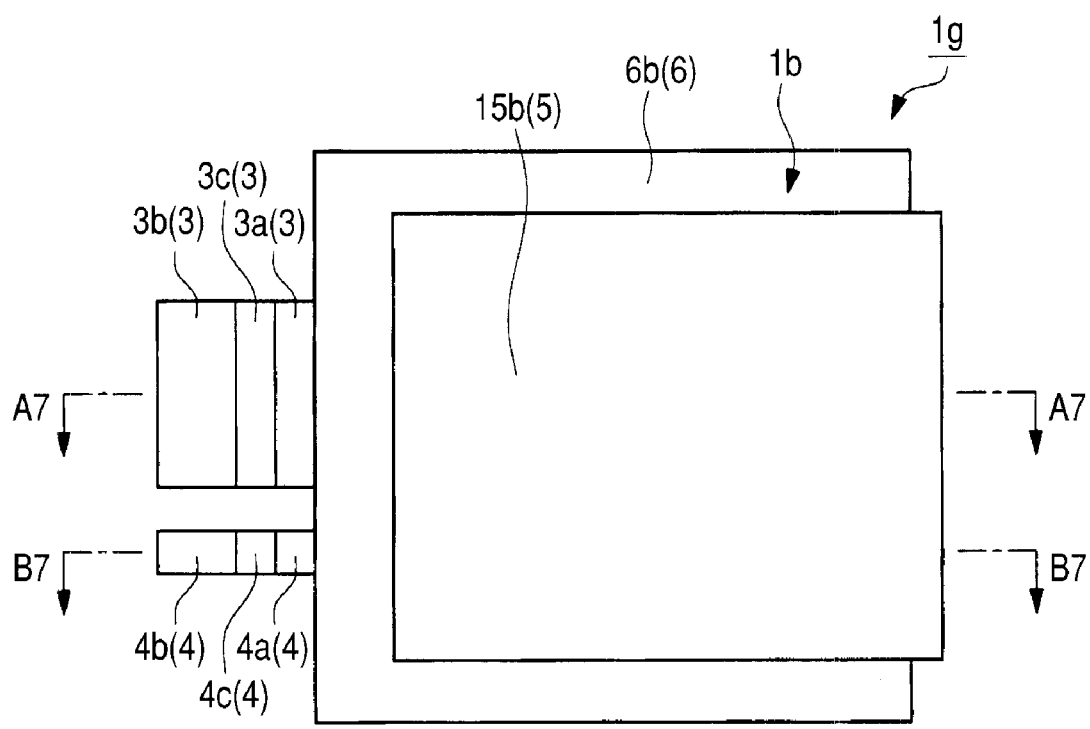
FIG. 70 is a bottom view of the second semiconductor device in FIG. 69.
Figure 71:
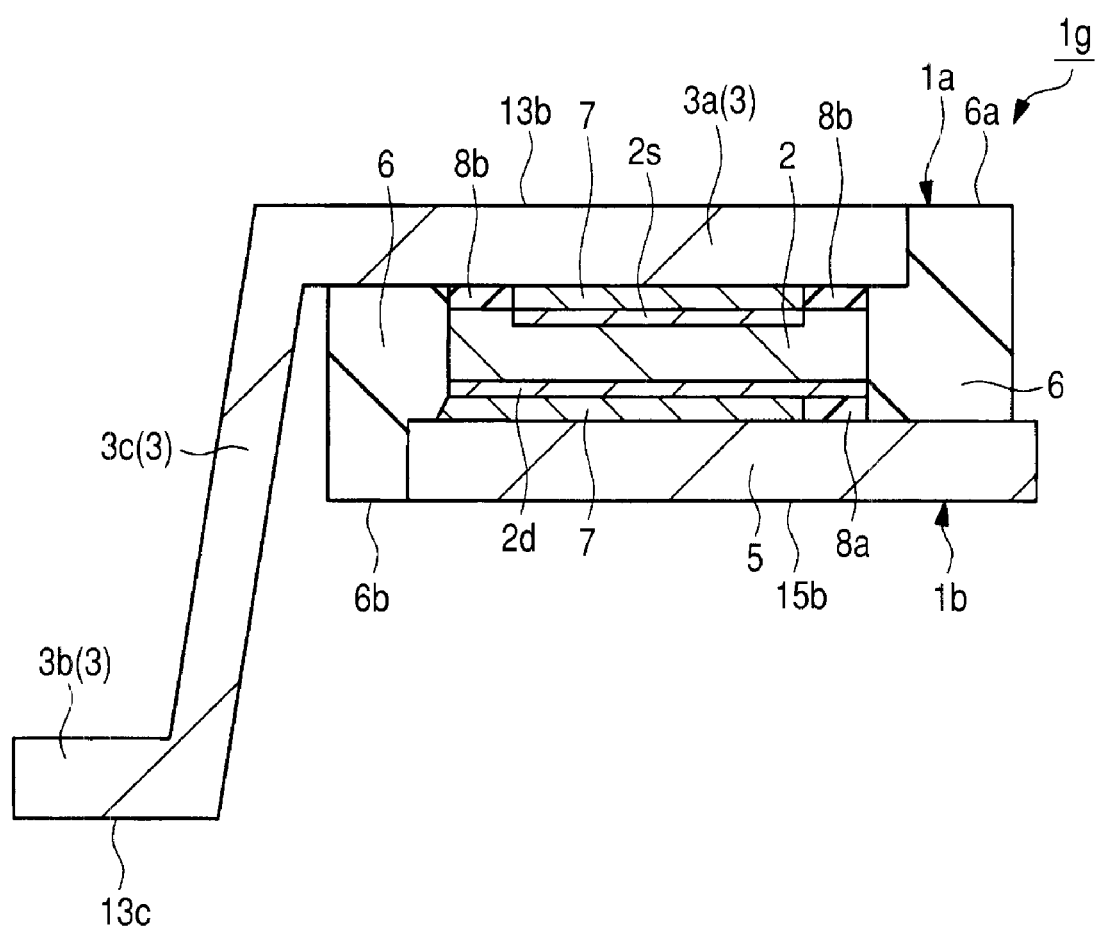
FIG. 71 is a sectional view of the second semiconductor device in FIG. 69.
Figure 72:
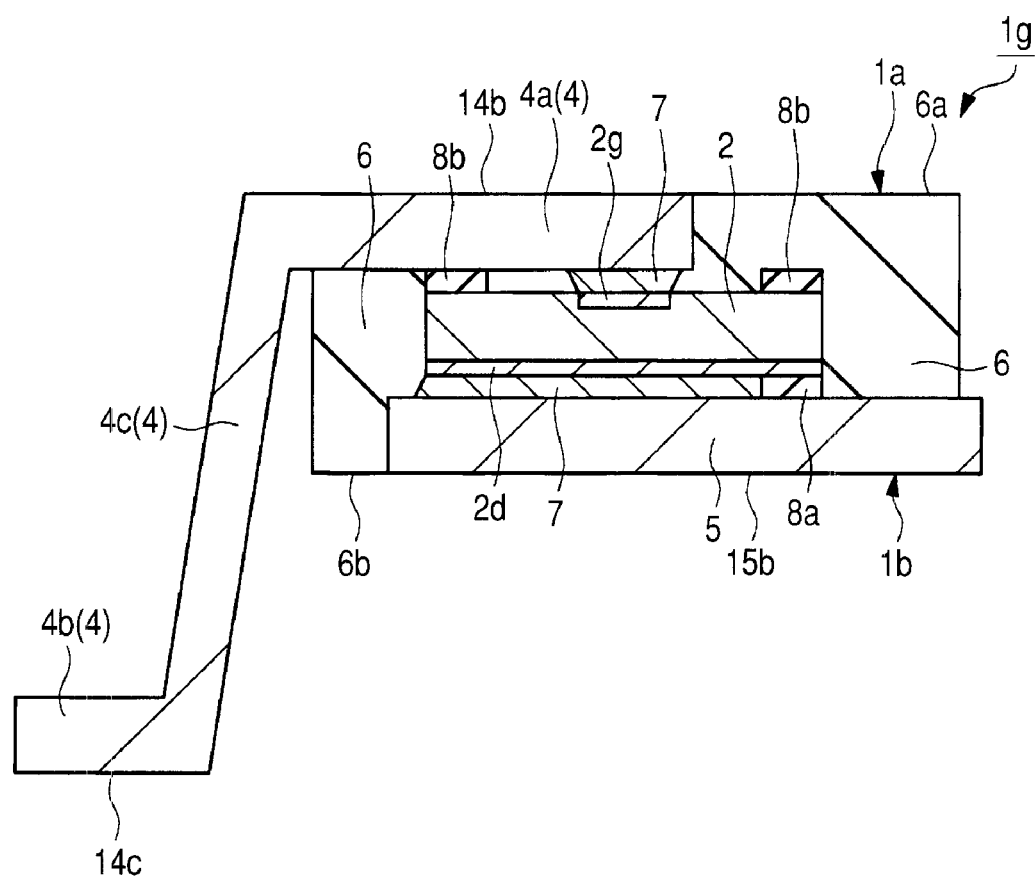
FIG. 72 is another sectional view of the second semiconductor device in FIG. 69.
Figure 73:
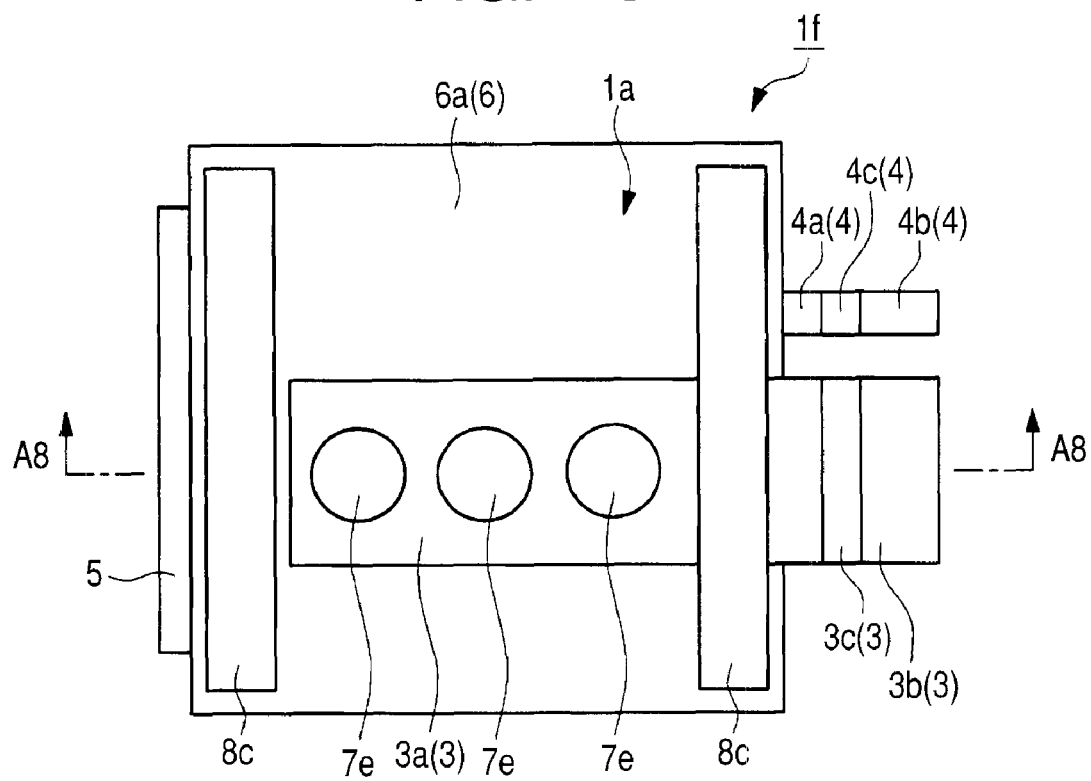
FIG. 73 is a plan view of a semiconductor device in the fifth embodiment of the invention in the manufacturing process.
Figure 74:
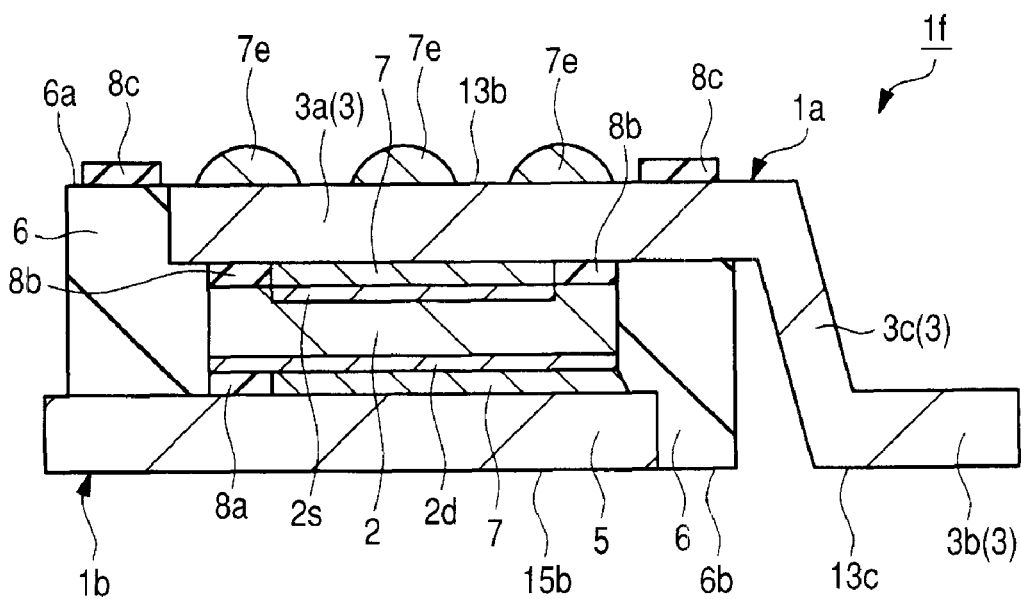
FIG. 74 is a sectional view of the same semiconductor device as in FIG. 73 in the manufacturing process.
Figure 75:
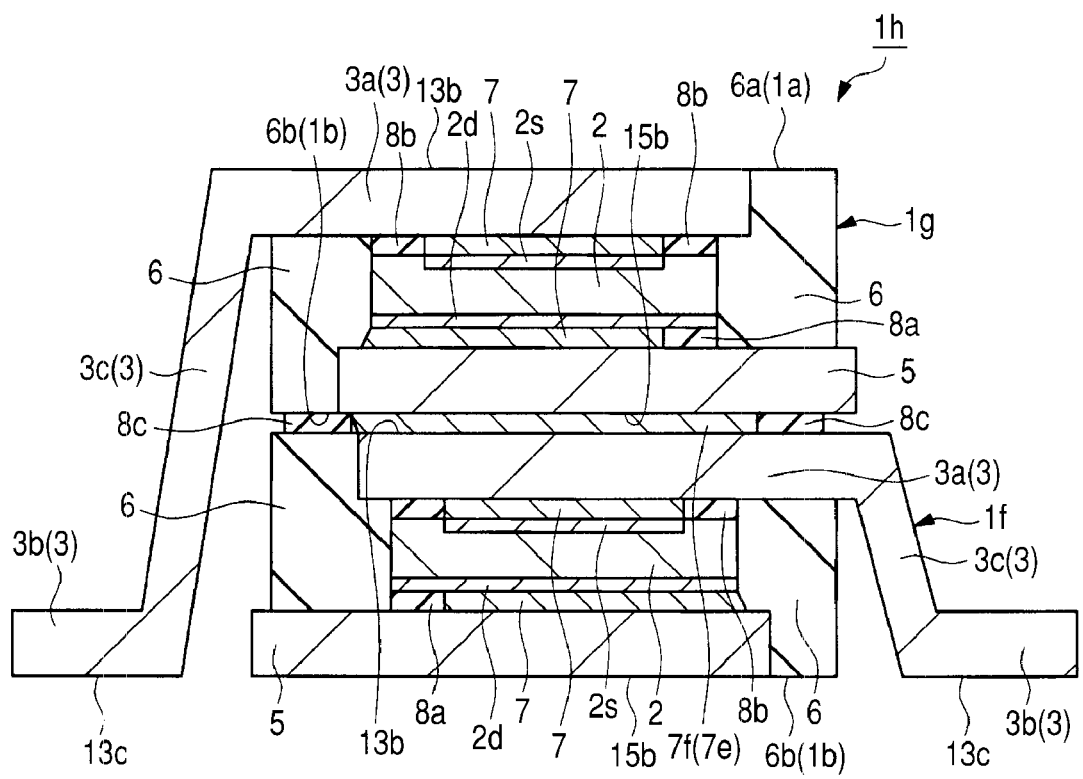
FIG. 75 is a sectional view of a semiconductor device in the fifth embodiment of the invention in the manufacturing process.
Figure 76:
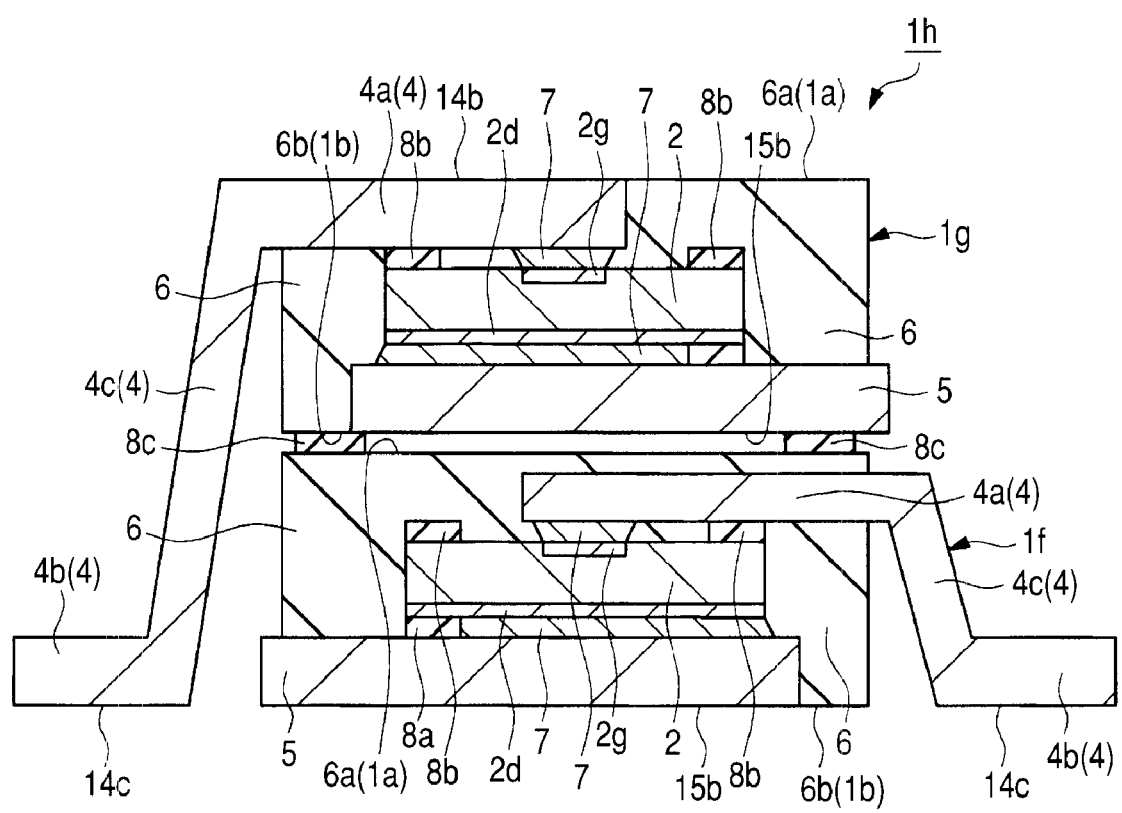
FIG. 76 is another sectional view of a semiconductor device in the fifth embodiment of the invention in the manufacturing process.

FIG. 64 is a process flowchart illustrating the manufacturing process for the semiconductor device 1h in this embodiment. FIG. 65 is a top view of a first semiconductor device 1f used to manufacture a semiconductor device 1h in this embodiment; FIG. 66 is a bottom view of the first semiconductor device 1f; and FIG. 67 and FIG. 68 are sectional views (side surface sectional views) of the first semiconductor device 1f. The sectional view taken along line A6-A6 of FIG. 65 and FIG. 66 corresponds to FIG. 67 and the sectional view taken along line B6-B6 of FIG. 65 and FIG. 66 corresponds to FIG. 68. FIG. 69 is a top view of a second semiconductor device 1g used to manufacture the semiconductor device 1h in this embodiment; FIG. 70 is a bottom view of the second semiconductor device 1g; and FIG. 71 and FIG. 72 are sectional views (side surface sectional views) of the second semiconductor device 1g. The sectional view taken along line A7-A7 of FIG. 69 and FIG. 70 corresponds to FIG. 71 and the sectional view taken along line B7-B7 of FIG. 69 and FIG. 70 corresponds to FIG. 72. The drawings from FIG. 73 to FIG. 76 are a substantial part plan view or substantial part sectional views illustrating the semiconductor device 1h in this embodiment in the manufacturing process. Of these drawings, FIG. 73 is a plan view and the drawings from FIG. 74 to FIG. 76 are sectional views. FIG. 73 and FIG. 74 correspond to an identical process step and FIG. 75 and FIG. 76 are different sectional views of an identical process step. The sectional view taken along line A8-A8 of FIG. 73 corresponds to FIG. 74. FIG. 75 is a sectional view in the same position (sectional position) as in FIG. 67, FIG. 71, and FIG. 74 and FIG. 76 is a sectional view in the same position (sectional position) as in FIG. 68 and FIG. 72.

The first semiconductor device 1f used to manufacture the semiconductor device 1h in this embodiment has the structure illustrated in FIG. 65 to FIG. 68. The first semiconductor device 1f is different from the semiconductor device 1 in the first embodiment in the following respects.

The stepped portion 3c and second portion 3b of the source terminal 3 and the stepped portion 4c and second portion 4b of the gate terminal 4 are protruded from a side surface of the encapsulation resin section 6. At the top surface 6a of the encapsulation resin section 6, the top surface 13b of the first portion 3a of the source terminal 3 is exposed but the gate terminal 4 (top surface 14b of the first portion 4a thereof) is not exposed. The first portion 4a of the gate terminal 4 is thinner than the first portion 3a of the source terminal 3. The other configurations of the first semiconductor device 1f are substantially the same as those of the semiconductor device 1 in the first embodiment and the description thereof will be omitted here.

The first semiconductor device 1f of such structure can be manufactured substantially similarly with the semiconductor device 1 in the first embodiment. However, the manufacturing process for the first semiconductor device 1f is different from that for the semiconductor device 1 in the following respects.

A lead frame in which each source terminal portion 23 and gate terminal portion 24 are flat is used for the lead frame 22. (The same lead frame as in the first embodiment is used for the lead frame 21.) After the lead frames 21, 22 are cut at Step S11, the following procedure is followed: the source terminal 3 and gate terminal 4 protruded from the side surface of the encapsulation resin section 6 are bent; and the stepped portion 3c and second portion 3b of the source terminal 3 and the stepped portion 4c and second portion 4b of the gate terminal 4 are thereby formed. As a result, the stepped portion 3c and second portion 3b of the source terminal 3 and the stepped portion 4c and second portion 4b of the gate terminal 4 are formed outside the encapsulation resin section 6, not inside the encapsulation resin section 6. In the lead frame 22, at least the first portion 4a of each gate terminal 4 is made thinner than the first portion 3a of each source terminal 3. Thus, when the encapsulation resin section 6 is formed at Step S9, or the molding step, the following structure can be obtained: a structure in which at the top surface 6a of the encapsulation resin section 6, the top surface 13b of the first portion 3a of the source terminal 3 is exposed but the gate terminal 4 (the top surface 14b of the first portion 4a thereof) is not exposed. In other respects, the manufacturing process for the first semiconductor device 1f is substantially the same as that for the semiconductor device 1 in the first embodiment and the description thereof will be omitted here.

In the first semiconductor device If, it is desirable that the following should be formed substantially flush: the under surface 15b of the drain terminal 5 exposed at the back surface 6b of the encapsulation resin section 6; the under surface 13c of the second portion 3b of the source terminal 3; and the under surface 14c of the second portion 4b of the gate terminal 4.

In the manufacturing process, described later, for the semiconductor device 1h, the following are joined and electrically coupled together through bonding material 7f (7e): the top surface 13b of the first portion 3a of the source terminal 3 exposed at the top surface 1a of the first semiconductor device If (the top surface 6a of the encapsulation resin section 6); and the under surface 15b of the drain terminal 5 exposed at the back surface 1b of the second semiconductor device 1g, described next (the back surface 6b of the encapsulation resin section 6).

The second semiconductor device 1g used to manufacture the semiconductor device 1h in this embodiment has the structure illustrated in FIG. 69 to FIG. 72. The second semiconductor device 1g is different from the semiconductor device 1 in the first embodiment in the following respects.

The stepped portion 3c and second portion 3b of the source terminal 3 and the stepped portion 4c and second portion 4b of the gate terminal 4 are protruded from a side surface of the encapsulation resin section 6. The following differences in height are larger than in the semiconductor device 1 in the first embodiment: the difference in height between the first portion 3a and second portion 3b of the source terminal 3 and the difference in height between the first portion 4a and second portion 4b of the gate terminal 4. (The former difference in height is equivalent to the height of the step formed by the stepped portion 3c.) (The latter difference in height is equivalent to the height of the step formed by the stepped portion 4c.) As a result, the following are positioned lower than the back surface 6b of the encapsulation resin section 6 by an amount equivalent to the height of the first semiconductor device 1f: the under surface 13c of the second portion 3b of the source terminal 3 and the under surface 14c of the second portion 4b of the gate terminal 4. The other configurations of the second semiconductor device 1g are substantially the same as those of the semiconductor device 1 in the first embodiment and the description thereof will be omitted here.

The second semiconductor device 1g of such structure can be manufactured substantially similarly with the semiconductor device 1 in the first embodiment. However, the manufacturing process for the second semiconductor device 1g is different from that for the semiconductor device 1 in the following respects.

A lead frame in which each source terminal portion 23 and gate terminal portion 24 are flat is used for the lead frame 22. (The same lead frame as in the first embodiment is used for the lead frame 21.) After the lead frames 21, 22 are cut at Step S11, the following procedure is followed: the source terminal 3 and gate terminal 4 protruded from the side surface of the encapsulation resin section 6 are bent; and the stepped portion 3c and second portion 3b of the source terminal 3 and the stepped portion 4c and second portion 4b of the gate terminal 4 are thereby formed. As a result, the stepped portion 3c and second portion 3b of the source terminal 3 and the stepped portion 4c and second portion 4b of the gate terminal 4 are formed outside the encapsulation resin section 6, not inside the encapsulation resin section 6. In other respects, the manufacturing process for the second semiconductor device 1g is substantially the same as that for the semiconductor device 1 in the first embodiment and the description thereof will be omitted here.

Using the first semiconductor device 1f and second semiconductor device 1g mentioned above, the semiconductor device 1h in this embodiment is manufactured as follows:

First, the first semiconductor device 1f and second semiconductor device 1g mentioned above are prepared (Step 31).

As illustrated in FIG. 73 and FIG. 74, a film member (film for bonding) 8c is placed (mounted, stuck to) over the first semiconductor device 1f (Step S32). More specific description will be given. At Step S32, the film member 8c is placed over the top surface 1a of the first semiconductor device 1f. The top surface 1a of the semiconductor device 1f is the principal surface on the side of the front surface 6a of the encapsulation resin section 6. The film member 8c is the same as the film member 8c used in the first embodiment and the description thereof will be omitted here.

As seen from FIG. 73, it is desirable that the following measure should be taken: the film member 8c is placed in the peripheral portion of the top surface 1a of the first semiconductor device 1f, not in the central portion of the top surface 1a of the first semiconductor device 1f. This makes it possible to reduce overlap with the film member 8c and the exposed source terminal 3 as much as possible at the top surface 1a of the first semiconductor device 1f. As a result, it is possible to hold mainly the bonding material 7f, high in electrical conductivity and adhesion, responsible for the following: the junction between the source terminal 3 of the first semiconductor device 1f and the drain terminal 5 of the second semiconductor device 1g mounted later.

As seen from FIG. 73, it is more desirable that multiple film members 8c should be placed on the top surface 1a of the first semiconductor device 1f. In the example in FIG. 73, two film members 8c are placed. At this time, it is more desirable that the following measure should be taken as illustrated in FIG. 73: the film members 8c are placed in positions along two opposite sides of the top surface 1a of the first semiconductor device 1f. This makes it possible to enhance the parallelism between the first semiconductor device 1f and the second semiconductor device 1g mounted later.

Bonding material 7e is placed over the first semiconductor device 1f (Step S33). At Step S33, specifically, the bonding material 7e is placed (applied to) over the top surface 1a of the first semiconductor device 1f. The bonding material 7e is a conductive bonding material, a paste-like bonding material, and preferably solder paste or silver paste. At Step S33, the bonding material 7e is placed or applied in the following area of the top surface 1a of the first semiconductor device 1f: an area over the surface where the source terminal 3 is exposed (that is, the top surface 13b of the first portion 3a of the source terminal 3) where no film member 8c is placed. FIG. 73 and FIG. 74 illustrate a state in which the steps up to Step S33, or the bonding material 7e placement step, have been carried out.

As illustrated in FIG. 75 and FIG. 76, the second semiconductor device 1g is placed (mounted) over the first semiconductor device 1f (Step S34). At Step S34, specifically, the second semiconductor device 1g is placed (mounted) over the top surface 1a of the first semiconductor device 1f so that the following is implemented: the top surface 1a of the second semiconductor device 1g (the top surface 6a of the encapsulation resin section 6) faces upward; and the back surface 1b of the second semiconductor device 1g (the back surface 6b of the encapsulation resin section 6) is opposed to the top surface 1a of the first semiconductor device 1f (the top surface 6a of the encapsulation resin section 6). As a result, the second semiconductor device 1g is placed (mounted) over the top surface 1a of the first semiconductor device 1f with the bonding material 7e and the film member 8c in-between. The second semiconductor device 1g is temporarily fixed by the adhesion (adherence) of either or both of the bonding material 7e and the film member 8c.

The bonding material 7e is cured (Step S35). When the bonding material 7e is solder paste, solder reflow is carried out at Step S35 to melt and solidify (re-solidify) the bonding material 7e. When the bonding material 7e is silver paste, heat treatment for curing the silver paste is carried out at Step S35 to cure the bonding material 7e.

As the result of the curing step, Step S35, for the bonding material 7e, the following are joined and electrically coupled together through the bonding material 7f (the cured bonding material 7e) as illustrated in FIG. 75 and FIG. 76: the first portion 3a of the source terminal 3 of the first semiconductor device 1f positioned on the lower side; and the drain terminal 5 of the second semiconductor device 1g positioned on the upper side.

The bonding material 7f is the bonding material 7e cured by the processing of Step S35. When the bonding material 7e is solder paste, the bonding material 7e comprised of solder paste is melted and solidified by the solder reflow at Step S35 and turned into the bonding material 7f comprised of solder. When the bonding material 7e is silver paste, the bonding material 7e comprised of silver paste is cured by the heat treatment of Step S35 and turned into the bonding material 7f comprised of the cured silver paste.

The film member 8c is also cured by heat treatment at the curing step, Step S35, for the bonding material 7e. The cured film member 8c contributes to the junction (bonding) between the following: the back surface 1b of the second semiconductor device 1g (the back surface 6b of the encapsulation resin section 6) positioned on the upper side; and the top surface 1a of the first semiconductor device 1f (the top surface 6a of the encapsulation resin section 6) positioned on the lower side. For this reason, the film member 8c can be regarded as a film for bonding (film-type adhesive, film-type bonding material).

When solder is used as the bonding material 7 in either or both of the first semiconductor device 1f and the second semiconductor device 1g (bonding material 7 for joining the semiconductor chips 2 and terminals), it is desirable to take some measure to: prevent the bonding material 7 from being melted during heat treatment at the curing step, Step S35, for the bonding material 7e. This can be accomplished by taking the following measure: the melting point of solder used as the bonding material 7 in the first semiconductor device 1f and the second semiconductor device 1g is made higher than the heat treatment temperature (maximum temperature in heat treatment) at the curing step, Step S35, for the bonding material 7e. This makes it possible to prevent the following state from changing during the curing step, Step S35, for the bonding material 7e: the state of junction between the semiconductor chips 2 and terminals by the bonding material 7 in the first semiconductor device 1f and the second semiconductor device 1g. As a result, the reliability of coupling can be further enhanced.

When the bonding material 7e is solder paste, the following processing may be carried out after solder reflow is carried out at the curing step, Step S35, for the bonding material 7e: cleaning may be carried out to remove flux and the like as required.

Thus the semiconductor device 1h in this embodiment is manufactured.

In the semiconductor device 1h in this embodiment, the following become terminals for external coupling and are preferably formed substantially flush: the under surface 15b of the drain terminal 5, the under surface 13c of the second portion 3b of the source terminal 3, and the under surface 14c of the second portion 4b of the gate terminal 4 of the first semiconductor device 1f positioned on the lower side; and the under surface 13c of the second portion 3b of the source terminal 3 and the under surface 14c of the second portion 4b of the gate terminal 4 of the second semiconductor device 1g positioned on the upper side. For this reason, the semiconductor device 1h is a surface mount semiconductor device (semiconductor package).

The first portion 3a of the source terminal 3 of the first semiconductor device 1f positioned on the lower side and the drain terminal 5 of the second semiconductor device 1g positioned on the upper side are electrically coupled together through the bonding material 7f. For this reason, the following are electrically coupled together: the source pad electrode 2s of the semiconductor chip 2 of the first semiconductor device 1f positioned on the lower side; and the back surface drain electrode 2d of the semiconductor chip 2 of the second semiconductor device 1g positioned on the upper side. As a result, the source terminal 3 of the first semiconductor device 1f positioned on the lower side also functions as the drain terminal of the second semiconductor device 1g positioned on the upper side. Therefore, it is unnecessary to extend the drain terminal 5 of the second semiconductor device 1g positioned on the upper side to the mounting surface of the semiconductor device 1h (the under surface of the first semiconductor device 1f on the side of the mounting surface). Thus it is possible to couple the following in series: the MISFET formed in the semiconductor chip 2 of the first semiconductor device 1f positioned on the lower side and the MISFET formed in the semiconductor chip 2 of the second semiconductor device 1g positioned on the upper side.

The following are exposed at the top surface 1a of the second semiconductor device 1g positioned on the upper side that becomes the top surface of the semiconductor device 1h: the top surface 13b of the first portion 3a of the source terminal 3 and the top surface 14b of the first portion 4a of the gate terminal 4 of the second semiconductor device 1g positioned on the upper side. Heat produced in the internal semiconductor chips 2 can also be radiated from the top surface side of the semiconductor device 1h through these exposed portions. As a result, it is possible to enhance the heat radiation characteristic and the performance of the semiconductor device 1h.

When a film member 8c is not placed between the first semiconductor device 1f and the second semiconductor device 1g unlike this embodiment, the following takes place: the thickness of the bonding material 7f joining them together fluctuates and the height of the finished semiconductor devices 1h varies. The height of the semiconductor device 1h corresponds to the height (distance) from the under surface 1b of the first semiconductor device 1f (the under surface 6b of the encapsulation resin section 6) positioned on the lower side to the following: the top surface 1a of the second semiconductor device 1g (the top surface 6b of the encapsulation resin section 6) positioned on the upper side.

In this embodiment, meanwhile, the following takes place because the film member 8c exists between the first semiconductor device 1f and the second semiconductor device 1g: the film member 8a defines the distance (length) between the top surface 1a of the first semiconductor device 1f positioned on the lower side and the under surface 1b of the second semiconductor device 1g positioned on the upper side. The film member 8c exists between the top surface of the first semiconductor device 1f and the under surface of the second semiconductor device 1g and functions to keep the following distance substantially constant until the bonding material 7e is cured at Step S35: the distance between the top surface of the first semiconductor device 1f and the under surface of the second semiconductor device 1g.

Therefore, it is required that the film member 8c should be low in the ratio of deformation (ratio of deformation in the direction of thickness) under load (load in the direction of thickness) as compared with the bonding material 7e. That is, when the bonding material 7e and the film member 8c are placed on a plane and the same load is applied to them, it is required that the film member 8c should be less prone to be deformed than the bonding material 7e. (That is, it is required that the film member 8c should not be deformed in the direction of thickness perpendicular to the above plane.) Since the film member 8c is a film-like member, it is lower in the ratio of deformation under load as compared with the paste-like bonding material 7e. For this reason, the distance between the top surface of the first semiconductor device 1f and the under surface of the second semiconductor device 1g can be kept substantially constant by taking the following measure: not only the bonding material 7e but also the film member 8c is placed between the first semiconductor device 1f and the second semiconductor device 1g.

For this reason, the bonding material 7f formed by curing the bonding material 7e is so formed that the following is implemented: it is in contact with the first portion 3a of the source terminal 3 of the first semiconductor device 1f positioned on the lower side and the drain terminal 5 of the second semiconductor device 1g positioned on the upper side and joins them together. The film thickness thereof is defined by the film thickness of the film member 8c. Therefore, the film thickness of the bonding material 7f can be controlled to a predetermined value by adjusting the film thickness of the film member 8c. For this reason, use of the film member 8c having a predetermined film thickness makes it possible to suppress variation (fluctuation) in the film thickness of the bonding material 7f. Thus it is possible to suppress variation (fluctuation) in the height of the finished semiconductor devices 1h.

The first semiconductor device 1f and second semiconductor device 1g used to manufacture the semiconductor device 1h are manufactured substantially as in the first embodiment. Since the film members 8a, 8b are used, there is a little variation (fluctuation) in the height of each of the first semiconductor device 1f and the second semiconductor device 1g. For this reason, in this embodiment, variation in the film thickness of the bonding material 7f can be suppressed owing to the following: use of the film member 8c as well as the first semiconductor device 1f and the second semiconductor device 1g that do not vary in height so much. As a result, it is possible to appropriately suppress variation in the height of the finished semiconductor devices 1h.

Since the heights of the finished semiconductor devices 1h can be equalized, the following can be implemented when a member for heat radiation (for example, the above-mentioned radiation fin 55) is mounted over multiple semiconductor devices 1h: the state of coupling between each semiconductor device 1h and the member for heat radiation becomes even and thus the state of heat radiation in each semiconductor device 1h can be made even. Therefore, it is possible to make the heat radiation characteristic of each semiconductor device uniform and enhance the performance thereof.

Sixth Embodiment

In the fifth embodiment, multiple semiconductor devices are stacked by a technique of using such a film member as in the first embodiment together with bonding material. In the sixth embodiment, multiple semiconductor devices are stacked by a technique of using such silver paste 7c as in the second embodiment.

Figure 77:
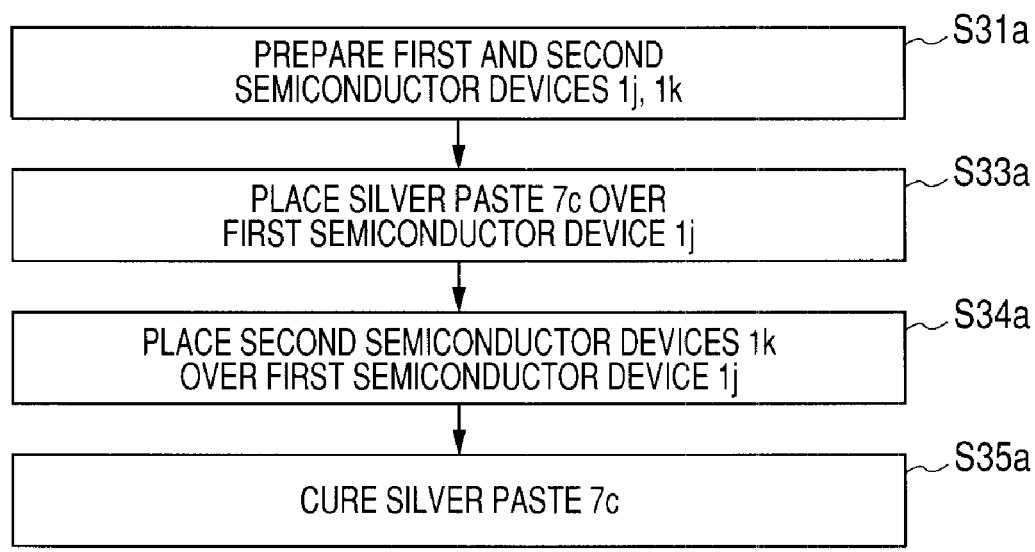
FIG. 77 is a process flowchart illustrating a manufacturing process for a semiconductor device in a sixth embodiment of the invention.
Figure 78:
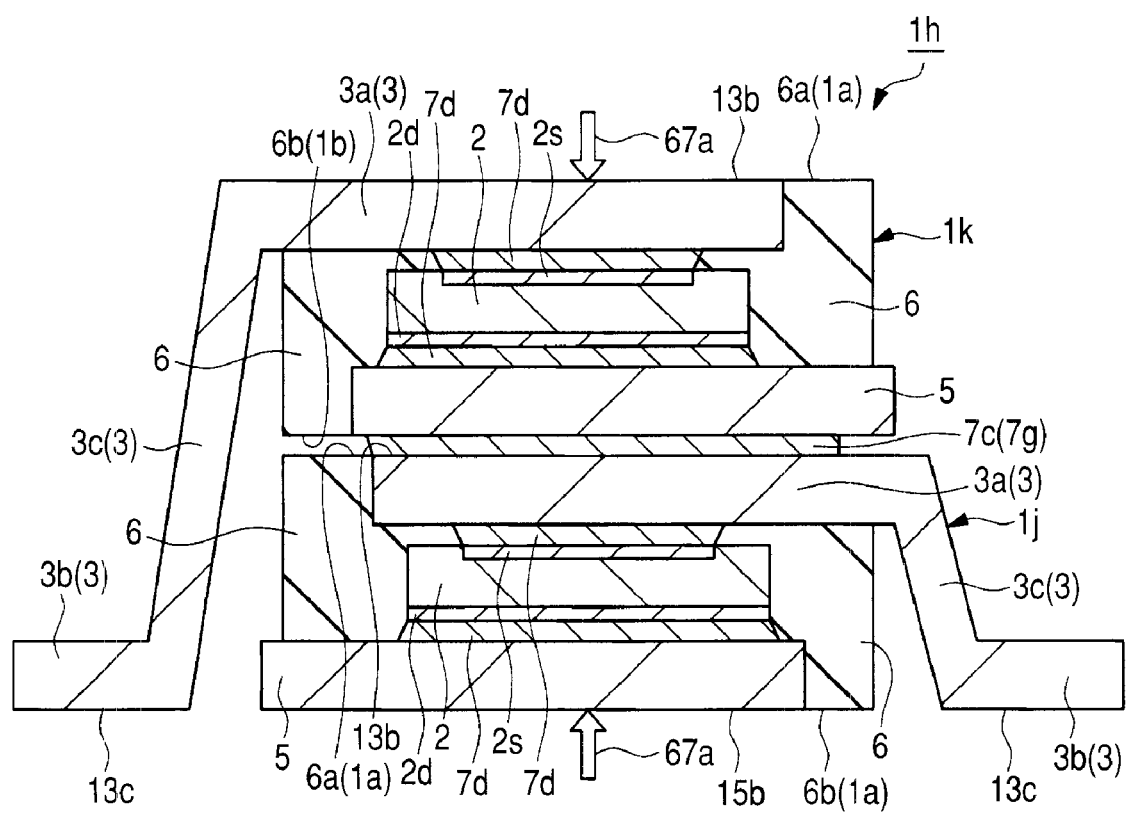
FIG. 78 is a sectional view of a semiconductor device in the sixth embodiment of the invention in the manufacturing process.

FIG. 77 is a process flowchart illustrating a manufacturing process for the semiconductor device in this embodiment. FIG. 78 is a substantial part sectional view of a semiconductor device in this embodiment in the manufacturing process.

The differences (differences in structure and manufacturing method) between the first semiconductor device 1j used to manufacture the semiconductor device in this embodiment and the semiconductor device 1c in the second embodiment are the same as the following differences: the differences between the first semiconductor device 1f described in relation to the fifth embodiment and the semiconductor device 1 in the first embodiment. Therefore, the description thereof will be omitted here. The first semiconductor device 1j, except for these differences, is substantially the same as the semiconductor device 1c in the second embodiment.

The differences (differences in structure and manufacturing method) between the second semiconductor device 1k used to manufacture the semiconductor device in this embodiment and the semiconductor device 1c in the second embodiment are the same as the following differences: the differences between the second semiconductor device 1g described in relation to the fifth embodiment and the semiconductor device 1 in the first embodiment. Therefore, the description thereof will be omitted here. The second semiconductor device 1k, except for these differences, is substantially the same as the semiconductor device 1c in the second embodiment.

Using the first semiconductor device 1j and second semiconductor device 1k mentioned above, the semiconductor device 1h in this embodiment is manufactured as follows:

First, the first semiconductor device 1j and second semiconductor device 1k mentioned above are prepared (Step 31a).

As illustrated in FIG. 78, silver paste 7c is placed over the first semiconductor device 1j (Step S33a). More specific description will be given. At Step S33a, the silver paste 7c is placed or applied to over the following: the top surface 13b of the first portion 3a of the source terminal 3 exposed at the top surface 1a of the first semiconductor device 1j (the top surface 6a of the encapsulation resin section 6). The silver paste 7c is the same as that used in the second embodiment and the description thereof will be omitted here.

The second semiconductor device 1k is placed (mounted) over the first semiconductor device 1j (Step S34a). At Step S34a, specifically, the second semiconductor device 1k is placed (mounted) over the top surface 1a of the first semiconductor device 1j so that the following is implemented: the top surface 1a of the second semiconductor device 1k (the top surface 6a of the encapsulation resin section 6) faces upward; and the back surface 1b of the second semiconductor device 1k (the back surface 6b of the encapsulation resin section 6) is opposed to the top surface 1a of the first semiconductor device 1j (the top surface 6a of the encapsulation resin section 6). As a result, the second semiconductor device 1k is placed (mounted) over the top surface 1a of the first semiconductor device 1j with the silver paste 7c in-between and is temporarily fixed by the adhesion (adherence) of the silver paste 7c.

The silver paste 7c is cured (Step S35a). That is, at Step S35a, heat treatment for curing is carried out to cure the silver paste 7c.

Based on the concept behind the curing step, Step S8a, for the silver paste 7c in the second embodiment, the following measure is taken also at the curing step, Step 35a, for the silver paste 7c in this embodiment: the silver paste 7c is cured (subjected to heat treatment for curing) while pressure (load) is applied to between the second semiconductor device 1k positioned on the upper side and the first semiconductor device 1j positioned on the lower side with the silver paste 7c in-between. In FIG. 78, this pressure (load) is schematically indicated by an arrow 67a and the direction of the arrow 67a is equivalent to the direction of the application of pressure (load). For example, while the structure in FIG. 78 is held from above and below using such an object as the above mentioned retaining jig 60, the silver paste 7c can be cured (subjected to heat treatment for curing). (This structure is obtained by mounting the second semiconductor device 1k over the first semiconductor device 1j with the silver paste 7c in-between.) At Step S35a (curing step for the silver paste 7c), specifically, the silver paste 7c is cured while the following operation is performed: the first semiconductor device 1j and the second semiconductor device 1k with the silver paste 7c sandwiched therebetween are held by such an object as the above-mentioned retaining jig 60 (pressure is applied thereto).

The cured silver paste 7c becomes bonding material 7g. The following are joined and electrically coupled together by this bonding material 7g (cured silver paste 7c): the first portion 3a of the source terminal 3 of the first semiconductor device 1f positioned on the lower side and the drain terminal 5 of the second semiconductor device 1g positioned on the upper side.

Thus the semiconductor device in this embodiment is manufactured. The function of each terminal and the relation of coupling in the manufactured semiconductor device are the same as in the semiconductor device 1h in the fifth embodiment and the description thereof will be omitted here.

In this embodiment, the following measure is taken to join the second semiconductor device 1k over the first semiconductor device 1j: the silver paste 7c is used and heat treatment is carried out to cure the silver paste 7c while pressure (load) is applied. For this reason, the bonding material 7g formed by curing the silver paste 7c is so formed that the following is implemented: it is in contact with the first portion 3a of the source terminal 3 of the first semiconductor device 1j positioned on the lower side and the drain terminal 5 of the second semiconductor device 1k positioned on the upper side and joins them together. The film thickness thereof becomes substantially equal to the particle size (diameter) of the above-mentioned spacer particles 66 in the silver paste 7c. The reason for this is the same as the reason described with respect to the bonding material 7d in relation to the second embodiment. For this reason, the film thickness of the bonding material 7g can be controlled to a predetermined value by matching the particle size of the spacer particles 66 blended in the silver paste 7c with a desired thickness of the bonding material 7g. Further, variation (fluctuation) in the film thickness of the bonding material 7g can be suppressed by taking the same measure. As a result, it is possible to suppress variation (fluctuation) in the height of the manufactured semiconductor device (obtained by stacking the second semiconductor device 1k over the first semiconductor device 1j).

Since the heights of the finished semiconductor devices can be equalized, the following can be implemented when a member for heat radiation (for example, the above-mentioned radiation fin 55) is mounted over multiple semiconductor devices: the state of coupling between each semiconductor device and the member for heat radiation becomes even and thus the state of heat radiation in each semiconductor device can be made even. Therefore, it is possible to make the heat radiation characteristic of each semiconductor device uniform and enhance the performance thereof.

The first semiconductor device 1j and the second semiconductor device 1k are manufactured substantially as in the second embodiment and there is a little variation (fluctuation) in the height of each of the first semiconductor device 1j and the second semiconductor device 1k. For this reason, in this embodiment, it is possible to use the first semiconductor device 1j and second semiconductor device 1k that do not vary in height so much and suppress variation in the film thickness of the bonding material 7g joining them together. As a result, it is possible to appropriately suppress variation in the height of the finished semiconductor devices (obtained by stacking the second semiconductor device 1k over the first semiconductor device 1j).

In this embodiment, the first semiconductor device 1f used in the fifth embodiment may be used in place of the first semiconductor device 1j. In this embodiment, the second semiconductor device 1g used in the fifth embodiment may be used in place of the second semiconductor device 1k. In the fifth embodiment, the first semiconductor device 1j used in this embodiment may be used in place of the first semiconductor device if. In the fifth embodiment, the second semiconductor device 1k used in this embodiment may be used in place of the second semiconductor device 1g.

In the description of this embodiment and the fifth embodiment, cases where two semiconductor devices are stacked have been taken as examples. (In this embodiment, the first semiconductor device 1j and the second semiconductor device 1k are stacked and in the fifth embodiment, the first semiconductor device 1f and the second semiconductor device 1g are stacked.) However, the number of stacked semiconductor devices only has to be two or more (that is, a plural number).

This embodiment and the fifth embodiment are obtained by stacking and joining together multiple resin sealed semiconductor devices having exposed conductors at the top and under surfaces of the encapsulation resin section 6. (Such semiconductor devices include the first semiconductor devices 1f, 1j and the second semiconductor devices 1g, 1k.) For this reason, the thermal resistance and the inductance can be reduced. Further, it is possible to reduce the mounting area (the area of a mounting board) as compared with cases where the first semiconductor devices 1f, 1j and the second semiconductor devices 1g, 1k are individually mounted over a mounting board or the like.

The semiconductor devices stacked in this embodiment and the fifth embodiment need not be the first semiconductor device 1f or 1j or the second semiconductor device 1g or 1k. They only have to be resin sealed semiconductor devices having exposed conductors at the top and under surfaces of an encapsulation resin section. This brings about the effect that the film thickness of bonding material (equivalent to the above-mentioned bonding materials 7f, 7g) for joining the stacked semiconductor devices together can be made even.

However, it is more desirable to take the following measure when multiple semiconductor devices are stacked as in this embodiment or the fifth embodiment: the film thickness of the bonding material (equivalent to the bonding materials 7f, 7g) between the stacked semiconductor devices is made even; and in addition, variation in the height of individual semiconductor devices before stacking is reduced as much as possible. This is because variation in the height of the individual semiconductor devices is accumulated.

For this reason, it is more desirable to take the measure described in relation to this embodiment and the fifth embodiment. That is, it is more desirable to stack semiconductor devices to which the first embodiment or the second embodiment is applied. (Such semiconductor devices are the first semiconductor devices 1f, 1j and the second semiconductor devices 1g, 1k in this case.) As a result, it is possible not only to make even the film thickness of the bonding material (equivalent to the bonding materials 7f, 7g) for joining the stacked semiconductor devices together. It is possible also to suppress variation in the height of the individual semiconductor devices themselves before they are stacked. Therefore, it is possible to more appropriately equalize the overall height of the semiconductor device formed by stacking multiple semiconductor devices.

In this embodiment and the fifth embodiment, multiple semiconductor devices are stacked as mentioned above. For the uppermost semiconductor device (the second semiconductor devices 1g, 1k in these cases), such a semiconductor device (semiconductor device 1d) using the heat conduction sheet 71 as in the third embodiment may be used.

Seventh Embodiment

In the fifth and sixth embodiments, sealed bodies are stacked after the semiconductor chips 2 are sealed with the encapsulation resin section 6. (The sealed bodies correspond to the first semiconductor device 1f, second semiconductor device 1g, first semiconductor device 1j, and second semiconductor device 1k.) In the seventh embodiment, semiconductor chips 2 are stacked before they are sealed with an encapsulation resin section.

Figure 79:
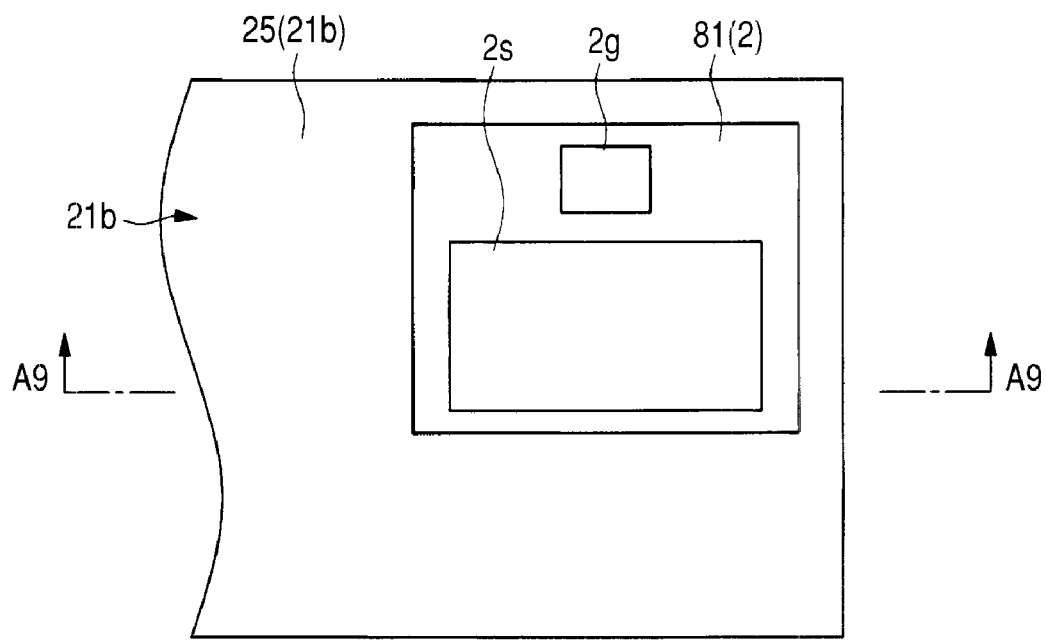
FIG. 79 is a plan view of a semiconductor device in a seventh embodiment of the invention in a manufacturing process.
Figure 80:
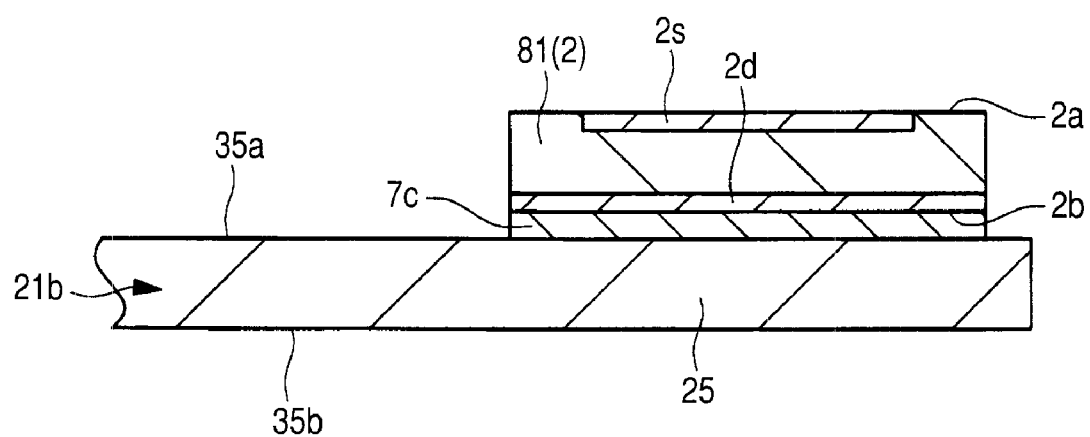
FIG. 80 is a sectional view of the same semiconductor device as in FIG. 79 in the manufacturing process.
Figure 81:
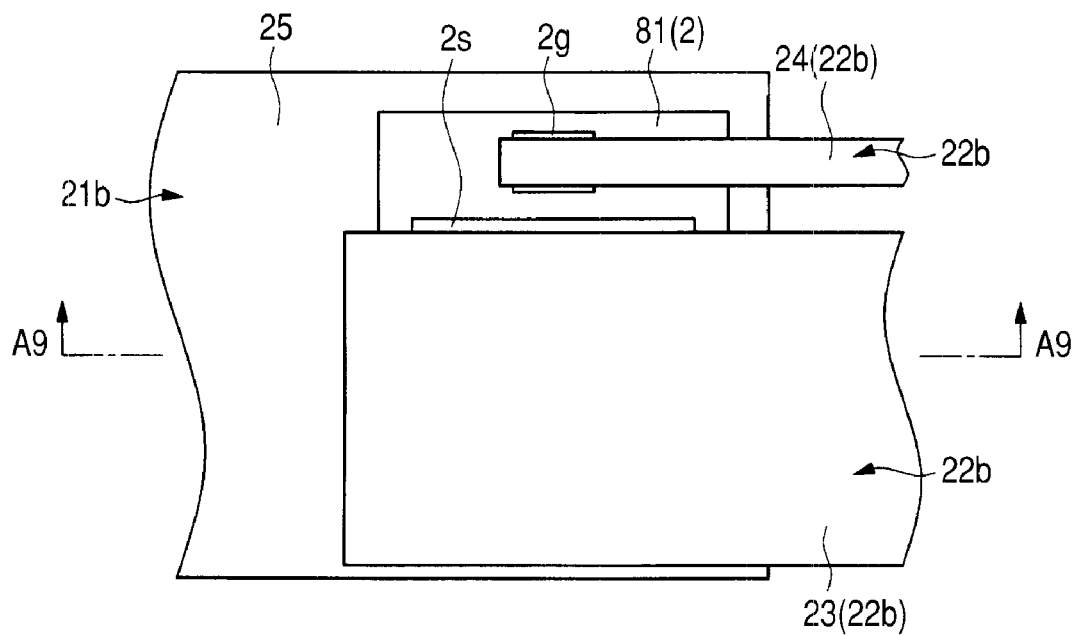
FIG. 81 is a plan view of the semiconductor device in the manufacturing process, following FIG. 79.
Figure 82:
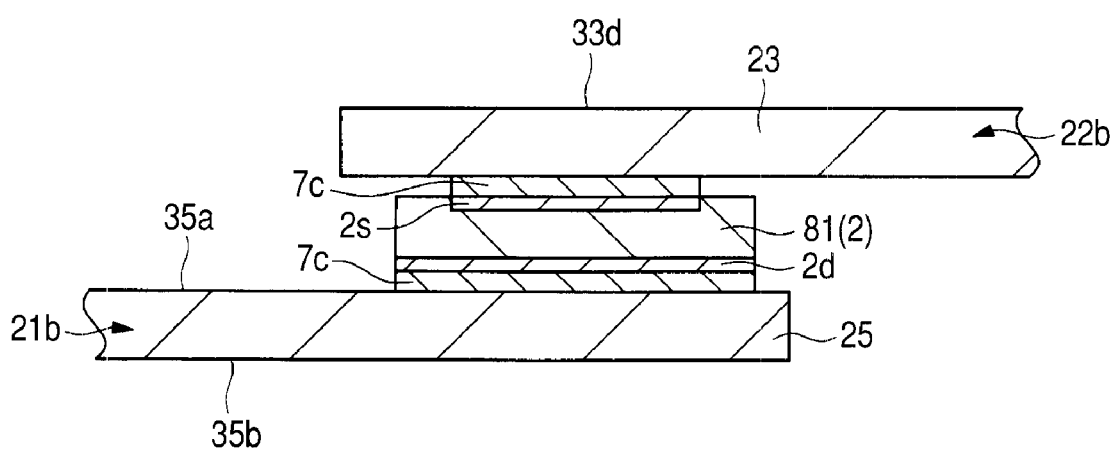
FIG. 82 is a sectional view of the same semiconductor device as in FIG. 81 in the manufacturing process.
Figure 83:
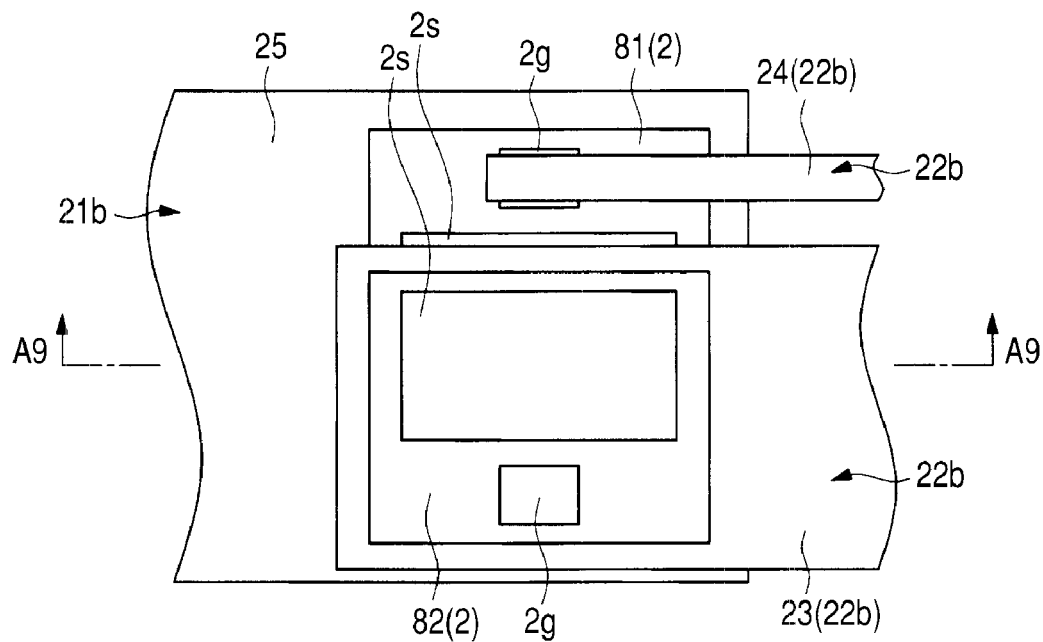
FIG. 83 is a plan view of the semiconductor device in the manufacturing process, following FIG. 81.
Figure 84:
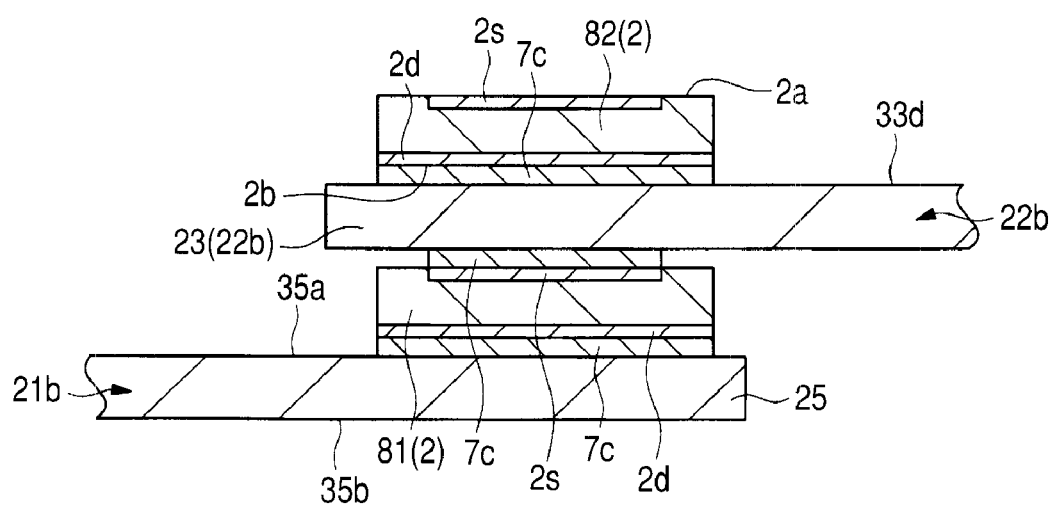
FIG. 84 is a sectional view of the same semiconductor device as in FIG. 83 in the manufacturing process.
Figure 87:
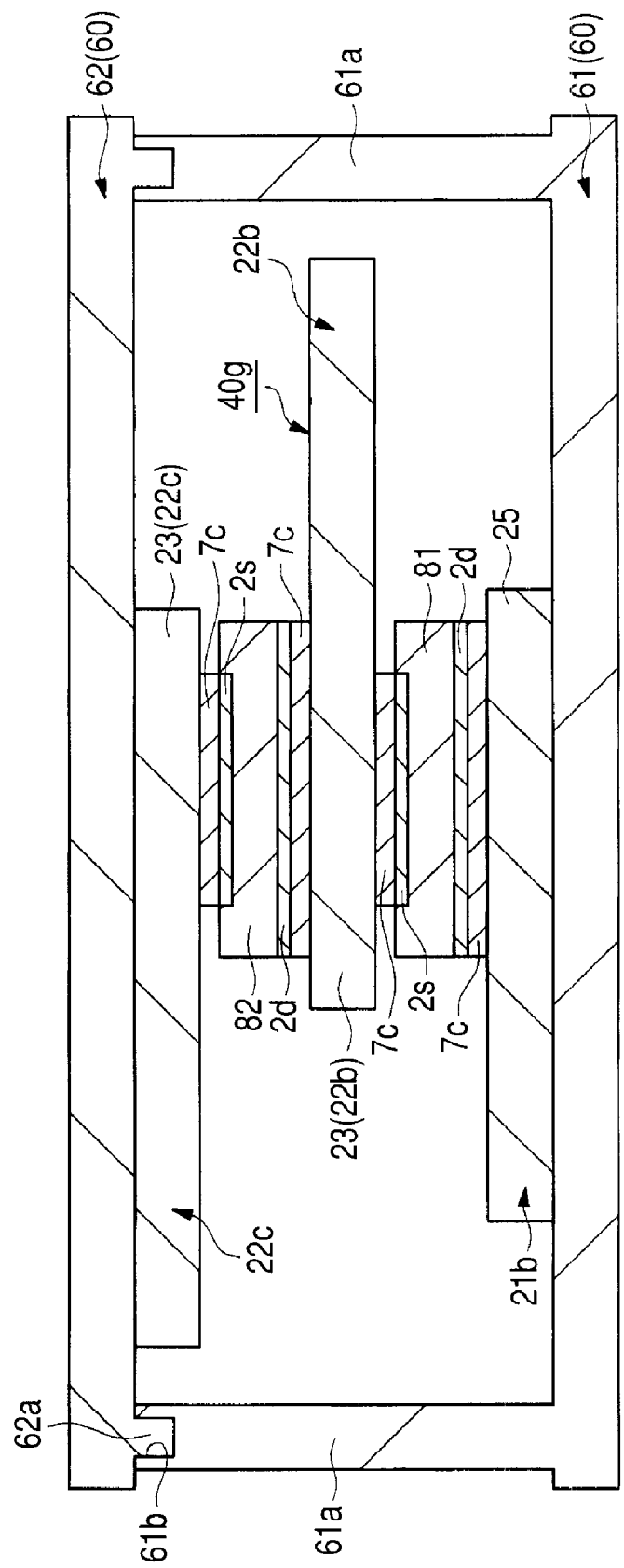
FIG. 87 is an explanatory drawing of a curing step for silver paste.
Figure 88:
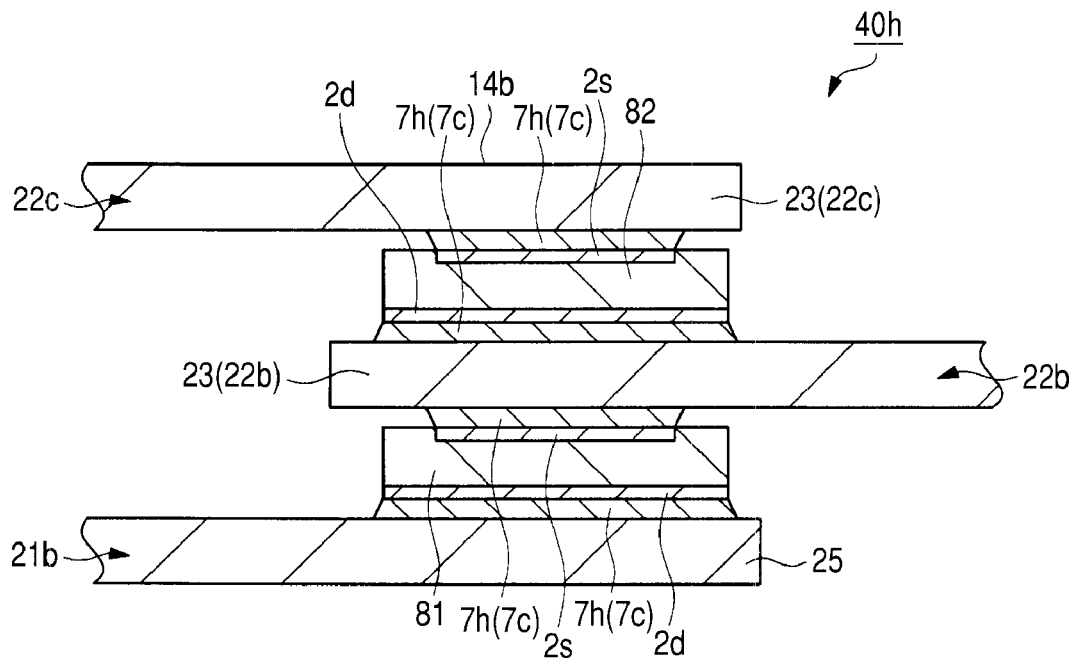
FIG. 88 is a sectional view of the semiconductor device in the manufacturing process, following FIG. 85.
Figure 89:
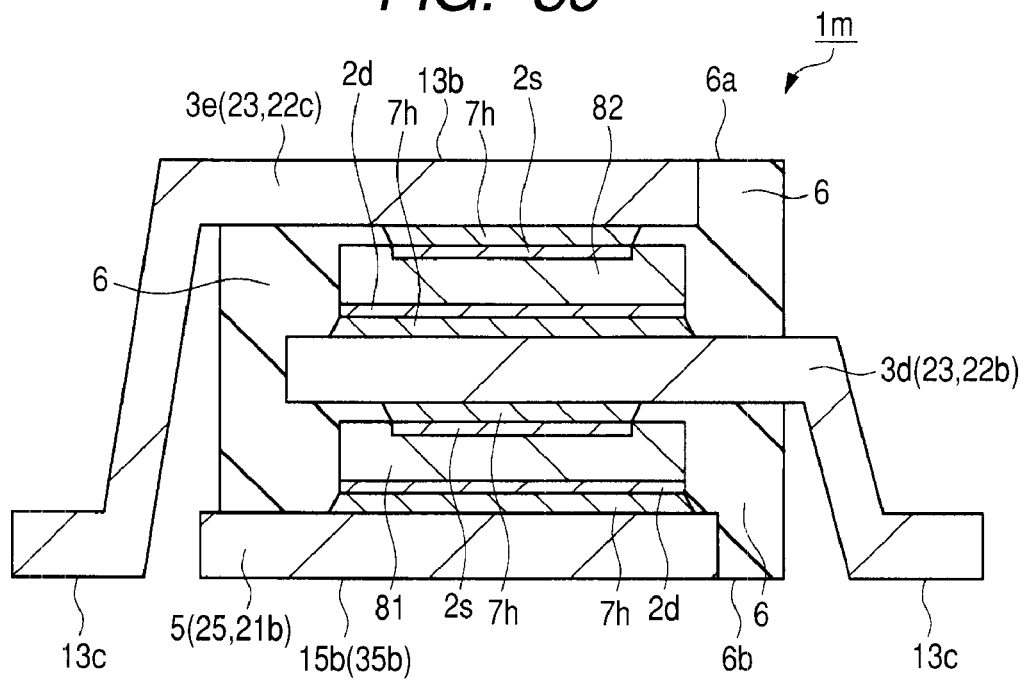
FIG. 89 is a sectional view of a semiconductor device in the seventh embodiment of the invention.
Figure 90:
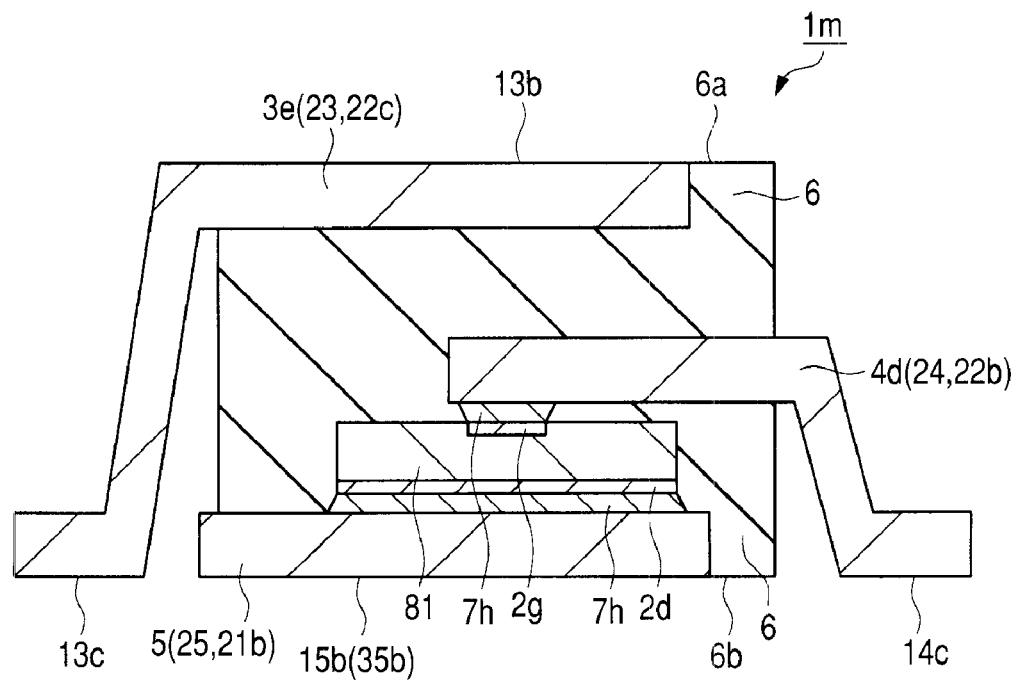
FIG. 90 is another sectional view of a semiconductor device in the seventh embodiment of the invention.
Figure 91:
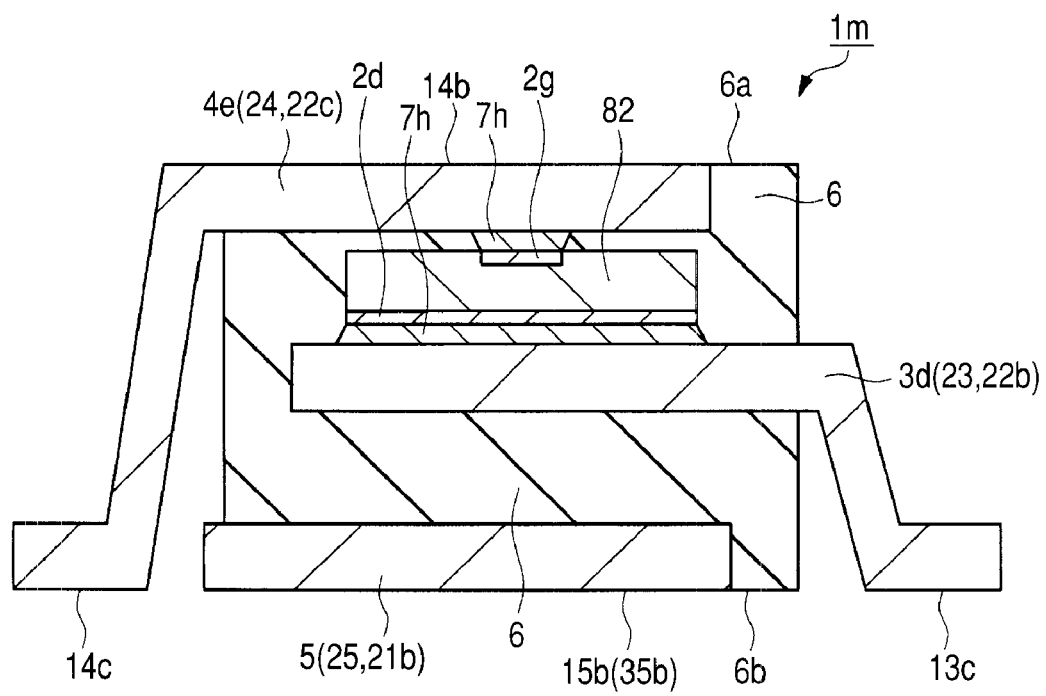
FIG. 91 is another sectional view of a semiconductor device in the seventh embodiment of the invention.

The drawings from FIG. 79 to FIG. 88 are substantial part plan views or substantial part sectional views of a semiconductor device 1m in this embodiment in the manufacturing process. Of the drawing from FIG. 79 to FIG. 88, FIG. 79, FIG. 81, FIG. 83 and FIG. 85 are plan views (substantial part plan views) and FIG. 80, FIG. 82, FIG. 84, FIG. 86 to FIG. 88 are sectional views (substantial part sectional views). FIG. 79 and FIG. 80 correspond to an identical process step; FIG. 81 and FIG. 82 correspond to an identical process step; FIG. 83 and FIG. 84 correspond to an identical process step; and FIG. 85 and FIG. 86 correspond to an identical process step. The sectional views in FIG. 80, FIG. 82, FIG. 84, and FIG. 86 to FIG. 88 substantially correspond to the sections taken along line A9-A9 of FIG. 79, FIG. 81, FIG. 83, and FIG. 85. The drawings from FIG. 89 to FIG. 91 are sectional views (side surface sectional views) of the manufactured semiconductor device 1m in this embodiment.

First, semiconductor chips 81, 82 and lead frames 21b, 22b, 22c are prepared. In this embodiment, multiple semiconductor chips 2, the semiconductor chips 81, 82 in this case, are used to manufacture one semiconductor device 1m. The semiconductor chips 81, 82 have the same configuration as the above-mentioned semiconductor chip 2. The semiconductor chips 81, 82 have a source pad electrode 2s and a gate pad electrode 2g at the front surface 2a thereof and a back surface drain electrode in the entire back surface 2b thereof. The lead frame 21b corresponds to the lead frame 21 in the second embodiment and includes drain terminal portions 25. The lead frames 22b, 22c each correspond to the lead frame 22 in the second embodiment and have source terminal portions 23 and gate terminal portions 24.

As illustrated in FIG. 79 and FIG. 80, silver (Ag) paste 7c is placed (applied to) over the first principal surface 35a of each drain terminal portion 25 of the lead frame 21b as at Step S3a in the second embodiment. The silver paste 7c is the same as that in the second embodiment. The silver paste 7c is placed or applied in an area in the first principal surface 35a of each drain terminal portion 25 of the lead frame 21b where the semiconductor chip 81 is to be mounted.

The semiconductor chip 81 (semiconductor chip 2) is placed (mounted) over each drain terminal portion 25 of the lead frame 21b as at Step S4 in the second embodiment. As a result, the semiconductor chip 81 is placed (mounted) over the first principal surface 35a of a drain terminal portion 25 of the lead frame 21b with the silver paste 7c in-between. Then it is temporarily fixed by the adhesion (adherence) of the silver paste 7c. Thus the structure in FIG. 79 and FIG. 80 is obtained. Only the silver paste 7c exists between the back surface 2b (back surface drain electrode 2d) of the semiconductor chip 81 and the first principal surface (top surface) 35a of the drain terminal portion 25 of the lead frame 21b.

As illustrated in FIG. 81 and FIG. 82, the silver paste 7c is placed (applied to) over the gate pad electrode 2g and source pad electrode 2s in the front surface 2a of the semiconductor chip 81 as at Step S6a in the second embodiment.

The lead frame 22b is placed over the front surface 2a of each semiconductor chip 81 as at Step S7 in the second embodiment. At the time, the lead frame 22b is placed over the lead frame 21b and semiconductor chips 81 so that the following is implemented: each source terminal portion 23 of the lead frame 22b is placed over the source pad electrode 2s of a semiconductor chip 81; and at the same time, each gate terminal portion 24 of the lead frame 22b is placed over the gate pad electrode 2g of a semiconductor chip 81. As a result, the following is implemented: each source terminal portion 23 of the lead frame 22b is placed over the source pad electrode 2s of a semiconductor chip 81 with the silver paste 7c in-between; each gate terminal portion 24 of the lead frame 22b is placed over the gate pad electrode 2g of a semiconductor chip 81 with the silver paste 7c in-between; and they are temporality fixed by the adhesion (adherence) of the silver paste 7c. Thus the structure in FIG. 81 and FIG. 82 is obtained.

As illustrated in FIG. 83 and FIG. 84, the silver paste 7c is placed (applied to) over the first principal surface (top surface) 33d of each source terminal portion 23 of the lead frame 22b. At this time, the silver paste 7c is placed or applied in an area in the first principal surface 33d of each source terminal portion 23 of the lead frame 22b where the semiconductor chip 82 is to be mounted. The first principal surface 33d of each source terminal portion 23 of the lead frame 22b is the principal surface on the opposite side to the side where it is opposed to the semiconductor chip 81.

The semiconductor chip 82 (semiconductor chip 2) is placed (mounted) over each source terminal portion 23 of the lead frame 22b. As a result, the semiconductor chip 82 is placed (mounted) over the first principal surface 33d of the source terminal portion 23 of the lead frame 22b with the silver paste 7c in-between. Then it is temporarily fixed by the adhesion (adherence) of the silver paste 7c. Thus the structure in FIG. 83 and FIG. 84 is obtained. Only the silver paste 7c exists between the back surface 2b (back surface drain electrode 2d) of the semiconductor chip 82 and the first principal surface (top surface) 33d of the source terminal portion 23 of the lead frame 22b.

As seen from FIG. 79, FIG. 81, and FIG. 83, each source terminal portion 23 of the lead frame 22b is so disposed that it does not overlap the gate pad electrode 2g of a semiconductor chip 81 on a plane. Each semiconductor chip 82 is placed over each the source terminal portion 23 of the lead frame 22b. For this reason, the semiconductor chip 82 is disposed in a position shifted from the semiconductor chip 81 as viewed on a plane. Therefore, the back surface drain electrode 2d of the semiconductor chip 81 is not in contact with a gate terminal portion 24 of the lead frame 22b.

Figure 85:
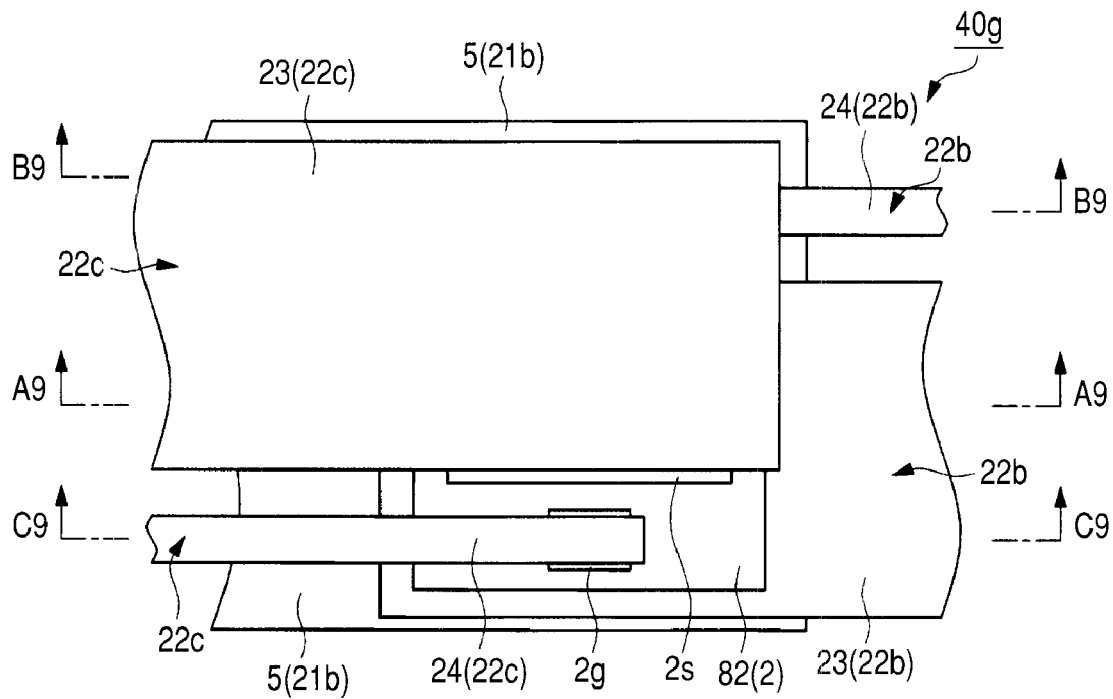
FIG. 85 is a plan view of the semiconductor device in the manufacturing process, following FIG. 83.
Figure 86:
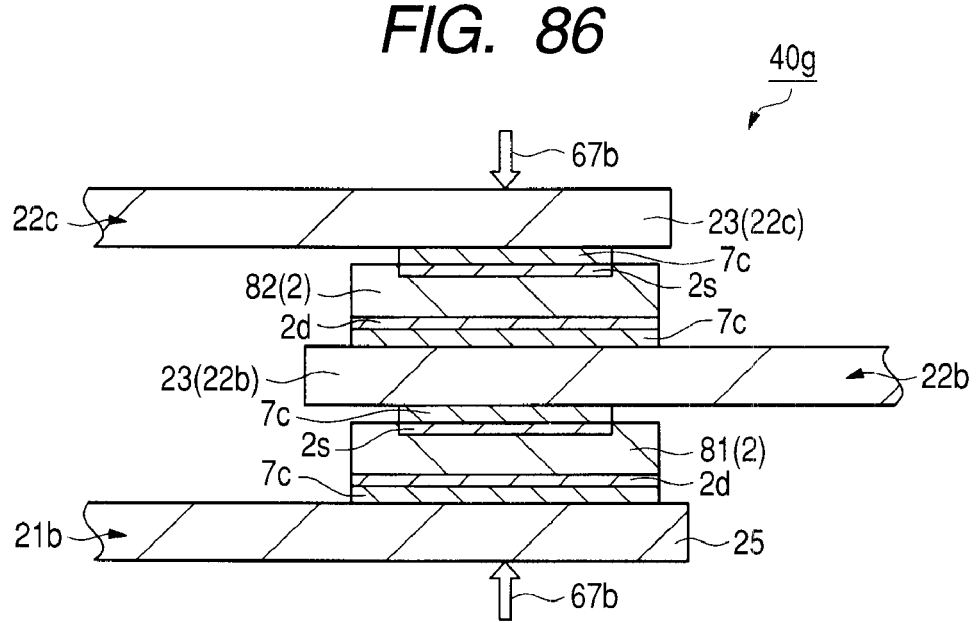
FIG. 86 is a sectional view of the same semiconductor device as in FIG. 85 in the manufacturing process.

As illustrated in FIG. 85 and FIG. 86, the silver paste 7c is placed (applied to) over the gate pad electrode 2g and source pad electrode 2s in the front surface 2a of each semiconductor chip 82 as is done with the semiconductor chip 81.

The lead frame 22c is placed over the front surface 2a of each semiconductor chip 82. At this time, the lead frame 22c is so placed that the following is implemented: each source terminal portion 23 of the lead frame 22c is placed over the source pad electrode 2s of a semiconductor chip 82; and at the same time, each gate terminal portion 24 of the lead frame 22c is placed over the gate pad electrode 2g of a semiconductor chip 82. As a result, the following is implemented: each source terminal portion 23 of the lead frame 22c is placed over the source pad electrode 2s of a semiconductor chip 82 with the silver paste 7c in-between; each gate terminal portion 24 of the lead frame 22c is placed over the gate pad electrode 2g of a semiconductor chip 82 with the silver paste 7c in-between; and they are temporarily fixed by the adhesion (adherence) of the silver paste 7c.

Thus the structure (temporary assembly 40g) in FIG. 85 and FIG. 86 is obtained. The temporary assembly 40g is comprised of the lead frames 21b, 22b, 22c and the semiconductor chips 81, 82 sandwiched therebetween through the silver paste 7c; however, the silver paste 7c has not been cured yet.

The silver paste 7c is cured as at Step S8a in the second embodiment. That is, the silver paste 7c is cured by heat treatment (heating). Also in this embodiment, as in the second embodiment, the silver paste 7c is cured (subjected to heat treatment for curing) while pressure (load) is applied to the temporary assembly 40g at the curing step for the silver paste 7c. In FIG. 86, this pressure (load) is schematically indicated by an arrow 67b and the direction of the arrow 67b is equivalent to the direction of the application of pressure (load). That is, the silver paste 7c is cured (subjected to heat treatment for curing) while pressure (load) is applied to the following with the semiconductor chip 81, a source terminal portion 23 of the lead frame 22b, and the semiconductor chip 82 in-between: each drain terminal portion 25 of the lead frame 21b and each source terminal portion 23 and gate terminal portion 24 of the lead frame 22c.

FIG. 87 is an explanatory drawing (sectional view) illustrating an example of the curing step for the silver paste 7c in this embodiment and corresponds to FIG. 33 in relation to the second embodiment.

As illustrated in FIG. 87, the temporary assembly 40g can be held from above and below by the lid portion 62 and base portion 61 of the retaining jig 60 by following the following procedure: the temporary assembly 40g is set on the base portion 61 of the retaining jig 60 and then the lid portion 62 of the retaining jig 60 is attached to the base portion 61. Thus pressure (load) is applied to the area between each source terminal portion 23 of the lead frame 22c and each drain terminal portion 25 of the lead frame 21b (area where the semiconductor chips 81, 82 and the silver paste 7c are placed). The temporary assembly 40g set on the retaining jig 60 is heated (subjected to heat treatment) to cure the silver paste 7c in the temporary assembly 40g. That is, the silver paste 7c is cured while the following operation is performed: each drain terminal portion 25 of the lead frame 21b and each source terminal portion 23 and gate terminal portion 24 of the lead frame 22c are held by the retaining jig 60 (pressure is applied thereto) with the following sandwiched therebetween: the semiconductor chip, each source terminal portion 23 of the lead frame 22b, and the semiconductor chip 82. As a result, the silver paste 7c is turned into bonding material 7h comprised of the cured silver paste.

Thus the curing step for the silver paste 7c can be carried out. As a result, the following are joined and electrically coupled together with the bonding material 7h (cured silver paste 7c) in-between as illustrated in FIG. 88. The back surface drain electrode 2d of each semiconductor chip 81 and each drain terminal portion 25 of the lead frame 21b are joined and electrically coupled together with the bonding material 7h in-between. The source pad electrode 2s of each semiconductor chip 81 and each source terminal portion 23 of the lead frame 22b are joined and electrically coupled together with the bonding material 7h in-between. The gate pad electrode 2g of each semiconductor chip 81 and each gate terminal portion 24 of the lead frame 22b are joined and electrically coupled together with the bonding material 7h in-between. The back surface drain electrode 2d of each semiconductor chip 82 and each source terminal portion 23 of the lead frame 22b are joined and electrically coupled together through the bonding material 7h in-between. The source pad electrode 2s of each semiconductor chip 82 and each source terminal portion 23 of the lead frame 22c are joined and electrically coupled together with the bonding material 7h in-between. The gate pad electrode 2g of each semiconductor chip 82 and each gate terminal portion 24 of the lead frame 22c are joined and electrically coupled together with the bonding material 7h in-between. As a result, an assembly (work) 40h comprised of the lead frames 21b, 22b, 22c and the semiconductor chips 81, 82 joined therebetween through the bonding material 7h is obtained. The assembly 40h is obtained by curing the silver paste 7c in the temporary assembly 40g.

As in the second embodiment, thereafter, the encapsulation resin section 6 is formed at Step S9, plating is carried out at Step S10, and the lead frames 21b, 22b, 22c are cut at Step S11. This embodiment is different from the second embodiment in that: the drain terminal portions 25, gate terminal portions 24, and source terminal portions 23 of the lead frames 21b, 22b, 22c are formed flat; after the formation of the encapsulation resin section 6, the lead frames 21b, 22b, 22c are cut; and then each source terminal portion 23 and gate terminal portion 24 protruded from a side surface of the encapsulation resin section 6 are bent.

As another embodiment, the following procedure may be followed: each gate terminal portion 24 and source terminal portion 23 of the lead frames 22b, 22c are bent beforehand; and the encapsulation resin section 6 is so formed that the bent portions are sealed in the encapsulation resin section 6. (The second embodiment and the like correspond to this case.) In the first to fourth embodiments, the following procedure may be followed: the terminal portions of the lead frames are formed flat and, after the formation of the encapsulation resin section 6, the terminals are bent.

Thus the semiconductor device 1m in this embodiment is manufactured as illustrated in FIG. 89 to FIG. 91. FIG. 89 illustrates a section taken in the same position as in FIG. 86 and FIG. 88 (that is, a section taken in the position corresponding to line A9-A9 of FIG. 85); FIG. 90 illustrates a section taken in the position corresponding to line B9-B9 of FIG. 85; and FIG. 91 illustrates a section taken in the position corresponding to line C9-C9 of FIG. 85.

A drain terminal portion 25 of the lead frame 21b becomes the drain terminal 5 of the semiconductor device 1m. A source terminal portion 23 of the lead frame 22b becomes the first source terminal 3d of the semiconductor device 1m. A gate terminal portion 24 of the lead frame 22b becomes the first gate terminal 4d of the semiconductor device 1m. A source terminal portion 23 of the lead frame 22c becomes the second source terminal 3e of the semiconductor device 1m. A gate terminal portion 24 of the lead frame 22c becomes the second gate terminal 4e of the semiconductor device 1m.

At the back surface of the semiconductor device 1m, that is, the back surface 6b of the encapsulation resin section 6, the under surface 15b of the drain terminal 5 is exposed. The under surface 15b of the drain terminal 5 is the principal surface on the opposite side to the side where the semiconductor chip 81 is mounted. At the top surface of the semiconductor device 1m, that is, the top surface 6b of the encapsulation resin section 6, the top surface 13b of the second source terminal 3e and the top surface 14b of the second gate terminal 4e are exposed. The top surface 13e of the second source terminal 3e and the top surface 14e of the second gate terminal 4e are the following principal surfaces: the principal surfaces on the opposite side to the side where they are coupled to the source pad electrode 2s and the gate pad electrode 2g of the semiconductor chip 82.

As mentioned above, the semiconductor device 1m in this embodiment is a resin sealed semiconductor package (semiconductor device) having exposed conductors at the top and under surfaces. That is, the terminals are exposed both at the top surface of the semiconductor device 1 (the top surface 6a of the encapsulation resin section 6) and at the under surface of the semiconductor device 1 (the back surface 6b of the encapsulation resin section 6). For this reason, it is possible to enhance the heat radiation characteristic of the semiconductor device 1m and the performance of the semiconductor device 1m.

The first source terminal 3d, second source terminal 3e, first gate terminal 4d, and second gate terminal 4e are bent at portions protruded from the encapsulation resin section 6. The following surfaces formed as the result of this bending are formed substantially flush with the under surface 15b of the drain terminal 5 exposed at the back surface 6b of the encapsulation resin section 6: the under surface 13c of the first source terminal 3d, the under surface 13c of the second source terminal 3e, the under surface 14c of the first gate terminal 4d, and the under surface 14c of the second gate terminal 4e. These surfaces positioned flush with one another become the terminals for external coupling of the semiconductor device 1m: the under surface 13c of the first source terminal 3d, the under surface 14c of the first gate terminal 4d, the under surface 13c of the second source terminal 3e, the under surface 14c of the second gate terminal 4e, and the under surface 15b of the drain terminal 5. For this reason, the semiconductor device 1m is a surface mount semiconductor device (semiconductor package).

In the semiconductor device 1m, the first source terminal 3d (a source terminal portion 23 of the lead frame 22b) is joined and electrically coupled with both of the following through the bonding material 7h: the source pad electrode 2s of the semiconductor chip 81 positioned on the lower side and the back surface drain electrode 2d of the semiconductor chip 82 positioned on the upper side. For this reason, the source pad electrode 2s of the lower semiconductor chip 81 and the back surface drain electrode 2d of the upper semiconductor chip 82 are electrically coupled with each other. For this reason, the first source terminal 3 functions both as the source terminal of the lower semiconductor chip 81 and as the drain terminal of the upper semiconductor chip 82. Therefore, it is possible to couple the MISFET formed in the lower semiconductor chip 81 and the MISFET formed in the upper semiconductor chip 82 in series.

In this embodiment, the silver paste 7c blended with the spacer particles 66 is used to join each terminal and the electrodes of the semiconductor chips 81, 82. In addition, heat treatment is carried out while pressure (load) is applied to cure the silver paste 7c. For this reason, the film thickness of the bonding material 7h formed by curing the silver paste 7c becomes substantially equal to the particle size (diameter) of the spacer particles 66 in the silver paste 7c. The reason for this is the same as that described with respect to the bonding material 7d in relation to the second embodiment. For this reason, the film thickness of the bonding material 7h can be controlled to a predetermined value by matching the particle size of the spacer particles 66 blended in the silver paste 7c with a desired thickness of the bonding material 7h. Further, variation (fluctuation) in the film thickness of the bonding material 7h can be suppressed by taking the same measure. As a result, it is possible to suppress variation (fluctuation) in the height of the assembly 40h immediately before the molding step. Therefore, it is possible to prevent a crack or the like from being produced in the semiconductor chips 81, 82 at the molding step and enhance the fabrication yield of the semiconductor devices 1m. Further, the heights of the finished semiconductor devices 1m can be equalized. Since the heights of the finished semiconductor devices 1m can be equalized, the following can be implemented when a member for heat radiation (for example, the above-mentioned radiation fin 55) is mounted over multiple semiconductor devices 1m: the state of coupling between each semiconductor device 1m and the member for heat radiation becomes even and thus the state of heat radiation in each semiconductor device 1m can be made even. Therefore, it is possible to make the heat radiation characteristic of each semiconductor device uniform and enhance the performance thereof.

In the description of this embodiment, a case where two semiconductor chips 81, 82 are stacked has been taken as an example. However, the number of stacked semiconductor chips only has to be two or more (that is, a plural number).

In this embodiment, the technique in the second embodiment is applied and the lead frame 21b, semiconductor chips 81, lead frame 22b, semiconductor chips 82, and lead frame 22c are stacked with the silver paste 7c in-between. As another embodiment, the technique in the first embodiment may be applied in place of the technique in the second embodiment to implement the following: the lead frame 21b, semiconductor chips 81, lead frame 22b, semiconductor chips 82, and lead frame 22c are stacked through bonding material (equivalent to the bonding materials 7a, 7b) and a film member (equivalent to the film members 8a, 8b). Also in this case, as in the first embodiment, the film thickness of the cured bonding material 7 can be controlled by a film member and substantially the same effect can be obtained.

In the semiconductor device 1m in this embodiment, multiple semiconductor chips are encapsulated and the electrodes of the semiconductor chips are coupled together in the encapsulation resin section 6. For this reason, the thermal resistance and the inductance can be reduced as compared with cases where multiple resin sealed semiconductor devices with one semiconductor chip encapsulated are individually used. Further, the mounting area (the area of a mounting board) can be reduced as compared with cases where multiple resin sealed semiconductor devices with one semiconductor chip encapsulated are individually mounted over a mounting board or the like.

This embodiment may be combined with the third embodiment. In this case, the following procedure can be followed after the above assembly 40h is obtained as in this embodiment: the heat conduction sheet 71 is stuck to over each source terminal portion 23 and gate terminal portion 24 of the lead frame 22c in the assembly 40h as in the third embodiment; and then the molding (encapsulation resin section 6 formation) step, the plating step, the lead frame 21b, 22b, 22c cutting step, and a step for bending terminals (the terminals protruded from a side surface of the encapsulation resin section 6) are carried out. Thus in addition to the effect obtained in this embodiment, the effect of the third embodiment can also be obtained.

Up to this point, concrete description has been given to the invention made by the present inventors based on embodiments thereof. However, the invention is not limited to these embodiments and can be variously modified without departing from the subject matter thereof, needless to add.

The invention is favorably applicable to techniques for manufacturing semiconductor devices of a resin sealed semiconductor package type.

What is claimed is:

1. A manufacturing method of a semiconductor device, in which the semiconductor device includes: a semiconductor chip; a first conductor section joined to a first principal surface of the semiconductor chip; a second conductor section joined to a second principal surface of the semiconductor chip on the opposite side to the first principal surface; and an encapsulation resin section sealing the semiconductor chip and part of the first and second conductor sections, and in the semiconductor device, a front surface of the first conductor section is exposed from a first surface of the encapsulation resin section and a front surface of the second conductor section is exposed from a second surface of the encapsulation resin section on the opposite side to the first surface, the manufacturing method comprising the steps of:
(a) mounting the semiconductor chip over the first conductor section with a first film member and a first bonding material in-between so that the first principal surface of the semiconductor chip is opposed to the first conductor section;
(b) mounting the second conductor section over the second principal surface of the semiconductor chip with a second film member and a second bonding material in-between;
(c) curing the first bonding material and the second bonding material to join the first conductor section to the first principal surface of the semiconductor chip and to join the second conductor section to the second principal surface of the semiconductor chip; and
(d) after step (c), forming the encapsulation resin section sealing the semiconductor chip, the first conductor section, and the second conductor section,
wherein the first and second bonding materials in steps (a) and (b) are paste-like bonding materials of solder paste or silver paste,
wherein step (a) includes:
(a1) placing the first film member over the first conductor section;
(a2) placing the first bonding material in a position over the first conductor section where the first bonding material does not overlap the first film member; and
(a3) mounting the semiconductor chip over the first conductor section with the first film member and the first bonding material in-between, and
wherein the first and second film members are less prone to deformation under load than the first and second bonding materials.

2. The manufacturing method of the semiconductor device according to claim 1,
wherein in step (c), the first conductor section is joined and electrically coupled to an electrode formed in the first principal surface of the semiconductor chip with the first bonding material in-between and the second conductor section is joined and electrically coupled to an electrode formed in the second principal surface of the semiconductor chip with the second bonding material in-between.

3. The manufacturing method of the semiconductor device according to claim 2,
wherein step (d) includes:
(d1) placing the first and second conductor sections and the semiconductor chip in a cavity formed by a first die and a second die; and
(d2) injecting material for forming the encapsulation resin section into the cavity with the front surface of the first conductor section in contact with the first die and the front surface of the second conductor section in contact with the second die and thereby forming the encapsulation resin section.

* * * * *